United States Patent
Saha

(10) Patent No.: US 12,457,795 B2
(45) Date of Patent: Oct. 28, 2025

(54) TRANSISTOR STRUCTURE WITH MULTIPLE HALO IMPLANTS HAVING EPITAXIAL LAYER, HIGH-K DIELECTRIC AND METAL GATE

(71) Applicant: Samar K. Saha, Milpitas, CA (US)

(72) Inventor: Samar K. Saha, Milpitas, CA (US)

(*) Notice: Subject to any disclaimer, the term of this patent is extended or adjusted under 35 U.S.C. 154(b) by 584 days.

(21) Appl. No.: 17/968,189

(22) Filed: Oct. 18, 2022

(65) Prior Publication Data

US 2023/0042167 A1    Feb. 9, 2023

Related U.S. Application Data

(60) Continuation-in-part of application No. 15/708,973, filed on Sep. 19, 2017, now Pat. No. 11,488,871, (Continued)

(51) Int. Cl.
*H10D 84/01* (2025.01)
*H01L 21/02* (2006.01)
(Continued)

(52) U.S. Cl.
CPC ..... *H10D 84/017* (2025.01); *H01L 21/02365* (2013.01); *H01L 21/0262* (2013.01); *H01L 21/2257* (2013.01); *H01L 21/26513* (2013.01); *H01L 21/266* (2013.01); *H01L 21/324* (2013.01); *H10D 62/314* (2025.01); (Continued)

(58) Field of Classification Search
CPC ........... H01L 21/02365; H01L 21/0262; H01L 21/2257; H01L 21/26513; H01L 21/266; H01L 21/28088; H01L 21/324; H10D 30/0227; H10D 30/0323; H10D 30/601; H10D 30/6734; H10D 30/6744; H10D 62/299; H10D 62/314; H10D 62/371; H10D 64/017; H10D 64/667; H10D 84/013; H10D 84/0135; H10D 84/0147; H10D 84/0151; H10D 84/0167; H10D 84/017;
(Continued)

(56) References Cited

U.S. PATENT DOCUMENTS

2006/0157796 A1* 7/2006 Kim ..................... H10D 84/038
257/369

OTHER PUBLICATIONS

Saha, Samar K., Effect of Statistical Dopant Fluctuations on Threshold Voltage of Emerging Devices, Journal of the Electron Devices Society, Oct. 18, 2021, pp. 985-994. vol. 9, 2021.

* cited by examiner

*Primary Examiner* — Britt D Hanley
*Assistant Examiner* — Kevin Quinto

(57) ABSTRACT

A method can include ion implanting with the gate mask to form first halo regions and ion implanting with the gate mask and first spacers as a mask to form second halo regions. The gate mask and first spacers can be removed, and an epitaxial layer formed. A dummy gate mask can be formed. Ion implanting with the dummy gate mask can from source-drain extensions. Second spacers can be formed on sides of the dummy gate mask. Ion implanting with the dummy gate mask and second spacers as a mask can form source and drain regions. A surface dielectric layer can be formed and planarized to expose a top of the dummy gate. The dummy gate can be removed to form gate openings between the second spacers. A hi-K dielectric layer and at least two gate metal layers within the gate opening. Related devices are also disclosed.

19 Claims, 36 Drawing Sheets

Related U.S. Application Data which is a continuation-in-part of application No. 15/083,172, filed on Mar. 28, 2016, now Pat. No. 9,768,074, which is a division of application No. 14/229,102, filed on Mar. 28, 2014, now Pat. No. 9,299,702.

(60) Provisional application No. 61/881,908, filed on Sep. 24, 2013.

(51) Int. Cl.
| | |
|---|---|
| *H01L 21/225* | (2006.01) |
| *H01L 21/265* | (2006.01) |
| *H01L 21/266* | (2006.01) |
| *H01L 21/324* | (2006.01) |
| *H10D 62/17* | (2025.01) |
| *H10D 84/03* | (2025.01) |
| *H10D 84/85* | (2025.01) |

(52) U.S. Cl.
CPC ......... *H10D 62/371* (2025.01); *H10D 84/013* (2025.01); *H10D 84/0135* (2025.01); *H10D 84/0147* (2025.01); *H10D 84/0151* (2025.01); *H10D 84/0167* (2025.01); *H10D 84/0188* (2025.01); *H10D 84/038* (2025.01); *H10D 84/85* (2025.01)

(58) Field of Classification Search
CPC ............ H10D 84/0188; H10D 84/019; H10D 84/038; H10D 84/85; H10D 86/01; H10D 86/201
See application file for complete search history.

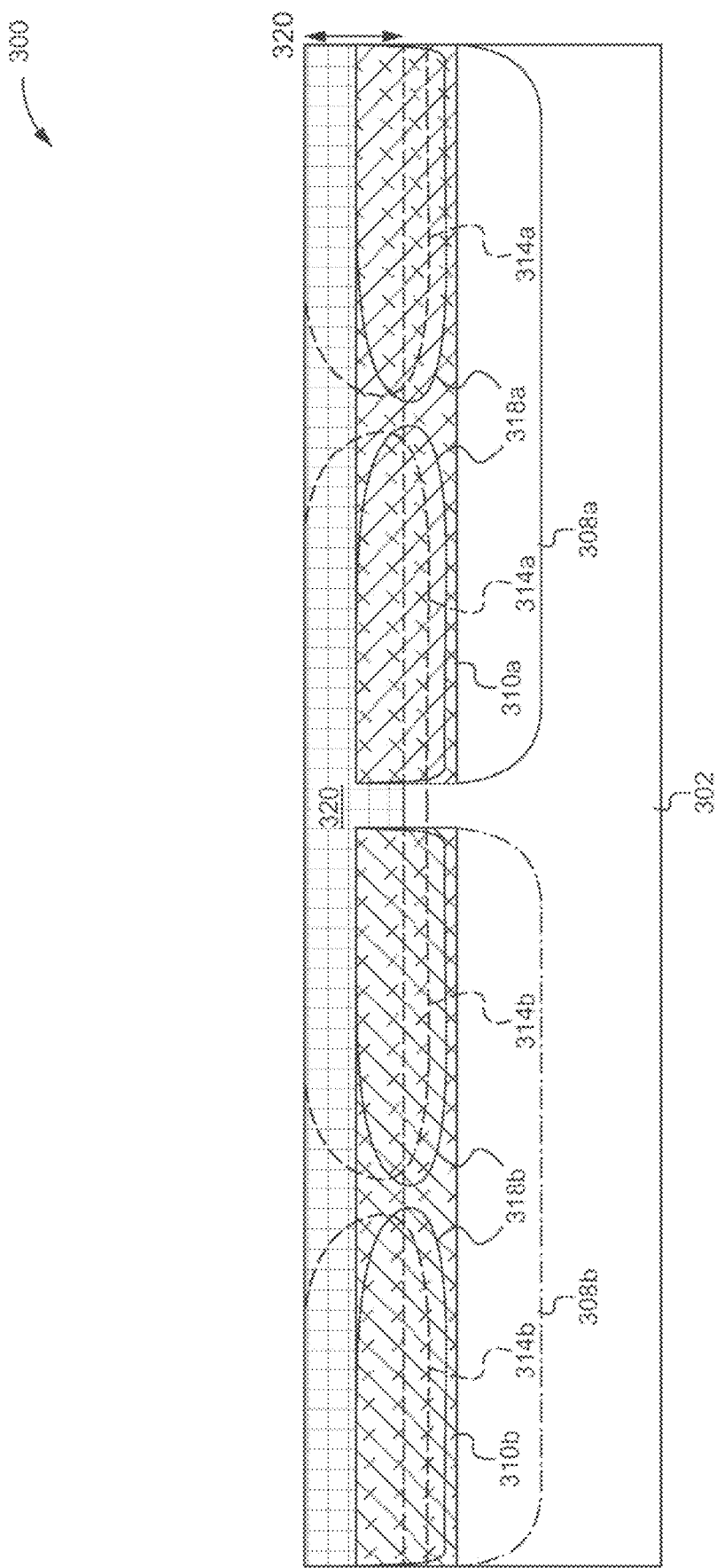

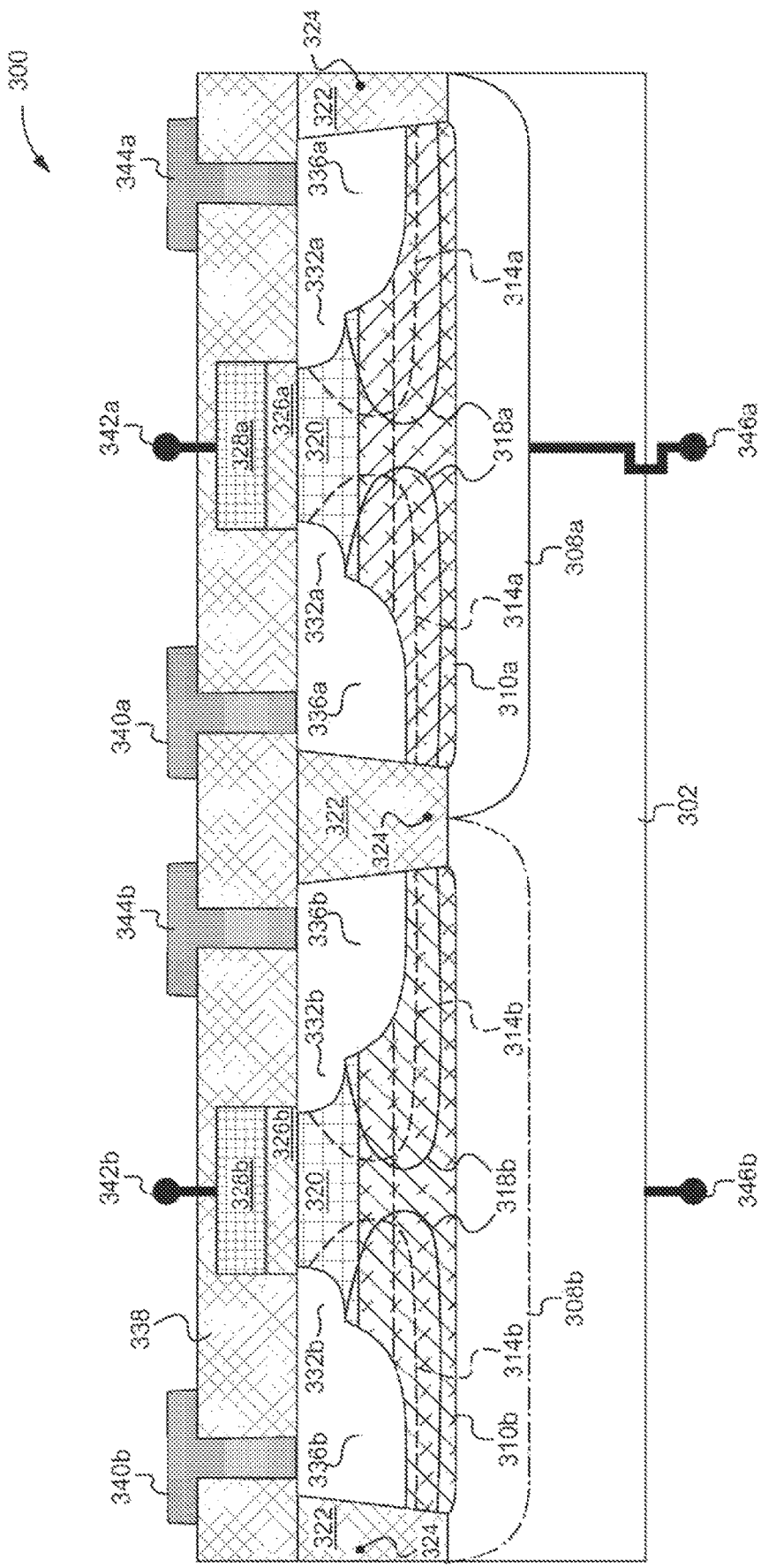

TRANSISTOR STRUCTURE WITH MULTIPLE HALO IMPLANTS HAVING EPITAXIAL LAYER, HIGH-K DIELECTRIC AND METAL GATE

RELATED APPLICATIONS

This application is a continuation-in-part of U.S. patent application Ser. No. 15/708,973, filed Sep. 19, 2017, which is a continuation-in-part of U.S. patent application Ser. No. 15/083,172, filed Mar. 28, 2016, and entitled, "Transistor Structure and Fabrication Methods with an Epitaxial Layer Over Multiple Halo Implants", issued as U.S. Pat. No. 9,768,084 on Sep. 19, 2017, which is a divisional of U.S. patent application Ser. No. 14/229,102, filed Mar. 28, 2014, and entitled, "Transistor Structure and Method with an Epitaxial Layer Over Multiple Halo Implants," issued as U.S. Pat. No. 9,299,702 on Mar. 29, 2016, which claims priority under 35 U.S.C. 119 (e) of U.S. Provisional Application Ser. No. 61/881,908, filed Sep. 24, 2013, and entitled "Transistor Structure and Method with Multiple Halo Implants and Epitaxial Layer." This application incorporates all of these patent applications in their entirety by reference.

FIELD OF THE INVENTION

The present invention is generally directed to the field of transistors in semiconductor substrates. More particularly, the present invention relates to transistors having an epitaxial layer above multiple halo implants.

BACKGROUND OF THE INVENTION

Today's semiconductor devices are continually being pushed to meet stricter demands in very large scale integrated (VLSI) circuits or integrated circuit (IC) chips. As these devices in VLSI circuits and systems or IC chips inundate the marketplace, consumers place higher demands on the devices. These demands include smaller, more compact devices with greater functionality. Semiconductor devices employ various circuitry in a chip to perform user specified functions. As is well known, the circuitry consists of various metallization lines, dielectric layers and other components interconnected throughout the entire chip. The metallization lines and other components are connected to transistors located at a lower level of the semiconductor device. The basic transistor has source and drain regions which are separated by a gate. By way of applying different voltages to the gate electrode, the transistor is either said to be ON or OFF.

Although there is a growing demand to scale transistor gate lengths to about 7 nm (i.e., 0.007 micron) and below for more demanding and compact digital circuit applications, such physical dimensions pose certain complexities. In particular, as transistors decrease in size the effects of process variability on the transistors continue to increase such that it is able to severely impact the functionality, yield and reliability of the transistors. For example, highly random effects that occur during processing of the transistors, such as random dopant fluctuations, oxide thickness variation and line-edge/width roughness, cause variability in the specific characteristics of each transistor. It is well known that variability increases with the decrease of transistor area. Thus, when the transistors are large, this variability only represents a small percentage of deviation in characteristics from transistor to transistor. However, as the transistors become smaller, that same level of variability becomes a larger and larger percentage of deviation to the point where the characteristics of one transistor can be substantially different than an identically designed second transistor. Thus, the process variability will only become a greater and greater concern as transistor dimensions are scaled down.

Another problem caused by the demand for smaller physical dimensions is the transistor off-state leakage current. Specifically, there is a need to cutoff leakage current of the order of zero in the off-state, and to produce low resistance or high device current in the on-state. However, for small gate length devices, even in the off-state, the space-charge region near the drain touches the source in a deeper place where the gate bias cannot control the potential, resulting in leakage current from the source to drain via the space-charge region. This is known as short-channel effect (SCE) which causes degradation in threshold voltage (Vth). As can be understood, for a transistor to work as a component of a digital circuit, the capability of switching OFF or the suppression of SCE is of high importance.

Yet another problem with the manufacturing of sub-22 nm transistors is the susceptibility to punch through. Punch through is generally understood to mean a case in which a dopant annealing process causes the source and drain depletion regions to come together. Since sub-22 nm transistors are pushing the limits on semiconductor manufacturing, transistor shorting or leakage due to punch through is a problem that needs to be addressed.

SUMMARY OF THE INVENTION

A transistor structure having an epitaxial layer deposited over the implanted substrate in order to reduce process variability. In particular, the epitaxial layer is able to be un-doped (or lightly doped via up-diffusion from the implanted substrate) and used to form the channel for the transistor structure. As a result, this use of un-doped epitaxial layer provides the benefit of reducing process variability (e.g. random dopant fluctuations) and thus the transistor performance variability despite the small physical size of the transistors. The substrate, can be a semiconductor-on-insulator substrate, such as silicon-on-insulator (SOI), having a buried insulator layer within the substrate. Above the buried insulator, there can be a well that extends to a first depth, a threshold voltage-adjust implant of the same polarity at a second depth shallower than the first depth, a shallow halo implant of the first polarity defined at a second depth shallower than the first depth and deeper than the second depth, and a deep halo implant of the same polarity as the substrate defined at a fourth depth deeper than the third depth. The shallow halo implant and the deep halo implant allow a peak concentration of substrate impurities at a level below the gate such that the resistance of the transistor is minimized along with the threshold voltage, threshold voltage fluctuations, short channel effects, and leakage current in the transistor. The transistor structure can be an n-channel metal oxide semiconductor (NMOS), p-channel metal oxide semiconductor (PMOS) or other types of transistor structures. In some embodiments, the structure is able to be characterized as a buried halo (BH) metal-oxide-semiconductor field effect transistor (BH-MOSFET).

In some embodiments, a buried insulator can be a relatively thin layer, and a body region formed below the buried insulator can be biased to operate the transistor in a double-gate mode. This can enable greater gate control, and improved on-off operation, as compared to conventional transistors of the same general channel size.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIG. 3J illustrates a process of forming an epitaxial layer on the substrate according to some embodiments.

FIGS. 3N and 3O illustrate a source drain extension (SDE) implant process according to some embodiments.

FIG. 3T illustrates the complimentary transistor structure after addition of one or more terminals according to some embodiments.

DETAILED DESCRIPTION OF THE EMBODIMENTS

Embodiments of the application are directed systems, devices and methods of making a transistor structure having an epitaxial layer on top of a doped substrate such that the epitaxial layer is able to be un-doped or lightly doped thereby reducing process variability (e.g. random dopant variability in the channel and/or other regions) in the transistor structure. In particular, the epitaxial layer enables the transistor structure to have optimized source-drain and/or channel regions to mitigate the risk of process variability in device and circuit performance despite shrinking transistor dimensions. The transistor structure is also able to comprise a plurality of halo regions, formed in a semiconductor-on-insulator substrate, at varying depths that enable a peak concentration of substrate impurities at a level below the gate such that the resistance of the transistor is minimized along with the threshold voltage, threshold voltage fluctuations, short channel effects, and leakage current in the transistor. The halo implants along with the Vth adjust implant/layer form a super-steep retrograde (SSR) channel doping profile with peak concentration below the surface of the channel region. A substrate region below the buried insulator of the semiconductor-on-insulator substrate can be biased to operate the transistor in a double gate mode, for greater gate control of the transistor.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention. Reference will now be made in detail to implementations of the transistor structure and method of making the transistor structure as illustrated in the accompanying drawings. The same reference indicators will be used throughout the drawings and the following detailed description to refer to the same or like parts. In the interest of clarity, not all of the routine features of the implementations described herein are shown and described. It will of course be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
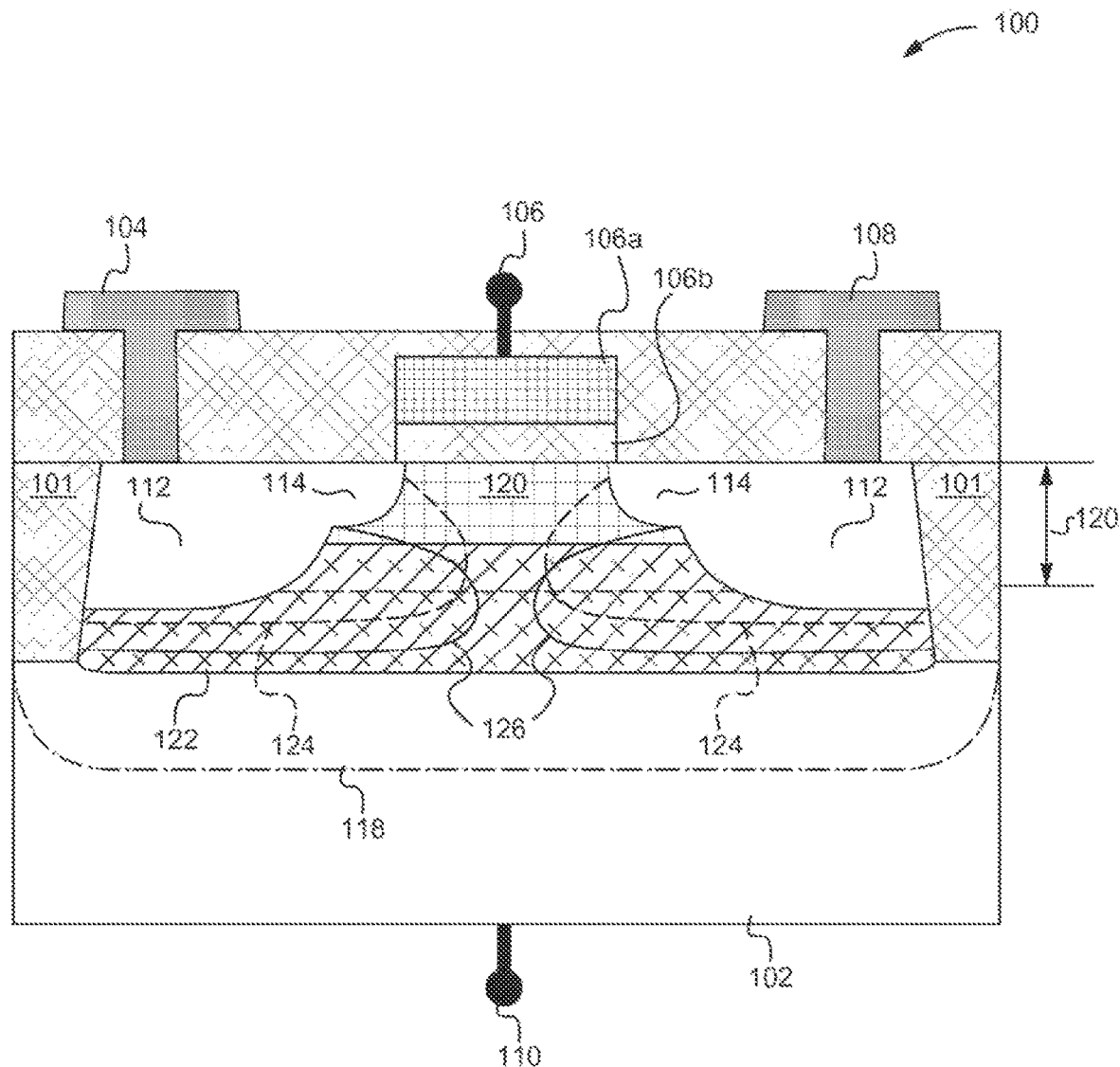
FIG. 1 illustrates a transistor having multiple halos according to some embodiments.

FIG. 1 illustrates a transistor 100 having multiple halos according to some embodiments. Although FIG. 1 shows an n-channel device, it is understood that the transistor 100 is able to be p-channel device comprising opposite polarity dopants such that the transistor 100 is able to be either an NMOS type transistor or a PMOS type transistor depending on the polarity of the substrate, the well region, the Vth adjust region, the halo regions and/or the source-drain diffusion regions to be formed. As shown in FIG. 1, the transistor 100 comprises isolation elements 101, a p-substrate 102, a source 104, a gate 106, a drain 108 and a body 110. The gate 106 is able to comprise a body 106a coupled to a gate insulator 106b. In some embodiments, the body 106a is polysilicon. Alternatively, the body 106a is able to comprise metal, polysilicon, a combination thereof or other types of gate materials well known in the art. In some embodiments, the gate body 106a has a thickness of between 500 Å and 3,000 Å Alternatively, the gate body 106a is able to have a thickness of 1,000 Å. The gate body 106a is able to have a length between 6 nm and 10,000 nm. Alternatively, the gate body 106a is able to have a length between 14 nm and 60 nm, for example, 22 nm. In some embodiments, the gate insulator 106b is a gate oxide. Alternatively, the gate insulator 106b is able to comprise other types of insulating materials or combinations thereof including oxides. In some embodiments, the gate insulator 106b has an effective thickness of between 10 Å and 100 Å. For example, the insulator 106b is able to have an effective thickness of 15 or 20 Å.

As shown in FIG. 1, the substrate 102 comprises one or more deep source-drain regions 112 (DSD), one or more shallow source-drain extensions 114 (SDE), a well 118, a Vth adjust layer 122, one or more shallow halo implants 124 and one or more deep halo implants 126 formed in the substrate 102. In particular, the DSDs 112 are able to be n+-type source-drain regions, the SDEs are able to be n+-type source-drain extensions, well 118 is able to be a p-type well, Vth adjust implant 122 is able to be a p-type layer, the shallow implants 124 are able to be p-type shallow halo implants 124 and the deep implants 126 are able to be p-type deep halo implants 126. Alternatively, the polarity of the above elements is able to be switched for a p-channel device as described above. The DSDs 112 are able to extend from the surface of the substrate 102 down to just above the deep halo implants 126. The impurities used to form the DSDs 112 are able to vary depending on whether the transistor 100 is to be an NMOS type transistor or a PMOS type transistor as is well known in the art. For an NMOS type transistor, the impurities that form the DSDs 112 are able to be Arsenic, Phosphorus or other types of impurities as are well known in the art. The concentration of the impurities that form the DSDs 112 for an NMOS type transistor is able to range from $1\times10^{20}$ atoms/cm$^3$ to $5\times10^{20}$ atoms/cm$^3$ (e.g. $3\times10^{20}$ atoms/cm$^3$). Alternatively, for a PMOS type transistor, the impurities that form the DSDs 112 are able to be Boron, Boron difluoride (BF$_2$) or other types of impurities well known in the art. The concentration of the impurities that form the DSDs 112 for a PMOS type transistor is able to range from $8\times10^{19}$ atoms/cm$^3$ to $2\times10^{20}$ atoms/cm$^3$ (e.g., $1\times10^{20}$ atoms/cm$^3$).

The SDEs 114 are able to be positioned such that at least a portion of the SDEs 114 is underneath the gate 106 using optional mini SDE offset spacers (not shown). Specifically, the SDEs 114 are able to be positioned within the substrate 102 immediately above the shallow halo implants 124 to further suppress short channel effects such as source/drain leakage currents. Like the DSDs 112, the impurities used to form the SDEs 114 are able to vary depending on whether the transistor 100 is to be an NMOS type transistor or a PMOS type transistor as is well known in the art. For an NMOS type transistor, the impurities that form the SDEs 114 are able to be Arsenic, Phosphorus or other types of impurities as are well known in the art. The concentration of the impurities that form the SDEs 114 for a NMOS type transistor is able to range from $1\times10^{20}$ atoms/cm$^3$ to $5\times10^{20}$ atoms/cm$^3$ (e.g. $3\times10^{20}$ atoms/cm$^3$).

Alternatively, for a PMOS type transistor, the impurities that form the SDEs 114 are able to be Boron, Boron difluoride or other types of impurities well known in the art. The concentration of the impurities that form the SDEs 114 for a PMOS type transistor is able to range from $8\times10^{19}$ atoms/cm$^3$ to $2\times10^{20}$ atoms/cm$^3$ (e.g., $1\times10^{20}$ atoms/cm$^3$). As a result, DSDs 112 and/or the SDEs 114 define the transistor 100 structure such that when gate 106 is turned ON with lower Vth due to supply gate bias in the range of about 1V, an inversion layer can be formed and current will flow from one DSD 112 and/or SDE 114 to another DSD 112 and/or SDE 114 with reduced resistance. Additionally, it is again noted that the polarity of the DSDs 112 and the SDEs 114 is opposite to the channel region. In particular, this is pointed out to contrast the polarity of the halo implants 124, 126 described below, which is the same as the channel region.

The shallow halo implants 124 are able to be positioned such that they at least partially extend below the SDEs 114, DSDs 112 and/or the gate 106. The deep halo implants 126 are able to be positioned such that they at least partially extend below the SDEs 114, DSDs 112 and/or the gate 106, as well as extending at least partially below the shallow halo implants 124. As a result, the shallow and/or deep halo implants 124, 126 are able to assist in suppressing the leakage currents that are a result of the short channel effect (SCE). In particular, the SCE can render a transistor non-functional if too much leakage current is present. The use and positioning of the shallow and/or deep halo implants 124, 126 within the transistor 100 at a depth that is apart from the surface of the substrate 102 avoids creating high level concentrations (of the same polarity as the channel region) just below the gate 106 in the substrate channel region, which leads to increased Vth and channel resistance.

The impurities used to form the shallow halo implants 124 are able to vary depending on whether the transistor 100 is to be an NMOS type transistor or a PMOS type transistor. Specifically, the shallow halo implants 124 comprise impurity types of the same polarity as the channel polarity. For example, for an NMOS type transistor, the halo implants 124 will be P-type impurities. In some embodiments, the impurities of the shallow halo implants 124 are able to have low diffusion coefficients such as indium, boron, phosphorus, arsenic, antimony or other types of impurities with low diffusion coefficients. Alternatively, other types of impurities having low or higher diffusion coefficients are able to be used. In some embodiments, the impurities are implanted within the substrate 102 at a peak concentration ranging preferably from $1\times10^{18}$ atoms/cm$^3$ to $1\times10^{19}$ atoms/cm$^3$ (e.g. $5\times10^{18}$ atoms/cm$^3$). However, it should be noted that the concentration of the impurities implanted are able to differ from the actual concentration of the impurities in the shallow halo implants 124 due to losses and the diffusion process as the impurities enter the substrate 102. As a result, the actual concentration is able to range from $1\times10^{18}$ atoms/cm$^3$ to $6\times10^{18}$ atoms/cm$^3$ (e.g. $3\times10^{18}$ atoms/cm$^3$).

The impurities used to form the deep halo implants 126 are also able to vary depending on whether the transistor 100 is to be an NMOS type transistor or a PMOS type transistor. In particular, similar to the shallow halo implants 124, the deep halo implants 126 comprise impurity types of the same polarity as the channel polarity. For example, for a PMOS type transistor, the deep halo implants 126 will be N-type impurities. In some embodiments, the impurities of the deep halo implants 126 are able to have low diffusion coefficients such as indium, boron, phosphorus, arsenic, antimony or other types of impurities with low diffusion coefficients. Alternatively, other types of impurities having low or higher diffusion coefficients are able to be used. In some embodiments, the concentration ranges of the impurities implanted to form the deep halo implants 126 are able to be slightly lower than those of the shallow halo implants 124. For example, the peak impurity concentration of the deep halo implants 126 is able to range between $1\times10^{18}$ atoms/cm$^3$ and $5\times10^{18}$ atoms/cm$^3$ (e.g., $2.5\times10^{18}$ atoms/cm$^3$). In particular, the peak concentration of deep halo implants 126 are positioned just below the DSD junctions described above. As a result, the deep halo implants 126 are able to further reduce the leakage from the deeper channel region where the gate bias cannot control the potential. Thus, shallow and deep halo implants 124, 126 are able to allow a peak concentration of substrate impurities at a level below the gate 106, such that the resistance of the transistor 100 is able to be minimized along with the threshold voltage, threshold voltage fluctuations, short channel effects, and leakage current in the transistor 100. Additionally, it is noted that shallow and/or deep halo implants 124, 126 are able to have a low concentration of impurities at the top and bottom of the implants 124, 126 and a peak concentration region in the middle of the implants 124, 126. In some embodiments, the substrate 102 is able to comprise a p-type Vth adjust layer 122 formed below the transistor 100 channel which is able to adjust the threshold voltage of the transistor 100.

The undoped epitaxial layer 120 (EPI) is able to be deposited on top of the substrate 102 in order to form the channel region. In particular, the epitaxial layer 120 is able to be deposited on top of the substrate 102 after the substrate 102 has been doped to form the wells 118, the Vth adjust layer 122 and the halos 124, 126. Accordingly, the wells 118, the Vth adjust layer 122, and the halos 124, 126 are buried under the epitaxial layer 120, which is then covered in the channel region by the gate 106 during implanting of the DSDs 112 and SDEs 114. As a result, the epitaxial layer 120 is able to remain un-doped or only lightly doped (due to up-diffusion of dopants from the halos and Vth adjust implant within the substrate 102) especially, below the gate 106 in the channel region. The epitaxial layer 120 thereby provides the benefit of reducing the process variability of the transistor 100 particularly in the channel region.

Figure 2:
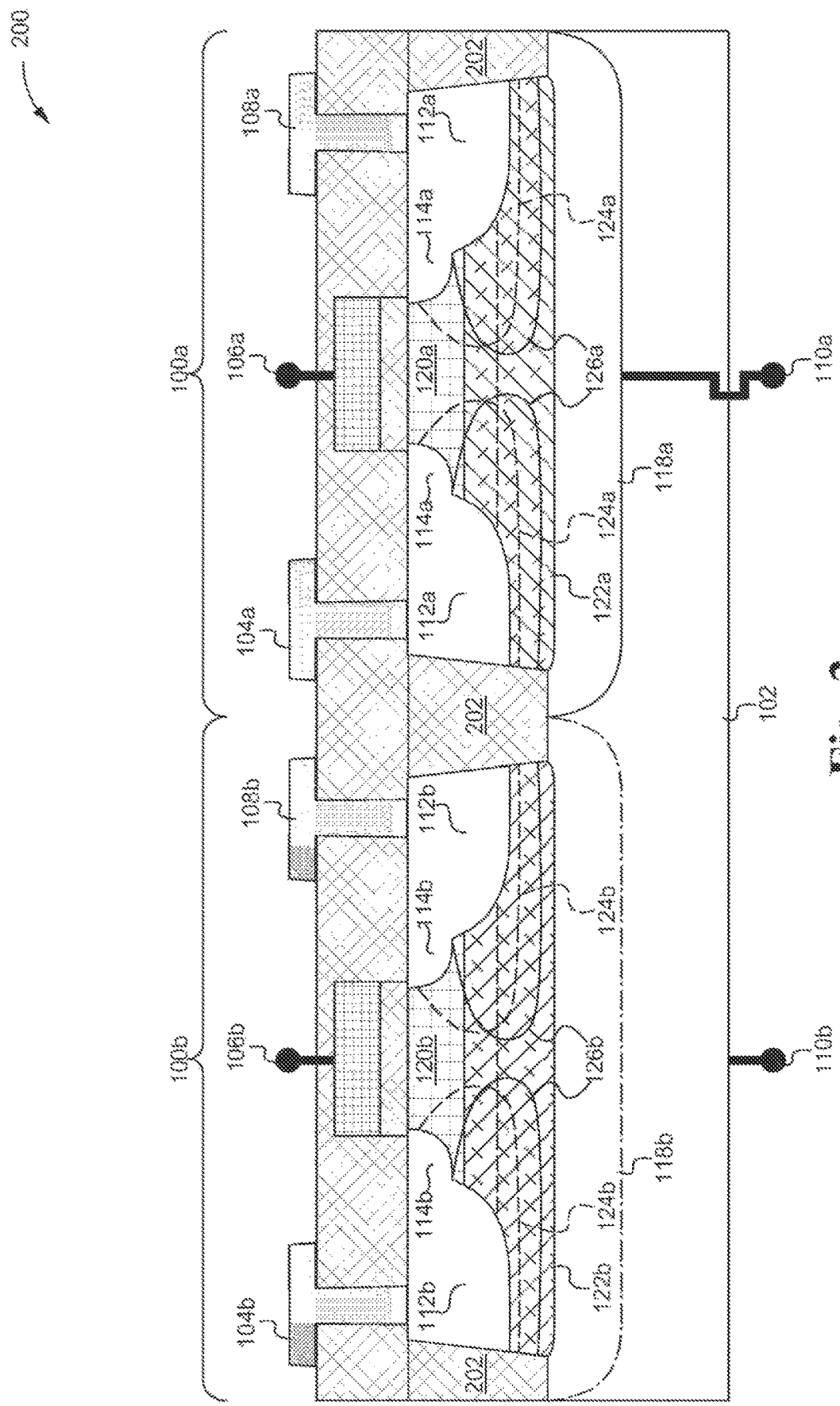
FIG. 2 illustrates a complimentary transistor structure with a plurality of transistors each having multiple halos according to some embodiments.

FIG. 2 illustrates a complimentary transistor structure 200 with a plurality of transistors 100a, 100b each having multiple halos according to some embodiments. Each transistor 100a, 100b of the transistor structure 200 of FIG. 2 is able to be substantially similar to the transistor 100 described in FIG. 1 except for the differences described herein. In particular as shown in FIG. 2, a plurality of transistors 100a, 100b are formed adjacent to each other on a single substrate 102 and separated by an isolation element 202. In some embodiments, the isolation element 202 is a shallow trench isolation (STI). Alternatively, the isolation element 202 is able to comprise other types of isolating structures. In some embodiments, the transistor 100b is an n-channel transistor (e.g. NMOS) and the transistor 100a is a p-channel transistor (e.g. PMOS). It is noted that the transistor 100a is substantially similar to the transistor 100b and the transistor 100 in FIG. 1 except with opposite polarity of components/doping in order to form a p-channel instead of an n-channel. Alternatively, the plurality of transistors are able to comprise any combination of n-channel and/or p-channel transistors on a single substrate.

As shown in FIG. 2, the substrate 102 is a p-type substrate. Alternatively, the substrate 102 is able to be an n-type substrate wherein the doping of the transistors 100a, 100b is adjusted accordingly as described above. As a result, n-channel transistors and/or one or more p-channel transistors formed in a p-type substrate. Alternatively, in some embodiments the structure 200 comprises one or more n-channel transistors and/or one or more p-channel transistors formed in a n-type substrate. In some embodiments, the structure 200 comprises one or more additional wells to form one or more twin or triple well structures within the substrate 102. For example, an n-channel transistor of the transistors 100 is able to be formed in a p-well that is itself formed in an n-well. Accordingly, the transistor structure 200 is able to form a complimentary transistor structure 200 such as a complementary-metal-oxide-semiconductor (CMOS). Alternatively, the structure 200 is able to comprise other transistor structures having any combination of any number of p-type and/or n-type transistors. Thus, it is understood that transistors 100a, 100b of the structure 200 are able to be used as complementary devices and/or as conventional transistors.

Figure 3A:
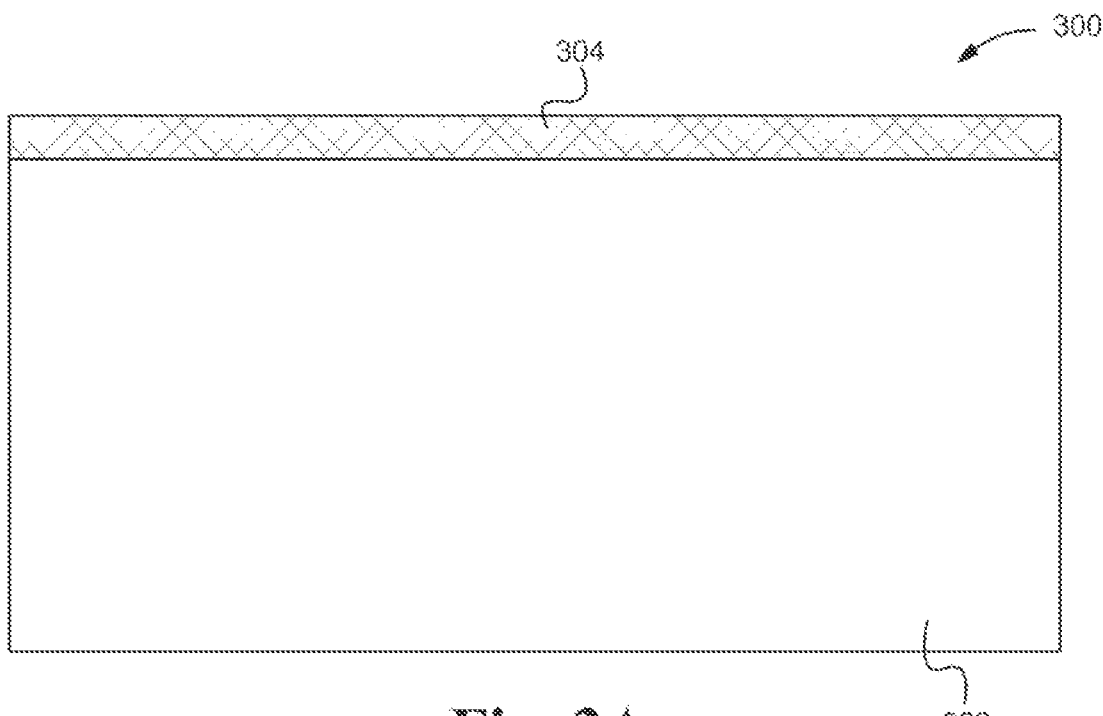
FIG. 3A illustrates an initial oxide grown on a substrate according to some embodiments.

FIGS. 3A-3T illustrate a cross-sectional view fabrication process 300 of forming a complimentary transistor structure 200 according to some embodiments. It is understood that although the process 300 described with reference to FIGS. 3A-3T relates to forming an n-channel transistor and a p-channel transistor on a p-type substrate 302, other combinations of transistors and substrate types are contemplated and are able to be formed by adjusting the polarities of components within the process. Additionally, as described herein the n-type dopants of a typical processing step of the structure 200 are processed before the p-type dopants as the n-type impurities generally exhibits less diffusivity. Alternatively, one or more of the p-type dopants of any processing step are able to be processed before one or more of the n-type dopants. As shown in FIG. 3A, initially an initial oxide film 304 is grown on a p-type substrate 302. In some embodiments, the substrate 302 is silicon having a doping concentration of $1 \times 10^{15}$ atoms/cm$^3$. A dopant range can be $5 \times 10^{14}$ to $5 \times 10^{16}$ atoms/cm$^3$. Alternatively, the substrate 302 is able to comprise other p or n-type substrates and/or other doping concentrations as are well known in the art. In some embodiments, the initial oxide film 304 has a thickness between 5-20 nm, for example 10 nm. Alternatively, other thicknesses/ranges of thicknesses are able to be used.

Figure 3B:
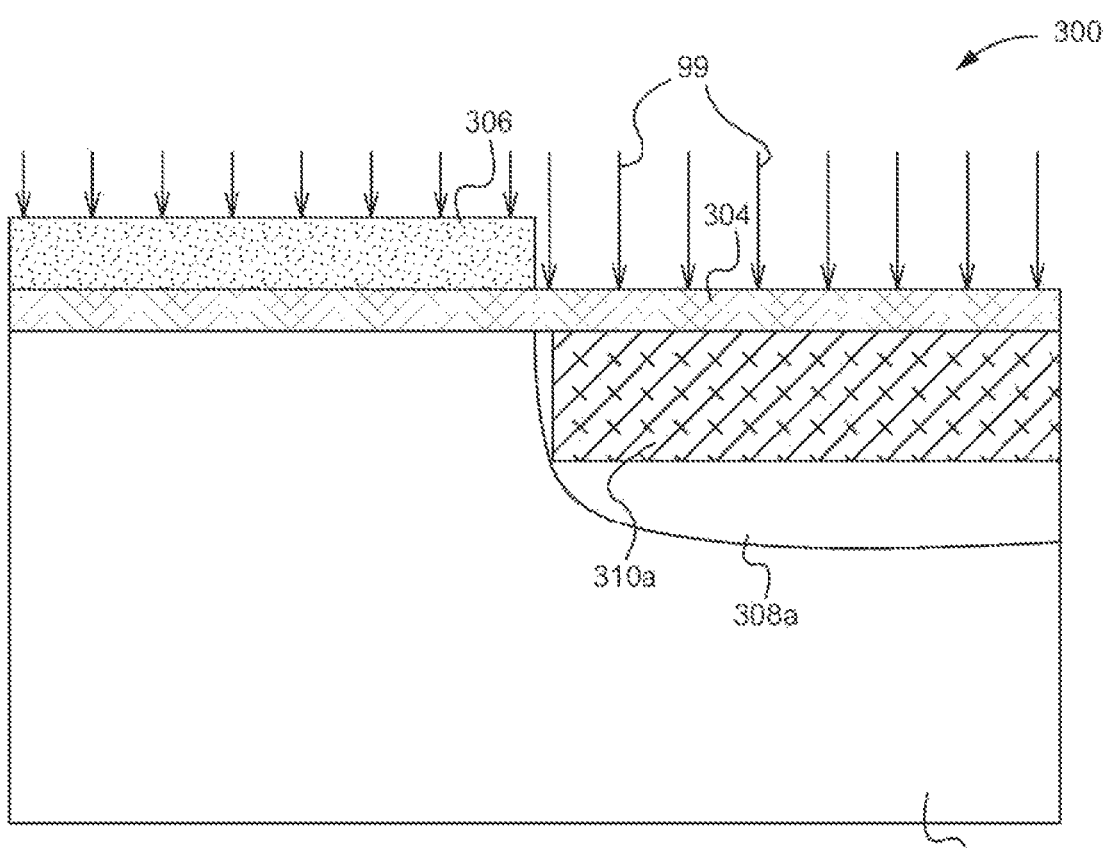
FIGS. 3B and 3C illustrate the well and threshold voltage adjust layer implant processes according to some embodiments.
Figure 3C:
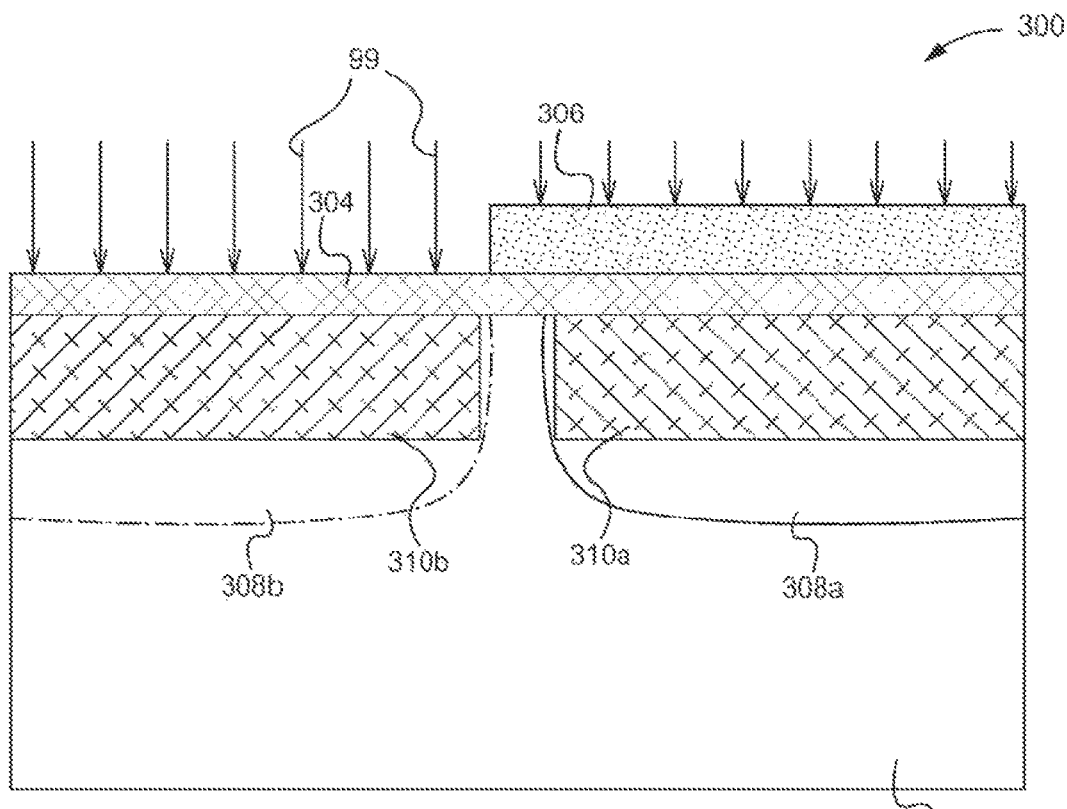

FIGS. 3B and 3C illustrate the well and threshold voltage adjust layer implant process according to some embodiments. As shown in FIG. 3B, photoresist 306 is deposited on the oxide 304 and an n-well mask is created using photolithography and etching away unwanted portions of the photoresist 306. In some embodiments, the photoresist 306 has a thickness in the range of 50-500 nm, 100 nm in some embodiments. Once the mask is in place, an n-well 308a is implanted followed by implanting an n-type dopant for a p-channel device Vth adjust layer 310a via an impurity implant operation 99.

The process can be repeated as shown in FIG. 3C (after removing the n-well mask) to form a P-well and Vt adjust layer. A p-mask 306 is created and a p-well 308b and p-type dopant implant for n-channel device Vth adjust layer 310b is implanted via the implant operation 99. Alternatively, the order is able to be reversed and FIG. 3C is performed before FIG. 3B.

In some embodiments, the n-well 308a and p-well 308b implants comprise implanting phosphorus (P) or Boron (B) into the substrate 302 forming peak implant concentration between $1 \times 10^{17}$ atoms/cm$^3$ and $1 \times 10^{19}$ atoms/cm$^3$, for example, $1 \times 10^{18}$ atoms/cm$^3$. In some embodiments, the energy used to implant the impurities into the substrate 302 for the n-well 308a and the p-well 308b is between 50 KeV (kiloelectron volts) and 500 KeV, for example, 100 KeV. In some embodiments, the n-type Vth adjust layer 310a implant process comprises implanting arsenic (As) or phosphorus into the substrate 302 forming peak implant concentration between $1 \times 10^{17}$ atoms/cm$^3$ and $1 \times 10^{18}$ atoms/cm$^3$, for example, $5 \times 10^{17}$ atoms/cm$^3$. In some embodiments, the energy used to implant the impurities into the substrate 302 for the n-type Vth adjust layer 310a is between 5 KeV and 20 KeV, for example, 10 KeV.

In some embodiments, the p-type Vth adjust layer 310b implant process comprises implanting boron or boron difluoride (BF$_2$) into the substrate 302 forming peak implant concentration between $1 \times 10^{17}$ atoms/cm$^3$ and $1 \times 10^{18}$ atoms/cm$^3$, for example, $5 \times 10^{17}$ atoms/cm$^3$. In some embodiments, the energy used to implant the impurities into the substrate 302 for the p-type threshold voltage adjust layer 310b is between 5 KeV and 20 KeV, for example, 10 KeV. Alternatively, other numbers of dopants, peak implant concentrations, implant energies and/or types of dopants are able to be used as described above. In particular, it is understood that the concentration and/or strength of the threshold adjust layer implant is able to be varied based on a desired threshold voltage.

Figure 3D:
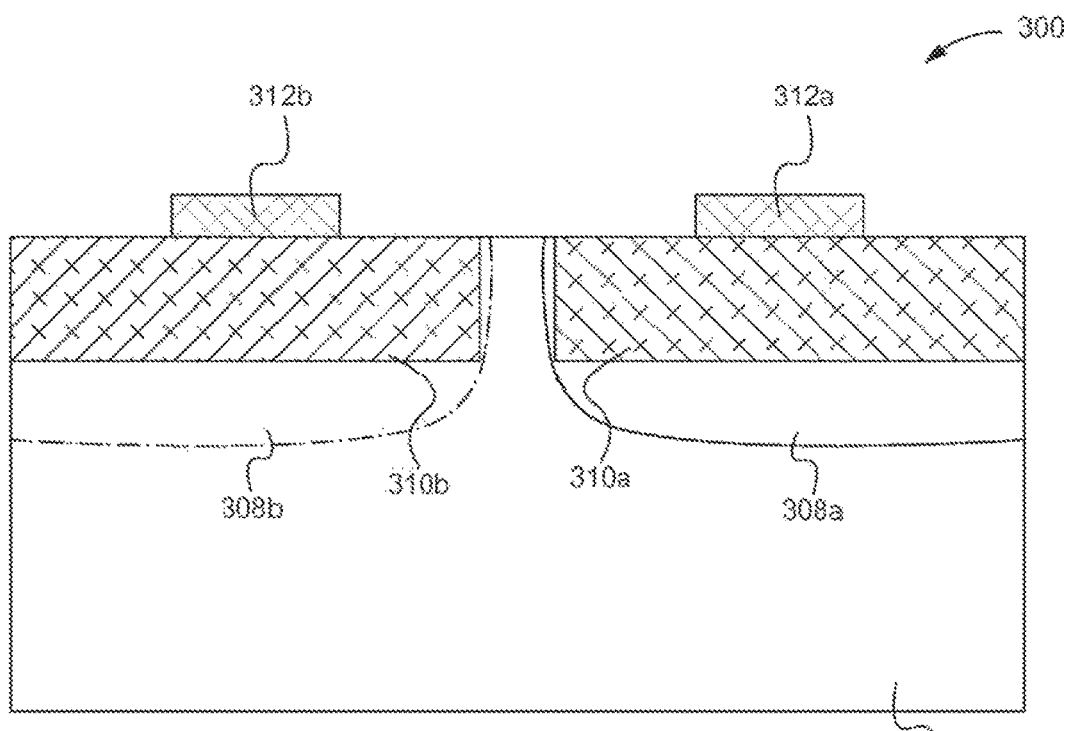
FIGS. 3D-3F illustrate first or shallow halo implant processing according to some embodiments.
Figure 3E:
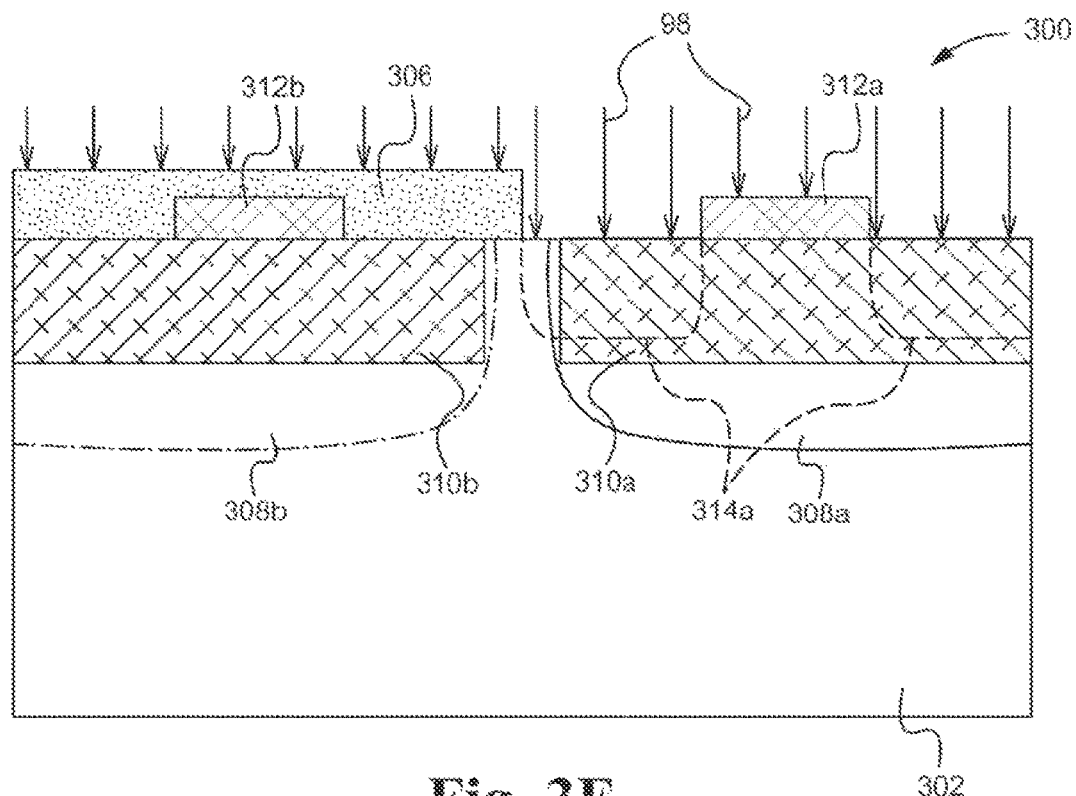
Figure 3F:
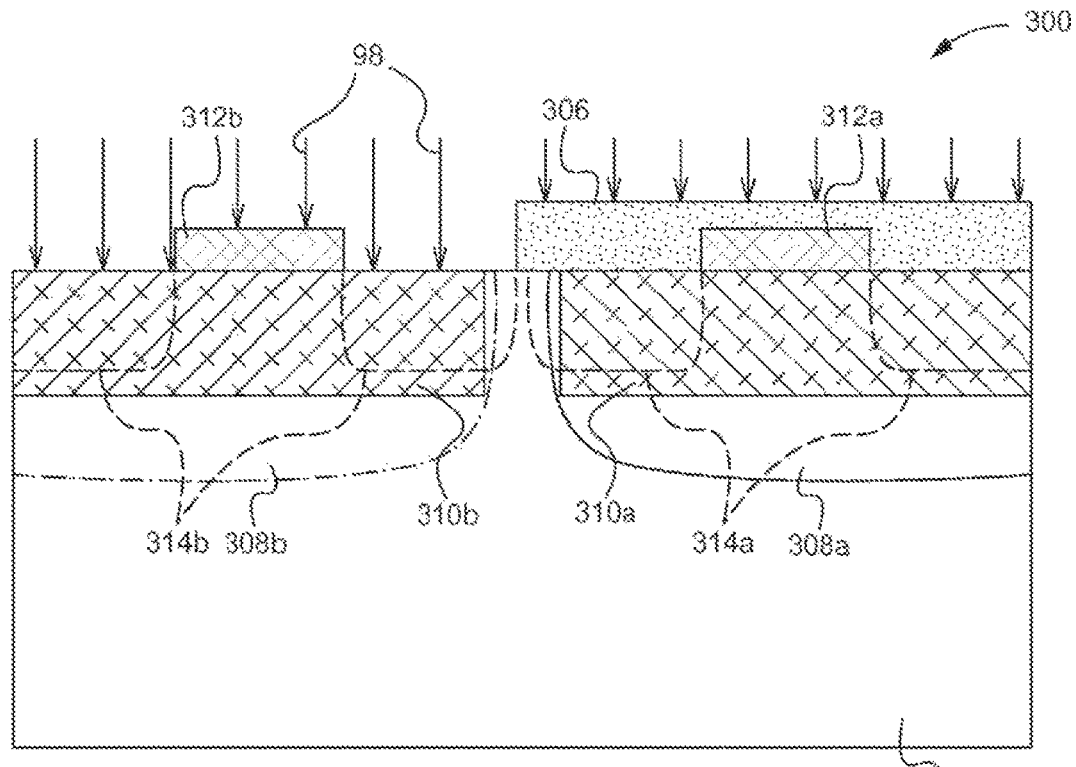

FIGS. 3D-3F illustrate first or shallow halo implant processing according to some embodiments. As shown in FIG. 3D, the remaining photoresist and oxide from the previous steps is removed (e.g. etching) and a new oxide film is grown with a thickness between 5 and 20 nm and etched (using photolithography) to form a gate oxide element 312a, 312b for each well 308a, 308b positioned substantially where a control gate will subsequently be positioned on the substrate 302.

Alternatively, in some embodiments, including metal gate embodiments, photoresist can be etched, there can be an initial oxide etch, and a rapid thermal anneal (RTA) of about 10-15 seconds at a temperature in the range of 850-950° C. Alternatively, a laser pulse anneal in an inert atmosphere and ambient temperature can be performed. A gate oxide can then be grown. In some embodiments, such gate oxide can have a thickness in the range of 1-10 nm, in some embodiments 3 nm. Oxide growth can include a temperature of about 850-950° C. for a time sufficient for a desired thickness. A photoresist layer can then be formed over the gate oxide having a thickness in the range of 50-500 nm, in some embodiments about 100 nm.

In some embodiments, the etching of the new oxide film is only partial such that the subsequent implanting is through approximately 5 nm thick oxide in the etched areas. In some embodiments, one or more spacer pairs 316a, 316b (see FIG. 3G) are able to be added around one or more of the gate oxide elements 312a, 312b using the same process as described in FIG. 3G. In some embodiments, the spacers are able to be mini-spacers such that they have a width of 10 to 15 Å.

In some embodiments, including metal gate embodiments, the gate oxide can be patterned to form dummy gate oxide elements (e.g., 312a/b). Dummy gate oxide elements can be formed with oversized gate masks. In some embodiments, oversized gate masks can be 1-2% larger than a target gate length. Optionally, prior to a first (shallow) halo implant mini-spacers (not shown) can be formed on the sides of dummy gate oxide elements. In some embodiments, such mini-spacers can have a size (in the gate length direction) in the range of 1-10 nm.

Then as shown in FIGS. 3E and 3F, one or more first halo implants 314a, 314b are implanted via a halo implant process 98 wherein photolithography (e.g., photoresist, masks and etching) is used to cover/uncover one or more of the wells 308a, 308b while the others are implanted with first halo implants 314a, 314b. For example, when a first type of impurities with a first polarity is used, only those wells 308 that correspond to the first halo implants having the first polarity are uncovered, whereas when a second type of impurities having a second polarity is used, only the other wells 308 that correspond to the second polarity are uncovered. In some embodiments, the halo implant process 98 comprises implanting at a tilt or angle. As described above, the first halo implants 314a, 314b are implanted to assist in suppressing the leakage currents that are a result of short channel effect (SCE). In particular, the positioning of the halo implants 314a, 314b within the transistor at a depth that is apart from the surface of the substrate 302 avoids creating high level concentrations (of the same polarity as the channel region) just below the gate in the channel region, which can lead to increased threshold voltages and increased channel resistance. In some embodiments, as described above the halo implants 314a, 314b are able to have a low impurity concentration region and a peak purity concentration region. It is understood that the order is able to be reversed and FIG. 3F is performed before FIG. 3E.

In some embodiments, implanting the first halo implants 314a for n-well 308a comprises implanting arsenic, phosphorus or antimony into the substrate 302 forming peak implant concentration between $1 \times 10^{18}$ atoms/cm$^3$ and $1 \times 10^{19}$ atoms/cm$^3$, for example, $5 \times 10^{18}$ atoms/cm$^3$. In some embodiments, the energy used to implant the impurities into the substrate 302 for the first halo implants 314a is between 2 KeV and 10 KeV, for example, 5 KeV. In some embodiments, implanting the first halo implants 314b for p-well 308b comprises implanting BF$_2$ or boron into the substrate 302 forming peak implant concentration between $1 \times 10^{18}$ atoms/cm$^3$ and $1 \times 10^{19}$ atoms/cm$^3$, for example, $5 \times 10^{18}$ atoms/cm$^3$. In some embodiments, the energy used to implant the impurities into the substrate 302 for the first halo implants 314b is between 2 KeV and 10 KeV, for example, 5 KeV. Alternatively, other numbers of dopants, peak implant concentrations, implant energies and/or types of dopants are able to be used as described above.

Referring to FIG. 3E, in some embodiments, including metal gate embodiments, a PMOSFET source-drain extension (PSDE) mask can be used to open PMOS device areas. A mask 306 can then be formed (e.g., develop and etch). A first halo implant can include implanting phosphorus (or antimony) into the substrate 302 at a dose of about $1 \times 10^{14}$ atoms/cm$^2$ at an energy in the range of 1-10 KeV, in some embodiments about 5 KeV. A resulting peak implant concentration can be in the range of $5 \times 10^{18}$ to $5 \times 10^{19}$ atoms/cm$^3$, about $1 \times 10^{19}$ atoms/cm$^3$ in some embodiments. The mask 306 can then be removed.

Referring to FIG. 3F, in some embodiments, including metal gate embodiments, an NMOSFET source-drain extension (NSDE) mask can be used to open NMOS device areas. A mask 306 can then be formed (e.g., develop and etch). A first halo implant can include implanting BF$_2$ (or boron) into the substrate 302 at a dose of about $1 \times 10^{14}$ atoms/cm$^2$ at an energy in the range of 5-15 KeV, in some embodiments about 5 KeV. A resulting peak implant concentration can be in the range of $5 \times 10^{18}$ to $5 \times 10^{19}$ atoms/cm$^3$, about $1 \times 10^{19}$ atoms/cm$^3$ in some embodiments. The mask 306 can then be removed.

Figure 3G:
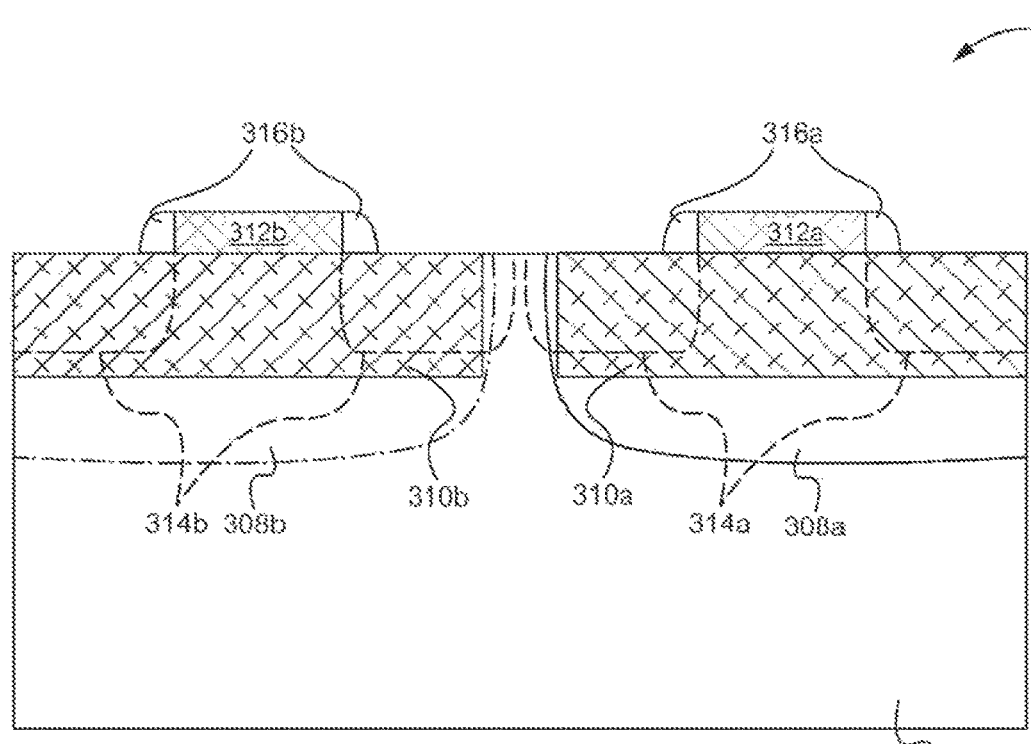
FIGS. 3G-3I illustrate second or deep halo implant processing according to some embodiments.
Figure 3H:
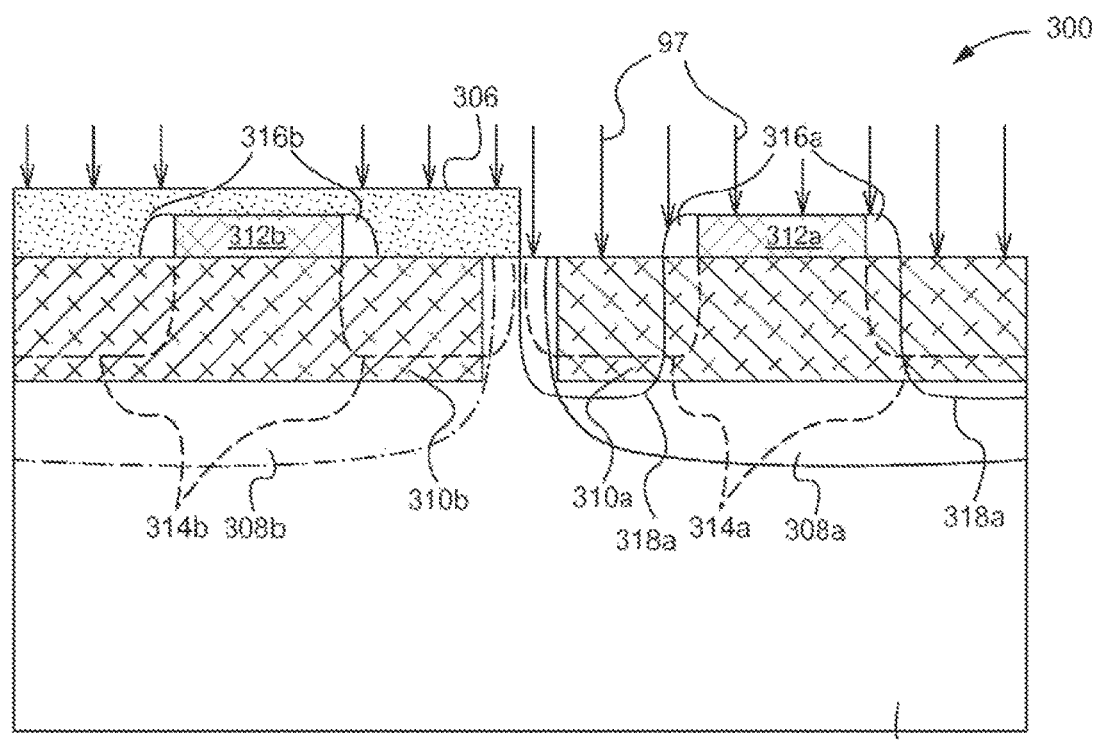
Figure 3I:
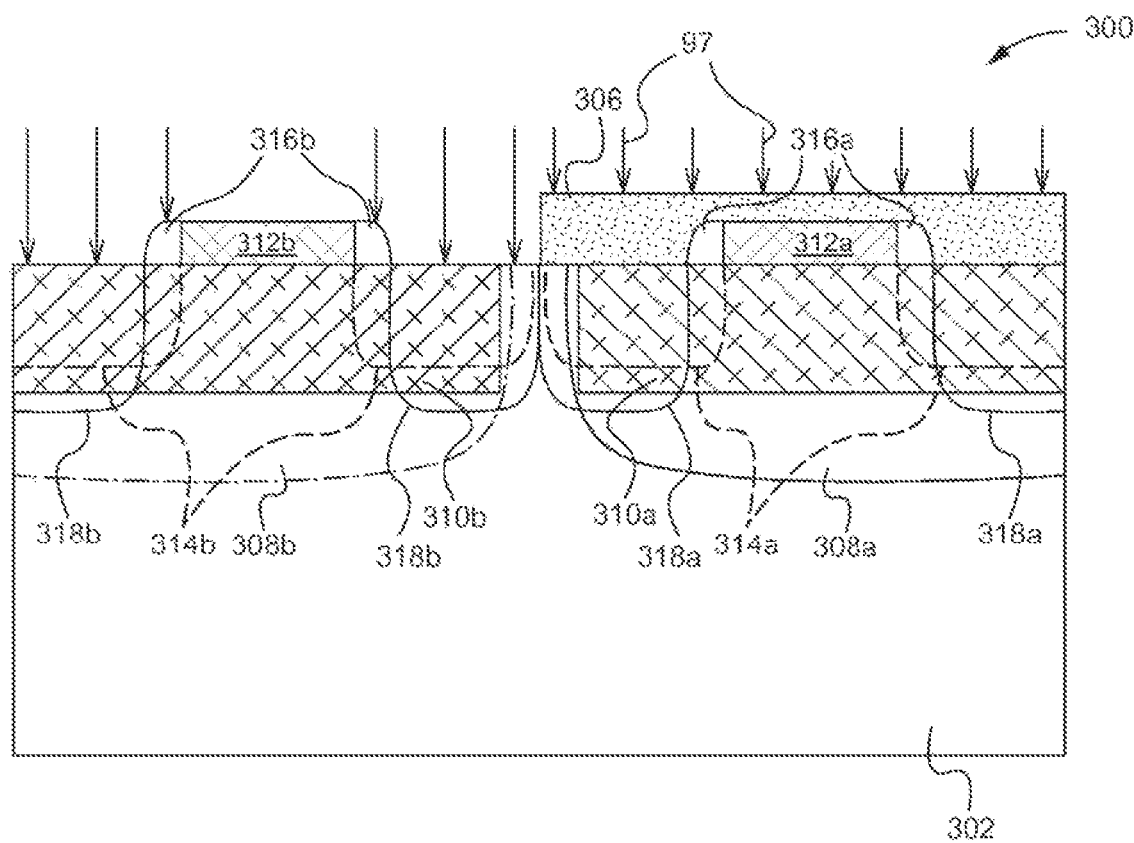

FIGS. 3G-3I illustrate second or deep halo implant processing according to some embodiments. As shown in FIG. 3G, the remaining photoresist from the previous steps is removed (e.g., etching) and a spacer oxide film is grown with a thickness between 50 and 200 nm (e.g. 100 nm) and etched (using photolithography) to form spacer pairs 316a, 316b for each gate oxide element 312a, 312b positioned such that the pairs 316a, 316b straddle each of the gate oxide elements 312a, 312b. As shown in FIG. 3G, the spacer pairs 316a, 316b are made of oxide. Alternatively, one or more of the spacer pairs 316a, 316b are able to be made of other materials, such as silicon nitride and/or a combination of oxide and silicon nitride. In some embodiments, each of the spacer pairs 316a, 316b have a width ranging from zero nm (when no spacer is used) to 20 nm, or from 2 nm to 10 nm, for example 5 nm. In some embodiments, the spacer pairs 316a, 316b are able to be mini-spacers and have a width of 10 to 15 Å. In particular, the spacer pairs 316a, 316b are able to be positioned such that the second halo implants 318a, 318b, discussed below, are able to be formed at an offset below the first halo implants 314a, 314b. In some embodiments where spacer pairs were created for the first halo implants 314a, 314b, the same spacer pairs are able to be used for implanting the second halo implants 318a, 318b. Alternatively, both the first and second halo implants are able to be implanted without the use of spacer pairs.

Then as shown in FIGS. 3H and 3I, one or more second halo implants 318a, 318b are implanted via a halo implant process 97 wherein photolithography (e.g., photoresist, masks, etching) is used to cover/uncover one or more of the wells 308a, 308b while the others are implanted with the second halo implants 318a, 318b. For example, when a first type of impurities with a first polarity is used, only those wells 308 that correspond to the second halo implants having the first polarity are uncovered, whereas when a second type of impurities having a second polarity is used, only the other wells 308 that correspond to the second polarity are uncovered. The second halo implants 318a, 318b are able to be positioned deeper within the substrate 302 below the first halo implants 314a, 314b. In some embodiments, the halo implant process 97 comprises implanting at a tilt or angle. As with the first halo implants 314a, 314b, the impurities used to form the second halo implants 318a, 318b are of the same polarity as the substrate channel to which they correspond. In some embodiments, the peak concentration of second halo implants 318a, 318b are positioned just below the DSD junctions 336a, 336b as described below in reference to FIGS. 3Q and 3R. As described above, the second halo implants 318a, 318b are implanted to further reduce the leakage from the deeper channel region where the gate bias cannot control the potential. In some embodiments, as described above the halo implants 318a, 318b are able to have a low impurity concentration region and a peak impurity concentration region.

In some embodiments, implanting the second halo implants 318a, 318b for the n-well 308a and the p-well 308b comprises implanting arsenic, phosphorus or antimony for the implants 318a or implanting boron or $BF_2$ for implants 318b into the substrate 302 forming peak implant concentration between $1\times10^{18}$ atoms/$cm^3$ and $1\times10^{19}$ atoms/$cm^3$, for example, $5\times10^{18}$ atoms/$cm^3$. In some embodiments, the energy used to implant the impurities into the substrate 302 for the second halo implants 318a and 318b is between 5 KeV and 20 KeV, for example, 10 KeV. Alternatively, other numbers of dopants, peak implant concentrations, implant energies and/or types of dopants are able to be used as described above. It is understood that the order is able to be reversed and FIG. 3I is performed before FIG. 3H.

Referring to FIG. 3H, in some embodiments, including metal gate embodiments, a p-type deep source-drain (PDSD) mask can be used to open PMOS device areas. A mask 306 can then be formed (e.g., develop and etch). A second halo implant can include implanting phosphorus (or antimony) into the substrate 302 at a dose of about $1\times10^{14}$ atoms/$cm^2$ at an energy in the range of 5-15 KeV, in some embodiments about 10 KeV. A resulting peak implant concentration can be in the range of $1\times10^{18}$ to $1\times10^{19}$ atoms/$cm^3$, about $5\times10^{18}$ atoms/$cm^3$ in some embodiments. The mask 306 can then be removed.

Referring to FIG. 3I, in some embodiments, including metal gate embodiments, an n-type deep source-drain (NDSD) mask can be used to open NMOS device areas. A mask 306 can then be formed (e.g., develop and etch). A first halo implant can include implanting $BF_2$ into the substrate 302 at a dose of about $1\times10^{14}$ atoms/$cm^2$ at an energy in the range of 5-15 KeV, in some embodiments about 10 KeV. A resulting peak implant concentration can be in the range of $1\times10^{18}$ to $1\times10^{19}$ atoms/$cm^3$, about $5\times10^{18}$ atoms/$cm^3$ in some embodiments. The mask 306 can then be removed.

FIG. 3J illustrates a process of forming an epitaxial layer 320 on the substrate 302 according to some embodiments. As shown in FIG. 3J, the spacer pairs 316a, 316b, gate oxide elements 312a, 312b and residual photoresist or other oxide are removed (e.g. via etching) and the epitaxial layer 320 is formed over or deposited on top of the substrate 302 and to eventually be used as a channel region. Because the epitaxial layer 320 is deposited on top of the substrate 302 after the substrate 302 has been doped to form the wells 308a, 308b, the Vth adjust layers 310a, 310b, and the halos 314a, 314b, 318a, 318b. Accordingly, the wells 308a, 308b, the Vth adjust layers 310a, 310b and the halos 314a, 314b, 318a, 318b are buried under the epitaxial layer 320. The portion of the epitaxial layer 320 that forms the channel region, as described below, is then able to be covered by the gate electrodes 328a, 328b and/or gate oxides 326a, 326b during implanting of the DSDs 336a, 336b and SDEs 332a, 332b. As a result, the epitaxial layer 320 provides the benefit of reducing the process variability of the transistor structure 200 particularly in the channel region. In some embodiments, the epitaxial layer 320 has a thickness between 2 and 30 nm, for example 20 nm. Alternatively, greater or smaller thicknesses are contemplated. In some embodiments, the epitaxial layer 320 is un-doped. Alternatively, the layer 320 is able to be lightly doped. Further, it is noted that dopants from the first and second halo implants and the Vth adjust implants are able to up-diffuse into the epitaxial layer 320.

Figure 3K:
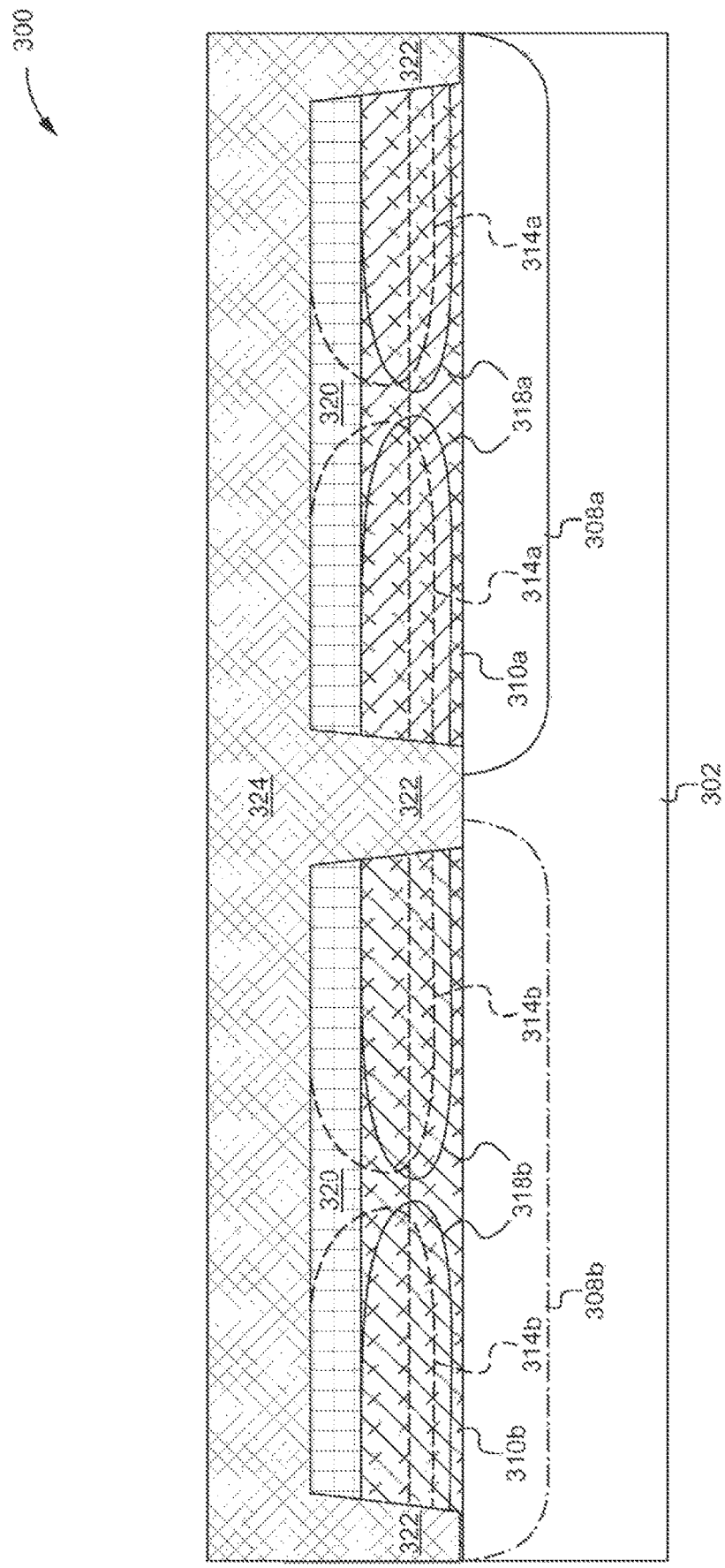
FIG. 3K illustrates deposition and etching processes of insulating or separating the active areas of the substrate 302 according to some embodiments.

FIG. 3K illustrates deposition and etching processes of insulating or separating the active areas of the substrate 302 according to some embodiments. As shown in FIG. 3K, using a trench mask a shallow trench 322 is etched or otherwise dug into the substrate 302 between at least a portion of the p-well 308b and the n-well 308a. In some embodiments, the trench 322 has a depth in the range of 200 to 600 nm, for example 400 nm. Alternatively, other depths are contemplated. The trench 322 is then filled and the remainder of the substrate 302 is covered with a trench oxide 324 which is then partially removed (not shown) in active areas to expose the epitaxial layer 320 areas and other active areas that correspond to the p-well 308b and the n-well 308a. In some embodiments, the removal of the excess trench oxide 324 is performed via chemical mechanical polishing planarization process. Alternatively, other removal methods are able to be used such as etching. In some embodiments, oxide is deposited or grown before the trench 322 is dug, wherein additional oxide is then deposited to fill the trench as the trench oxide 324. Such grown/deposited oxide can have a thickness in the range of 2-10 nm, or about 5 nm in some embodiments. Alternatively, other types of isolation are able to be used such as diffusion isolation or other techniques well known in the art.

Figure 3L:
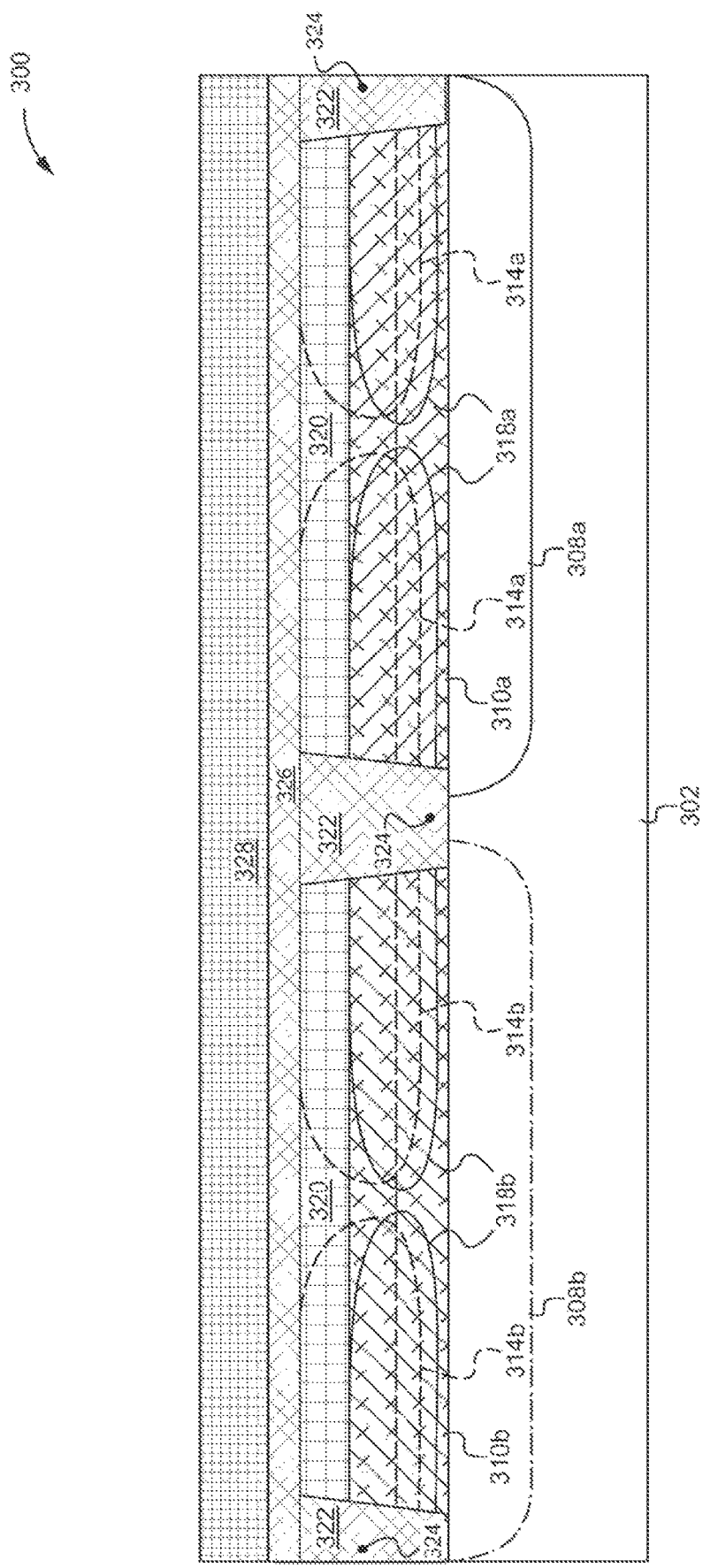
FIGS. 3L and 3M illustrate a process of forming a gate for each well according to some embodiments.
Figure 3M:
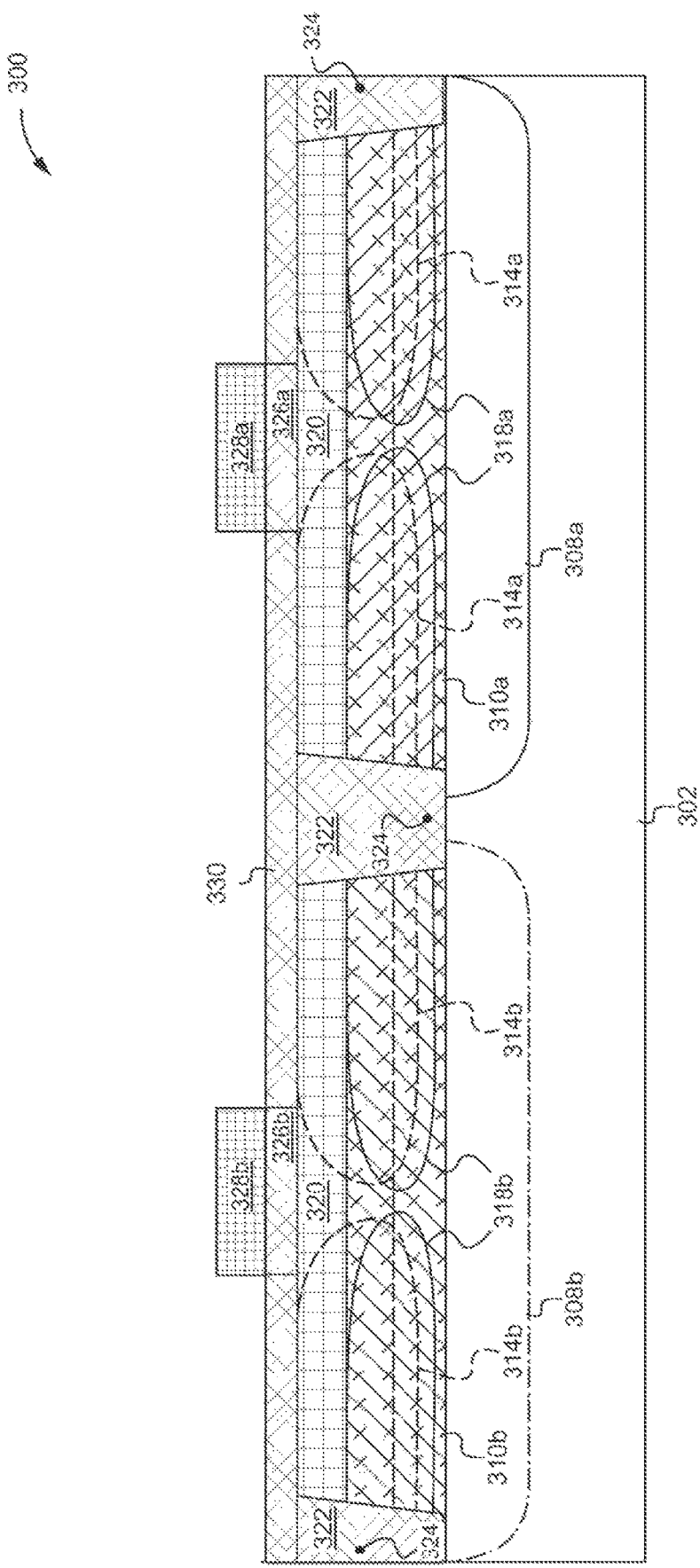

FIGS. 3L and 3M illustrate a process of forming a gate 326a, 326b for each well 308 according to some embodiments. As shown in FIG. 3L, a gate oxide layer 326 is grown on the surface of the epitaxial layer 320 including the exposed surface of the active areas and a gate electrode layer 328 is formed over the oxide layer 326. In some embodiments, the oxide layer 326 has an effective thickness of 1 nm and is made of silicon dioxide. Alternatively, the layer 326 is able to have other thicknesses and/or be made of other materials such as materials that are high-k dielectrics or combination of silicon dioxide and/or high-K dielectric materials. In some embodiments, the electrode layer 328 is made of degenerately doped (more than $5 \times 10^{19}$ atoms/cm$^3$) poly-silicon. In some embodiments, the polarity of the poly-silicon for NMOS is n+ poly and for PMOS is p+ poly. Alternatively, the electrode layer 328 is able to be made of one or more metals, polymers or other electrode materials. As shown in FIG. 3M, using photolithography and a gate mask, the electrode layer 328 and the gate oxide layer 326 are etched into separate gate electrodes 328a, 328b and separate gate oxides 326a, 326b for each well 308. In particular, the gate electrodes 328a, 328b and gate oxides 326a, 326b are able to be positioned on the substrate in substantially the same location as the gate oxide elements 312a, 312b described above. Further as shown in FIG. 3M, a masking oxide layer 330 is deposited and etched on the substrate 302 optionally forming SDE mini-spacers (not shown).

Referring to FIG. 3L, in some embodiments, including metal gate embodiments, a gate layer can be a dummy gate layer, that will be removed in the formation of a metal gate. In such embodiments, following the formation of shallow trench isolation structures, a surface can be cleaned and then etched to expose the surface of the epitaxial layer 320. A gate oxide 326 can then be grown having a thickness in the range of about 1-5 nm, in some embodiments about 1.2 nm. A dummy gate layer 328 can then be deposited. Such a dummy gate layer can be of any suitable material, and in some embodiments can be polysilicon having a thickness in the range of 5-15 nm, in some embodiments about 10 nm.

Referring to FIG. 3M, in some embodiments, including metal gate embodiments, a dummy gate layer can be patterned to form dummy gates 328a/b. Formation of dummy gates 328a/b can include forming a gate mask having a target gate length. The dummy gate layer can then be etched to form dummy gates. In addition, afterward oxide can also be etched. A masking oxide can then be grown on surface of epi layer 320.

Figure 3N:
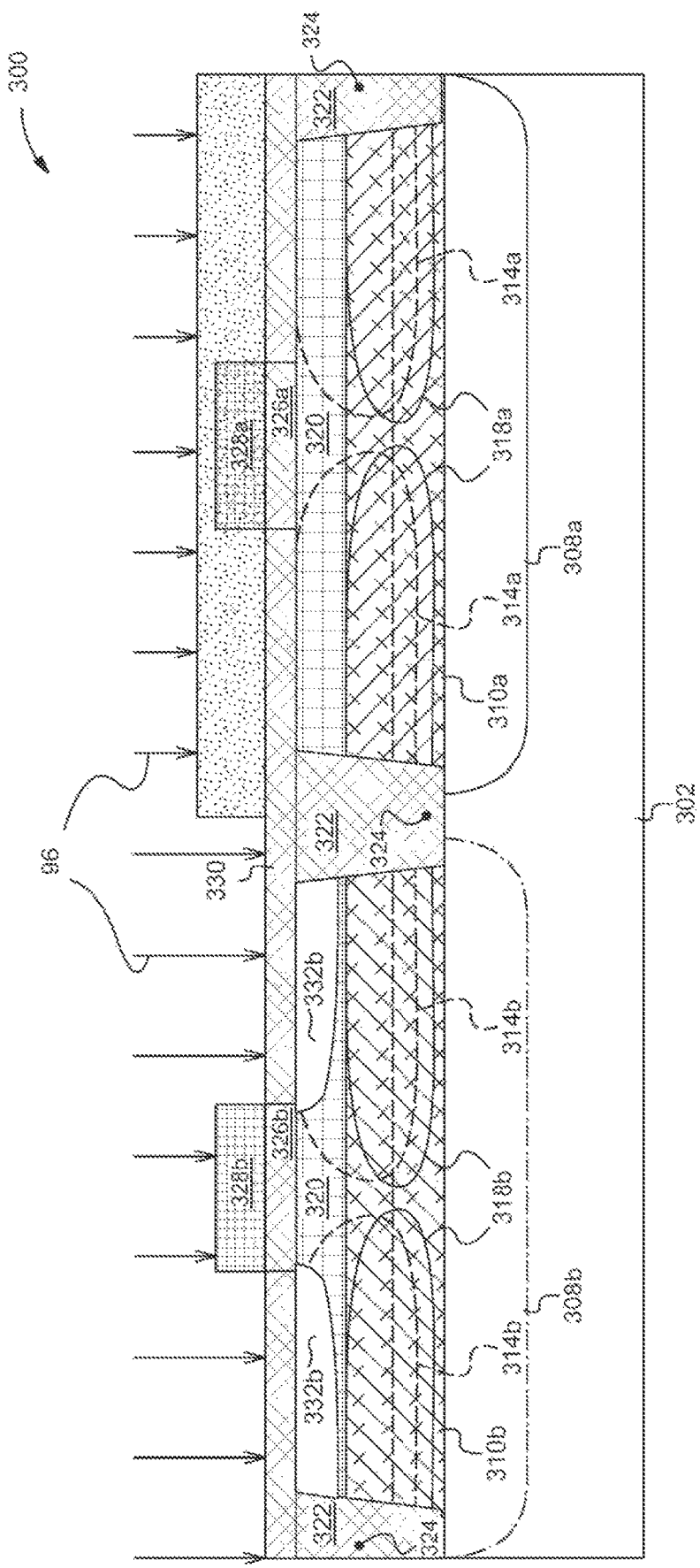
Figure 30:
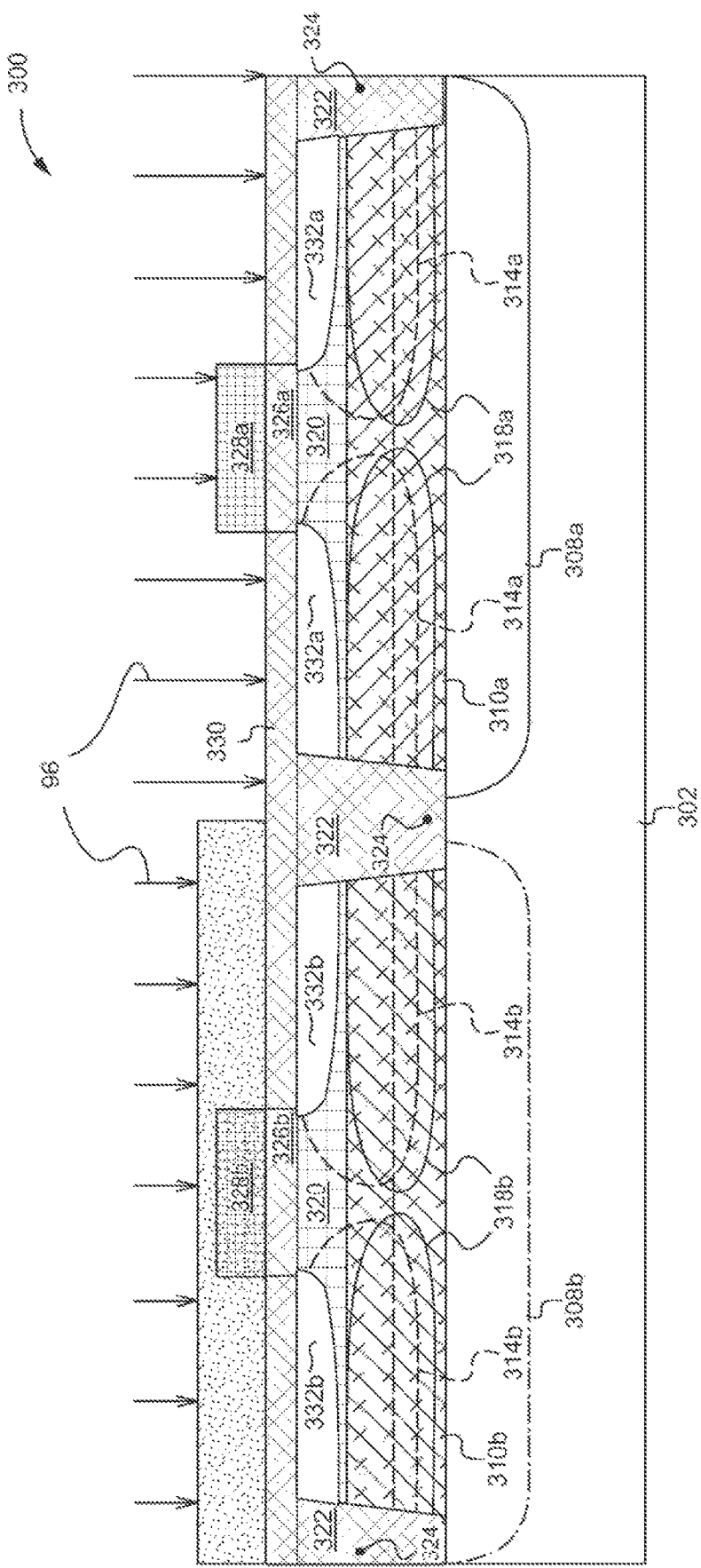

FIGS. 3N and 3O illustrate an SDE implant process according to some embodiments. As shown in FIGS. 3N and 3O, one or more SDEs 332a, 332b are implanted via an extension implant process 96 wherein photolithography is used to selectively cover/uncover one well of the wells 308a, 308b while the other is implanted with the one or more SDE extensions 332a, 332b. For example, when a first type of impurities with a first polarity is used, only those wells 308 that correspond to the SDE having the first polarity are uncovered, whereas when a second type of impurities having a second polarity is used, only the other wells 308 that correspond to the second polarity are uncovered. It is noted that the polarity of the one or more SDE extensions 332a, 332b is opposite to that of the channel/well region, which is in contrast the polarity of the halo implants 314, 318 which are the same as the well doping type 308. In some embodiments, implanting the one or more SDEs 332a, 332b comprises forming a pair of mini-spacers pairs (not shown) for each a gate electrode 328a, 328b positioned such that the pairs straddle each of the gate electrode 328a, 328b. The pairs of mini-spacers are able to be made of oxide and/or other materials, such as silicon nitride. In some embodiments, each of the mini-spacers have a width of 10 to 15 Å. Alternatively, other widths are able to be used.

In some embodiments, implanting the one or more SDEs 332a, 332b for the n-well 308a and the p-well 308b comprises implanting boron or BF$_2$ for the extensions 332a or implanting arsenic, phosphorus or antimony for extensions 332b into the substrate 302 forming peak implant concentration between $5 \times 10^{19}$ atoms/cm$^3$ and $5 \times 10^{20}$ atoms/cm$^3$. In some embodiments, the energy used to implant the impurities into the substrate 302 for the one or more SDEs 332a, 332b is between 200 eV and 1000 eV, for example, 300 eV. Alternatively, other numbers of dopants, peak implant concentrations, implant energies and/or types of dopants are able to be used as described above. It is understood that the order is able to be reversed and FIG. 3O is performed before FIG. 3N. After the one or more SDE extensions 332a, 332b are implanted, an etch operation (not shown) is performed to clean any residue left from the operation 96.

It should also be noted that an alternative way of creating the one or more SDEs 332a, 332b is with solid source deposition. Solid source deposition is done by doping the transistor with the impurities used to form the one or more SDEs 332a, 332b. After the transistor is doped, an annealing operation is performed which causes the impurities to diffuse through the substrate 302.

Referring to FIG. 3N, in some embodiments, including metal gate embodiments, an NMOS source-drain extension (NSDE) mask can be used to open NMOS device areas. A mask can then be formed (e.g., develop and etch) over PMOS regions having a thickness in the range of about 50-500 nm, in some embodiments about 100 nm. A source-drain extension implant can include implanting arsenic into the substrate 302 at a dose of about $1 \times 10^{14}$ atoms/cm$^2$ at an energy in the range of 1-5 KeV, in some embodiments about 2 KeV. A resulting peak implant concentration can be in the range of $1 \times 10^{19}$ to $1 \times 10^{20}$ atoms/cm$^3$, about $5 \times 10^{19}$ atoms/cm$^3$ in some embodiments. The mask can then be removed.

Referring to FIG. 3O, in some embodiments, including metal gate embodiments, a PMOS source-drain extension (PSDE) mask can be used to open PMOS device areas. A mask can then be formed (e.g., develop and etch) over PMOS regions having a thickness in the range of about 50-500 nm, in some embodiments about 100 nm. A source-drain extension implant can include implanting BF$_2$ into the substrate 302 at a dose of about $1 \times 10^{14}$ atoms/cm$^2$ at an energy in the range of 1-5 KeV, in some embodiments about 2 KeV. A resulting peak implant concentration can be in the range of $1 \times 10^{19}$ to $1 \times 10^{20}$ atoms/cm$^3$, about $5 \times 10^{19}$ atoms/cm$^3$ in some embodiments. The mask can then be removed.

Figure 3P:
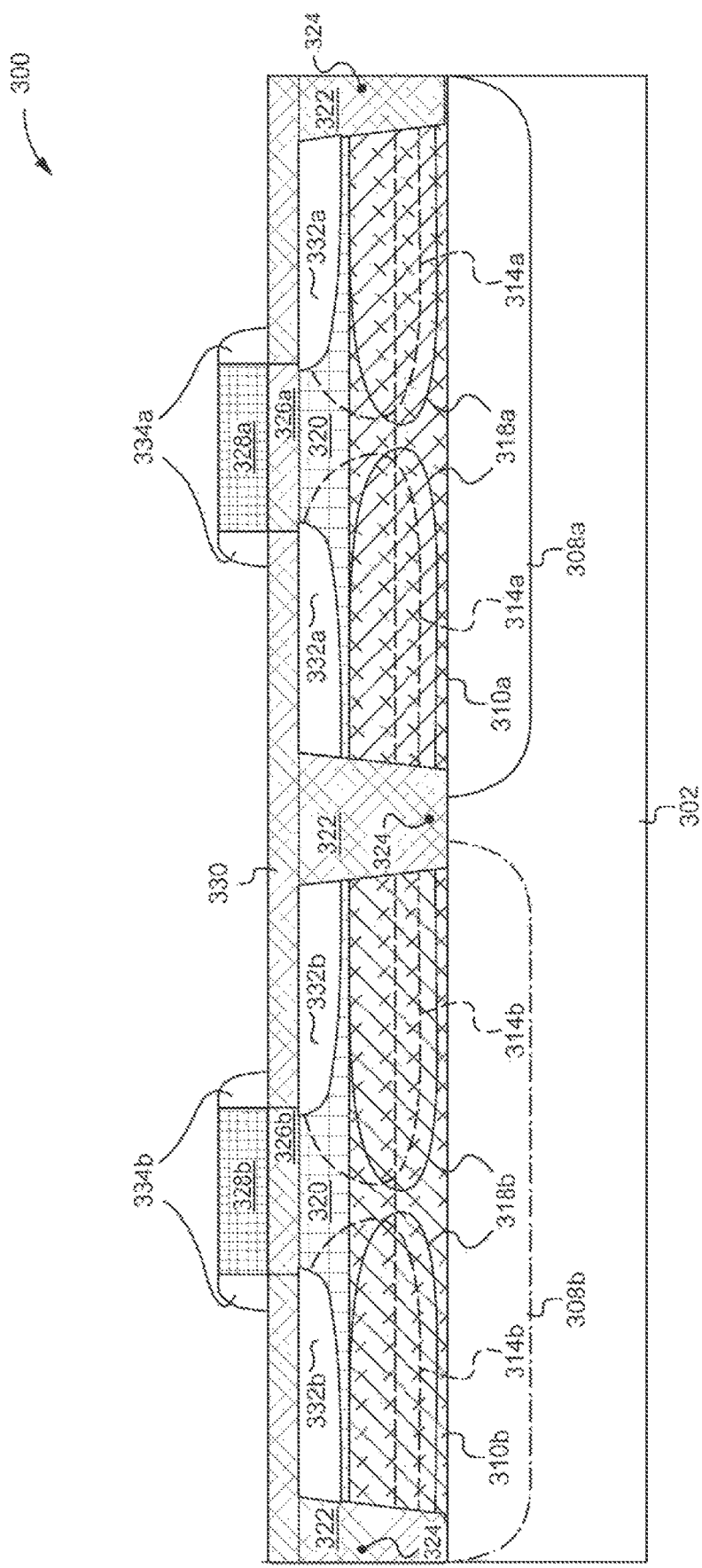
FIG. 3P illustrates the formation of deep source drain (DSD) spacers according to some embodiments.

FIG. 3P illustrates the formation of DSD spacers 334a, 334b according to some embodiments. As shown in FIG. 3P, a DSD spacer oxide film is grown with a thickness between 50 and 200 nm (e.g. 100 nm) and etched (using photolithography) to form DSD spacer pairs 334a, 334b for each gate electrode 328a, 328b positioned such that the pairs 334a, 334b straddle each of the gate electrode 328a, 328b. As shown in FIG. 3P, the DSD spacer pairs 334a, 334b are made of oxide. Alternatively, one or more of the DSD spacer pairs 334a, 334b are able to be made of other materials, such as silicon nitride and/or a combination of oxide and nitride. In some embodiments, each of the DSD spacer pairs 334a, 334b have a width ranging from 30 nm to 100 nm, for example, 50 nm. In particular, the DSD spacer pairs 334a, 334b are able to be positioned such that the DSDs 336a, 336b, discussed below, are able to be formed at an offset from the SDE extensions 332a, 332b. A surface can then be cleaned.

Figure 3Q:
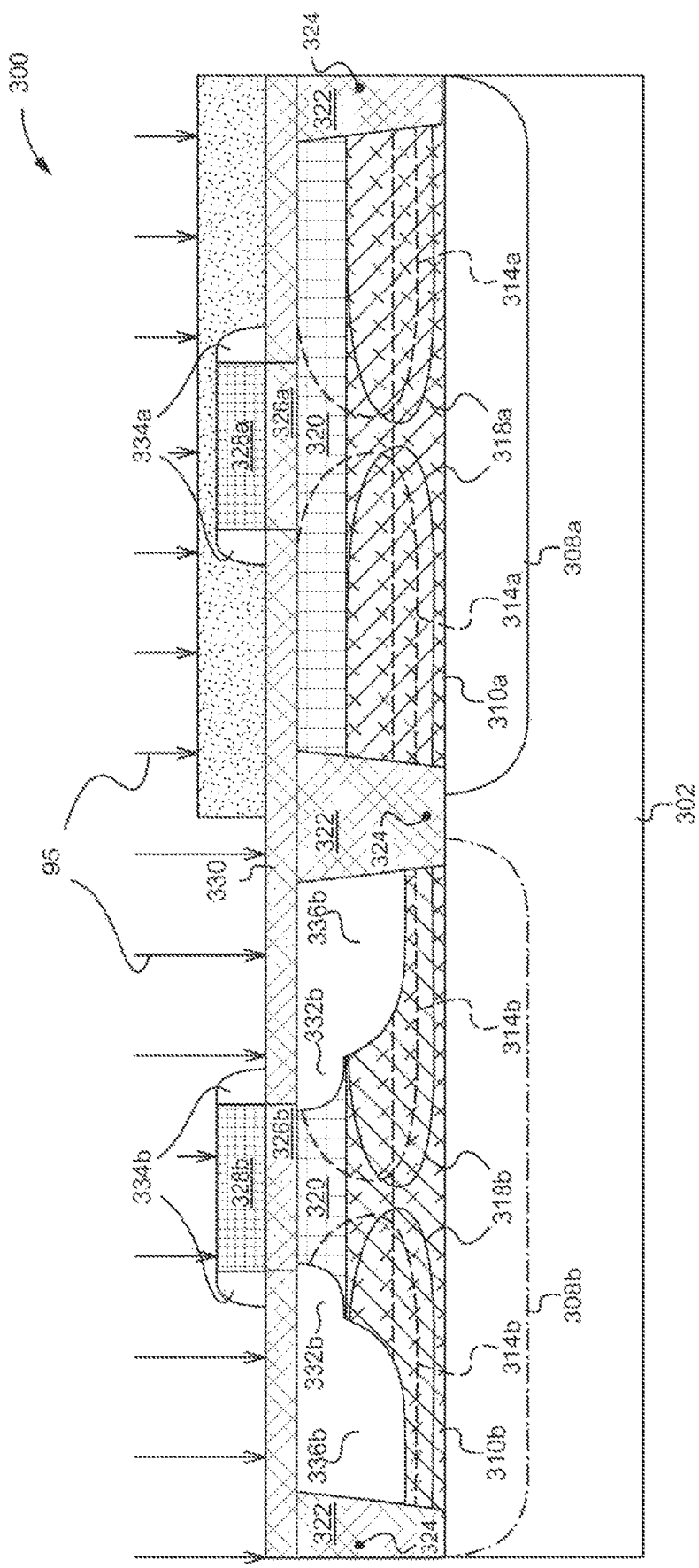
FIGS. 3Q and 3R illustrate a DSD implant process according to some embodiments.
Figure 3R:
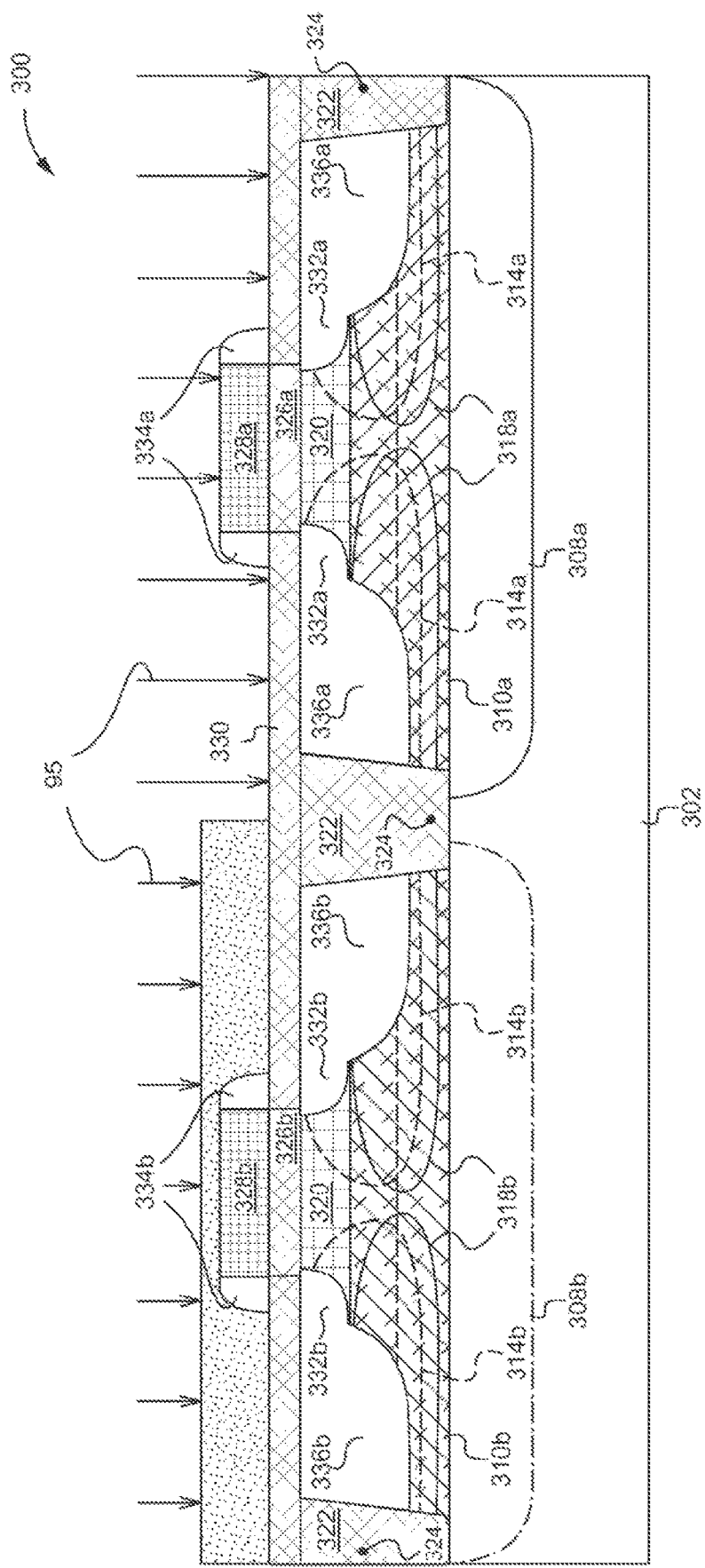

FIGS. 3Q and 3R illustrate a DSD implant process according to some embodiments. As shown in FIGS. 3Q and 3R, one or more DSDs 336a, 336b are implanted via an extension implant process 95 wherein photolithography is used to selectively cover/uncover one well of the wells 308a, 308b while the other is implanted with the DSDs 336a, 336b. For example, when a first type of impurities with a first polarity is used, only those wells 308 that correspond to the DSD having the first polarity are uncovered, whereas when a second type of impurities having a second polarity is used, only the other wells 308 that correspond to the second polarity are uncovered. It is noted that the polarity of the DSDs 336a, 336b is opposite to that of the channel/well region, which is in contrast to the polarity of the halo implants 314, 318 which are the same as the well doping type 308.

In some embodiments, implanting the DSDs 336a for the n-well 308a comprises implanting boron or $BF_2$ into the substrate 302 forming peak implant concentration between $5 \times 10^{19}$ atoms/cm$^3$ and $2 \times 10^{20}$ atoms/cm$^3$. In some embodiments, implanting the DSDs 336b for the p-well 308b comprises implanting arsenic, phosphorus or antimony into the substrate 302 forming peak implant concentration between $1 \times 10^{20}$ atoms/cm$^3$ and $5 \times 10^{20}$ atoms/cm$^3$. In some embodiments, the energy used to implant the impurities into the substrate 302 for the DSDs 336a, 336b is between 500 eV and 5 KeV, for example, 1 KeV. Alternatively, other numbers of dopants, peak implant concentrations, implant energies and/or types of dopants are able to be used as described above. It is understood that the order is able to be reversed and FIG. 3R is performed before FIG. 3Q. After the DSDs 336a, 336b are implanted, an etch operation (not shown) is performed to clean any residue left from the operation 95 including any remaining photoresist and the DSD spacer pairs 334a, 334b. Additionally, it should be noted that the impurities will diffuse through the substrate 302 to form the optimized source-drain wells that extend below the deep or second halo implants 318a, 318b after an annealing operation described below.

Referring to FIG. 3Q, in some embodiments, including metal gate embodiments, an NMOS source-drain (NSD) mask can be used to open NMOS device areas. A mask can then be formed (e.g., develop and etch) over PMOS regions having a thickness in the range of about 50-500 nm, in some embodiments about 100 nm. A deep source-drain implant can include implanting arsenic (or alternatively phosphorous) into the substrate 302 at a dose of about $5 \times 10^{14}$ atoms/cm$^2$ at an energy in the range of 5-20 KeV, in some embodiments about 10 KeV. A resulting peak implant concentration can be in the range of $5 \times 10^{19}$ to $2 \times 10^{20}$ atoms/cm$^3$, about $1 \times 10^{20}$ atoms/cm$^3$ in some embodiments. The mask can then be removed, and the surface cleaned.

Referring to FIG. 3R, in some embodiments, including metal gate embodiments, a PMOS source-drain (PSD) mask can be used to open PMOS device areas. A mask can then be formed (e.g., develop and etch) over PMOS regions having a thickness in the range of about 50-500 nm, in some embodiments about 100 nm. A source-drain extension can include implanting boron into the substrate 302 at a dose of about $5 \times 10^{14}$ atoms/cm$^2$ at an energy in the range of 5-20 KeV, in some embodiments about 10 KeV. A resulting peak implant concentration can be in the range of $5 \times 10^{19}$ to $2 \times 10^{20}$ atoms/cm$^3$, about $1 \times 10^{20}$ atoms/cm$^3$ in some embodiments. The mask can then be removed.

Figure 3S:
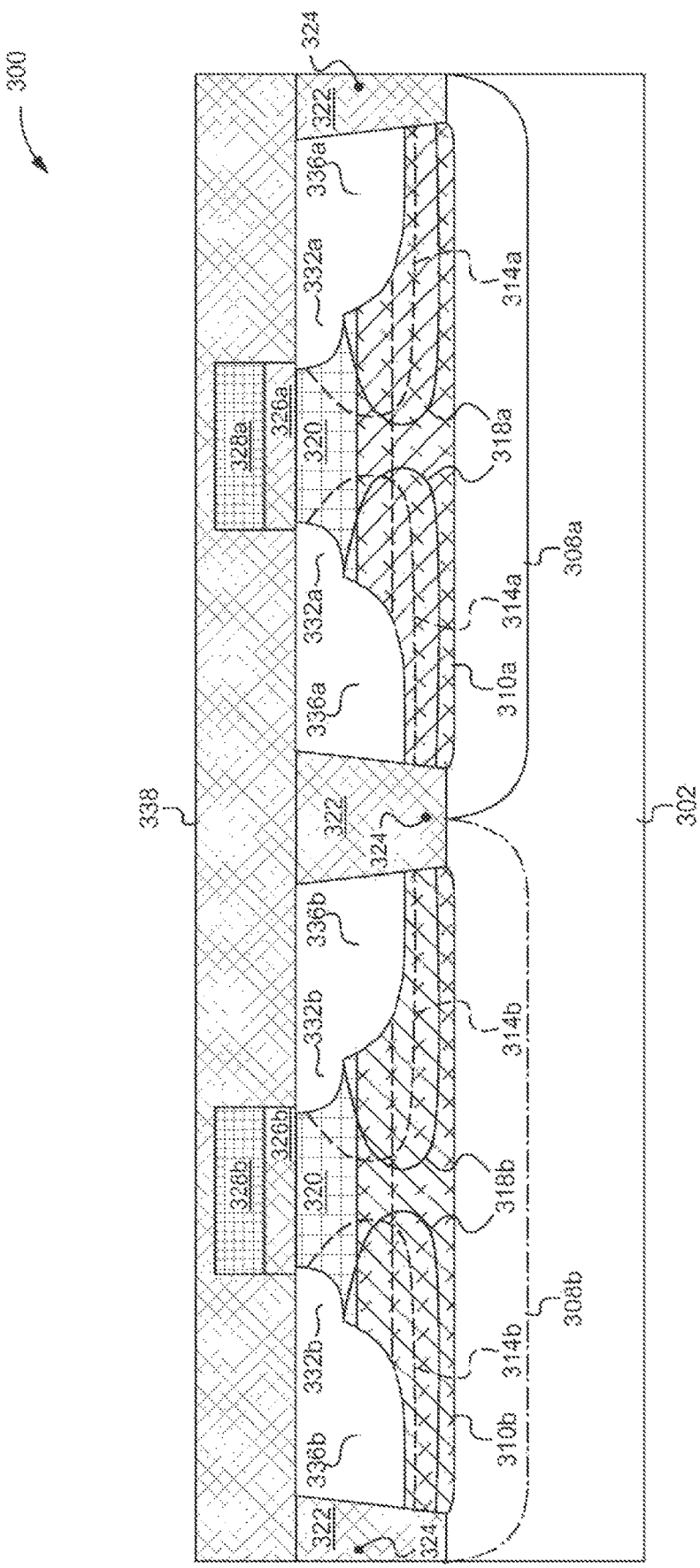
FIG. 3S illustrates the complimentary transistor structure after a thermal treatment process according to some embodiments.

FIG. 3S illustrates the complimentary transistor structure 300 after a thermal treatment process according to some embodiments. As shown in FIG. 3S, an anneal oxide 338 is deposited over the substrate 302 including the gate electrode 328a, 328b and corresponding gate oxide elements 326a, 326b. The structure 300 is then subjected to the thermal treatment process. In some embodiments, the thermal treatment process is a rapid thermal anneal (RTA) process. Alternatively, the thermal treatment process is able to be a laser thermal anneal (LTA) process, a millisecond anneal and/or other types of anneal processes. In some embodiments, the thermal treatment process is done at a temperature ranging from 900° C. to 1100° C., for example, 950° C. In some embodiments, the time for the thermal treatment process ranges from 5 seconds to 60 seconds, for example, 10 seconds. After the thermal treatment operation is completed, the DSDs 336a, 336b are defined. For example, the thermal treatment is able to cause the DSDs 336a, 336b to extend from the surface of the substrate 302 down to near the deep halo implants 318a, 318b. As a result, when one or more of the gate electrodes 328a, 328b are turned ON with lower threshold voltages (due to the Vth adjust layers 310a, 310b), an inversion layer is able to be formed and current is able to flow from one DSDs 336a, 336b to another DSDs 336a, 336b on the other side of the gate electrodes 328a, 328b with reduced resistance. In particular, in some embodiments the threshold voltage is able to be approximately 0.35V and the device is able to be turned ON due to an applied gate voltage of approximately 0.9V.

FIG. 3T illustrates the complimentary transistor structure 300 after addition of one or more terminals according to some embodiments. As shown in FIG. 3T, source terminals 340a, 340b, gate terminals 342a, 342b, drain terminals 344a, 344b and body terminals 346a, 346b are added to the transistor structure 300 thereby forming two transistors on the single substrate 302 capable of operating complementarity or separately. In particular, each of the transistors comprise a plurality of halo implants, a Vth adjust implant/layer and/or an epitaxial layer that minimize leakage current, punch through, high ON resistance and threshold voltage variation due to process variability, while at the same time maintaining required threshold voltages despite the use of small gate dimensions. Specifically, the first or shallow halo implants and the second or deep halo implants along with the Vth adjust implant/layer enable a peak concentration of substrate impurities at a level below the gates 342a, 342b, such that the resistance of the transistor is able to be minimized along with the threshold voltage, threshold voltage fluctuations, short channel effects, and leakage current in the transistor. It is understood that the process of FIGS. 3A-3T is able to further comprise one or more etching or other types of cleaning operations to clean the surface after one or more of the steps, wherein these operations have not been described herein for the sake of brevity. Further it is understood that one or more of the steps described relating to FIGS. 3A-3T are able to be omitted and/or performed in a different order such that FIGS. 3A-3T are not necessarily sequential.

Figure 4:
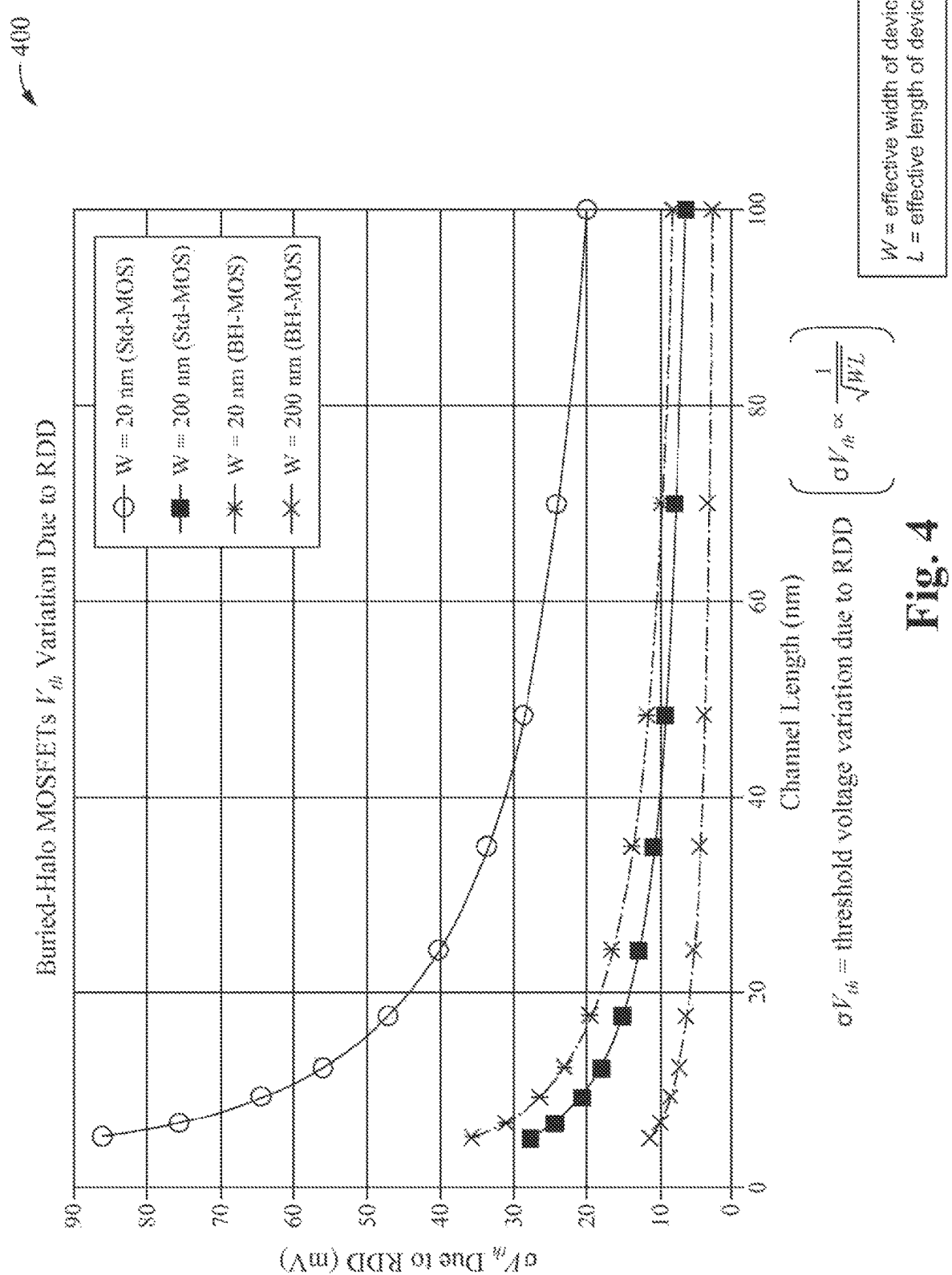
FIG. 4 illustrates a graph 400 illustrating threshold voltage variation in buried-halo MOSFETs due to random discrete dopants (RDD) versus channel length according to some embodiments.

FIG. 4 illustrates a graph 400 illustrating threshold voltage variation in buried-halo MOSFETs due to random discrete dopants (RDD) versus channel length according to some embodiments. As shown in FIG. 4, in conventional or standard (std) MOSFETs as the channel length decreases, the threshold voltage variation caused by the RDD increases greatly exceeding 80 mV and 20 mV in standard MOSFETs having effective channel widths of 20 nm and 200 nm, respectively, for channel lengths below 20 nm. In contrast, in BH-MOSFETs having a structure as described above in FIGS. 1-3, the increase in threshold voltage variation is substantially reduced such than even with a channel length below 20 nm the threshold voltage variation is less than 40 mV and 20 mV for BH-MOSFETs having an effective channel width of 20 and 200 nm, respectively. As described herein, this reduction in the BH-MOSFETs described herein is due to the combination of an epitaxial layer deposited on top of one or more buried halos such that the RDD effects are minimized within the channels.

Figure 5A:
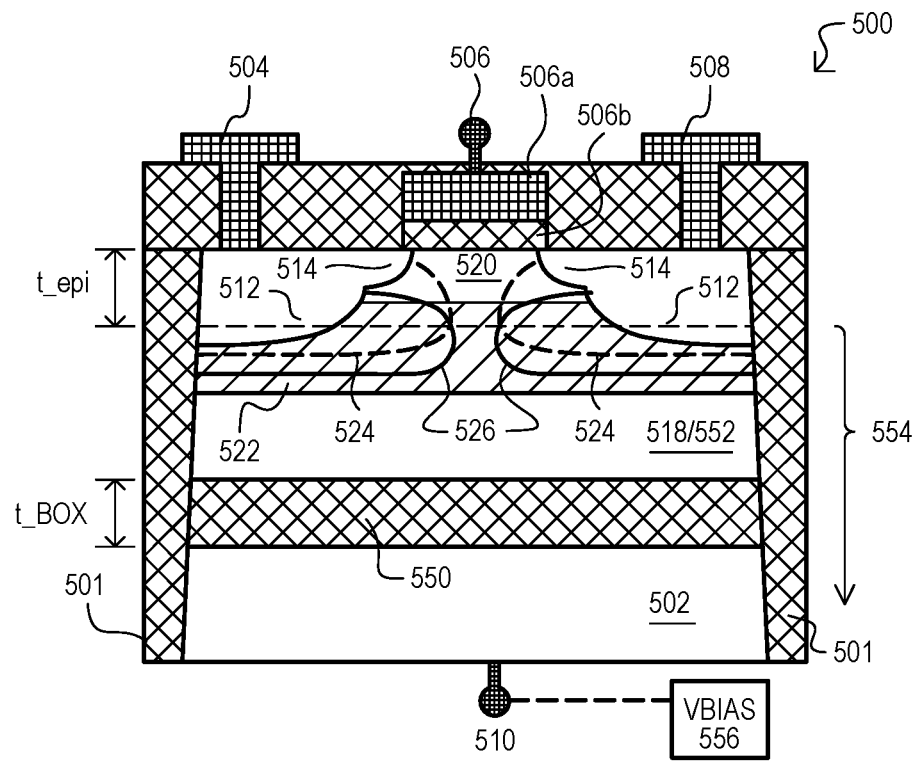
FIGS. 5A and 5B illustrate transistors having multiple halos formed in a semiconductor-on-insulator substrate according to some embodiments.

FIG. 5A illustrates a transistor 500 having multiple halos according to further embodiments. Although FIG. 5A will be initially described as an n-channel device, it is understood that the transistor 500 could be a p-channel device comprising opposite polarity dopants such that the transistor 500 is able to be either an NMOS type transistor or a PMOS type transistor depending on the polarity of the substrate, the well region, the Vth adjust region, the halo regions and/or the source-drain diffusion regions to be formed.

As shown in FIG. 5A, the transistor 500 can be formed on a semiconductor-on-insulator substrate 554, that includes a lower substrate 502 and upper substrate 552 separated by a buried insulator 550. A semiconductor-on-insulator substrate 554 can be any suitable semiconductor-on-insulator substrate for a given transistor design. A thickness of a buried insulator 550 is shown as t_BOX. In very particular embodiments, semiconductor-on-insulator substrate 554 can be a silicon-on-insulator (SOI) type substrate. Semiconductor-on-insulator substrate 554 can be formed with any suitable process, including but not limited to ion implantation, bonding, or seed and growth of semiconductor material on top of buried insulator 550. A buried insulator 550 can insulate upper substrate 552 from lower substrate 550. A buried insulator 550 can be formed of any suitable material, but in very particular embodiments can be a buried oxide (BOX). A buried insulator 550 can have any suitable thickness, but in particular embodiments can be relatively thin, having a thickness in a range of about 1 nm to 100 nm, in particular embodiments about 5 nm.

Transistor 500 can be formed in upper substrate 552 within isolation elements 501, and can include a source 504, a gate 506, a drain 508 and a body 510. The gate 506 includes a gate body 506a coupled to a gate insulator 506b. In some embodiments, a gate body 506a can include polysilicon. Alternatively, the gate body 506a is able to comprise metal, polysilicon, a combination thereof or any other suitable gate materials well known in the art. A gate body 506a can have any suitable thickness, but in very particular embodiments can have a thickness between about 500 Å and 3,000 Å. Alternatively, the gate body 506a is able to have a thickness of about 1,000 Å. The gate body 506a can any suitable length, but in particular embodiments, can have a length between about 6 nm and 10,000 nm. Alternatively, the gate body 506a can have a length between about 14 nm and 60 nm, for example, about 22 nm, 16 nm or 14 nm.

In some embodiments, a gate insulator 506b can be a gate oxide. Alternatively, the gate insulator 506b can be any suitable insulating materials or combinations thereof, including oxides. In some embodiments, the gate insulator 506b can have any suitable thickness, but in particular embodiment can have an effective thickness of between about 10 Å and 100 Å. For example, the gate insulator 506b can have an effective thickness of about 15 or 20 Å.

As shown in FIG. 5A, the substrate 502 comprises one or more deep source-drain regions 512 (DSD), one or more shallow source-drain extensions 514 (SDE), a well 518, a Vth adjust layer 522, one or more shallow halo implants 524 and one or more deep halo implants 526. Such features can be formed in upper substrate 552, above buried insulator 550.

In an n-channel device, DSDs 512 can be n+-type source-drain regions, SDEs can be n+-type source-drain extensions, well 518 can be a p-type well, Vth adjust implant 522 can be a p-type layer, shallow implants 524 can be p-type shallow halo implants 524, and deep implants 526 can be p-type deep halo implants 526. Alternatively, the polarity of the above transistor part can be switched for a p-channel device as described above.

DSDs 512 can extend from a surface of upper substrate 552 down to just above the deep halo implants 526. The impurities used to form the DSDs 512 can vary depending on whether the transistor 500 is to be an n-channel type transistor or a p-channel type transistor as is well known in the art. For an n-channel type transistor, the impurities that form the DSDs 512 can be Arsenic, Phosphorus or other types of impurities as are well known in the art. For a p-channel type transistor, the impurities can be Boron, Boron difluoride ($BF_2$) or other types of impurities well known in the art. A concentration of the impurities that form the DSDs 512, can be any suitable concentration for a desired transistor performance. In very particular embodiments, for an n-channel type transistor, DSD concentration can be in a range from about $1 \times 10^{20}$ atoms/cm$^3$ to $5 \times 10^{20}$ atoms/cm$^3$ (e.g. $3 \times 10^{20}$ atoms/cm$^3$). Alternatively, for a p-channel type transistor, the impurities can be in a range from about $8 \times 10^{19}$ atoms/cm$^3$ to $2 \times 10^{20}$ atoms/cm$^3$ (e.g., $1 \times 10^{20}$ atoms/cm$^3$).

SDEs 514 can be positioned such that at least a portion of the SDEs 514 is underneath the gate 506 using optional mini SDE offset spacers (not shown). Specifically, the SDEs 514 can be positioned within the substrate 502 immediately above the shallow halo implants 524 to further suppress short channel effects such as source/drain leakage currents. Like the DSDs 512, the impurities used to form the SDEs 514 can vary depending on whether the transistor 500 is to be an n-channel type transistor or a p-channel type transistor as is well known in the art. For an n-channel type transistor, the impurities that form the SDEs 514 can be Arsenic, Phosphorus or other types of impurities as are well known in the art. The concentration of the impurities for SDEs 514 of an n-channel type transistor can be any suitable concentration, but in particular embodiments, can be in the range of about $1 \times 10^{20}$ atoms/cm$^3$ to $5 \times 10^{20}$ atoms/cm$^3$ (e.g., $3 \times 10^{20}$ atoms/cm$^3$). Alternatively, for a p-channel type transistor, the impurities that form the SDEs 514 can be Boron, Boron difluoride or other types of impurities well known in the art. The concentration of the impurities for SDEs 514 of a p-channel type transistor can be any suitable concentration, but in particular embodiments can be in a range of about $8 \times 10^{19}$ atoms/cm$^3$ to $2 \times 10^{20}$ atoms/cm$^3$ (e.g., $1 \times 10^{20}$ atoms/cm$^3$).

DSDs 512 and/or the SDEs 514 can define the transistor 500 structure such that when gate 506 is turned ON, an inversion layer can be formed and current will flow from one DSD 512 and/or SDE 514 to another DSD 512 and/or SDE 514 with reduced resistance. Additionally, it is again noted that the polarity of the DSDs 512 and the SDEs 514 is opposite to the channel region. In particular, this is pointed out to contrast the polarity of the halo implants 524, 526 described below, which is the same as the channel region.

The shallow halo implants 524 can be positioned such that they at least partially extend below the SDEs 514, DSDs 512 and/or the gate 506. The deep halo implants 526 can be positioned such that they at least partially extend below the SDEs 514, DSDs 512 and/or the gate 506, as well as extending at least partially below the shallow halo implants 524. As a result, the shallow and/or deep halo implants 524, 526 can assist in suppressing the leakage currents that are a result of the short channel effect (SCE). In particular, the SCE can render a transistor non-functional if too much leakage current is present. The use and positioning of the shallow and/or deep halo implants 524, 526 within the transistor 500 at a depth that is apart from the surface of the substrate 502 avoids creating high level concentrations (of the same polarity as the channel region) just below the gate 506 in the substrate channel region, which leads to increased Vth and channel resistance.

The impurities used to form the shallow halo implants 524 can vary depending on whether the transistor 500 is an n-channel type transistor or a p-channel type transistor. Specifically, the shallow halo implants 524 comprise impurity types of the same polarity as the channel polarity. For example, for an n-channel type transistor, the halo implants 524 will be P-type impurities. In some embodiments, the impurities of the shallow halo implants 524 can be selected to have a low diffusion coefficient for a given substrate material. In particular embodiments, such low diffusion coefficients impurities can include indium, boron, phosphorus, arsenic, antimony, or other types of impurities with low diffusion coefficients. Alternatively, other types of impurities having low or higher diffusion coefficients can be used. In some embodiments, the impurities can be implanted within upper substrate 552 at a peak concentration ranging from about $1 \times 10^{18}$ atoms/cm$^3$ to $1 \times 10^{19}$ atoms/cm$^3$ (e.g., about $5 \times 10^{18}$ atoms/cm$^3$). However, it should be noted that the concentration of the impurities implanted can differ from the actual concentration of the impurities in the shallow halo implants 524 due to losses and the diffusion process, as the impurities enter the upper substrate 552. As a result, an actual concentration can be lower than the peak concentration. For example, for the above noted range, an actual concentration can be about $1 \times 10^{18}$ atoms/cm$^3$ to $6 \times 10^{18}$ atoms/cm$^3$ (e.g., about $3 \times 10^{18}$ atoms/cm$^3$).

The impurities used to form the deep halo implants 526 can vary depending on whether the transistor 500 is an n-channel type transistor or a p-channel type transistor. In particular, similar to the shallow halo implants 524, the deep halo implants 526 can include impurity types of the same polarity as the channel polarity. For example, for a p-channel type transistor, the deep halo implants 526 will be N-type impurities. In some embodiments, the impurities of the deep halo implants 526 can have low diffusion coefficients such as indium, boron, phosphorus, arsenic, antimony or other types of impurities with low diffusion coefficients. Alternatively, other types of impurities having low or higher diffusion coefficients can be used. In some embodiments, the concentration ranges of the impurities implanted to form the deep halo implants 526 can be slightly lower than those of the shallow halo implants 524. While deep halo implants 526 can have any suitable impurity concentration, on some embodiments, such concentrations can range between about $1 \times 10^{18}$ atoms/cm$^3$ and $5 \times 10^{18}$ atoms/cm$^3$ (e.g., about $2.5 \times 10^{18}$ atoms/cm$^3$). According to some embodiments, a peak concentration of deep halo implants 526 can be positioned just below the DSD junctions described above. As a result, the deep halo implants 526 can further reduce the leakage from the deeper channel region where the gate bias cannot control the potential.

In this way, shallow and deep halo implants 524, 526 can provide a peak concentration of substrate impurities at a level below the gate 506, such that the resistance of the transistor 500 is able to be minimized along with the threshold voltage, threshold voltage fluctuations, short channel effects, and leakage current in the transistor 500. Additionally, it is noted that shallow and/or deep halo implants 524, 526 can have a low concentration of impurities at the top and bottom of the implants 524, 526 and a peak concentration region in the middle of the implants 524, 526.

In some embodiments, an upper substrate 552 can include a Vth adjust layer 522 formed below the transistor 500 channel which is able to adjust the threshold voltage of the transistor 500. In some embodiments, a Vth adjust layer 522 can be formed with P-type impurities for an n-channel device, and N-type impurities for a p-channel device.

Referring still to FIG. 5A, an undoped epitaxial layer 520 (EPI) can be can formed on top of an upper substrate 552 in order to form the channel region. In particular, the epitaxial layer 520 can be deposited on top of an upper substrate 552 after the upper substrate 552 has been doped to form wells 518, deep and shallow halo implants 524, 526, and optionally, Vth adjust layer 522. Accordingly, wells 518, any Vth adjust layer 522, and halos 524, 526 are buried under the epitaxial layer 520, which is then covered in the channel region by the gate 506 during formation of DSDs 512 and SDEs 514. As a result, the epitaxial layer 520 can remain un-doped or only lightly doped (due to up-diffusion of dopants from the halos and Vth adjust implant within the substrate 552) especially, below the gate 506 in the channel region. Epitaxial layer 520 thereby provides the benefit of reducing the process variability of the transistor 500 particularly in the channel region.

According to some embodiments, a body 510 can be subject to varying bias voltages, to thereby control the operation of the transistor 500. Accordingly, a body 510 can be coupled to a bias voltage source 556 to provide the bias voltage. In some embodiments, a bias can be an increased "back" bias to provide a strong "off" condition, while in other embodiments, a bias can be less for increased transistor speed. Of course, various other advantages can be attained with variable body bias, as one skilled in the art would recognize.

It is understood that having a relatively thin buried insulator 550 can enable greater double-gate effect. Accordingly, as noted above, a thickness (t_BOX) of a buried insulator 150 can be less than 150 nm, in some embodiments less than 50 nm, in other embodiments less than 10 nm, and in very particular embodiments about 5 nm.

Figure 5B:
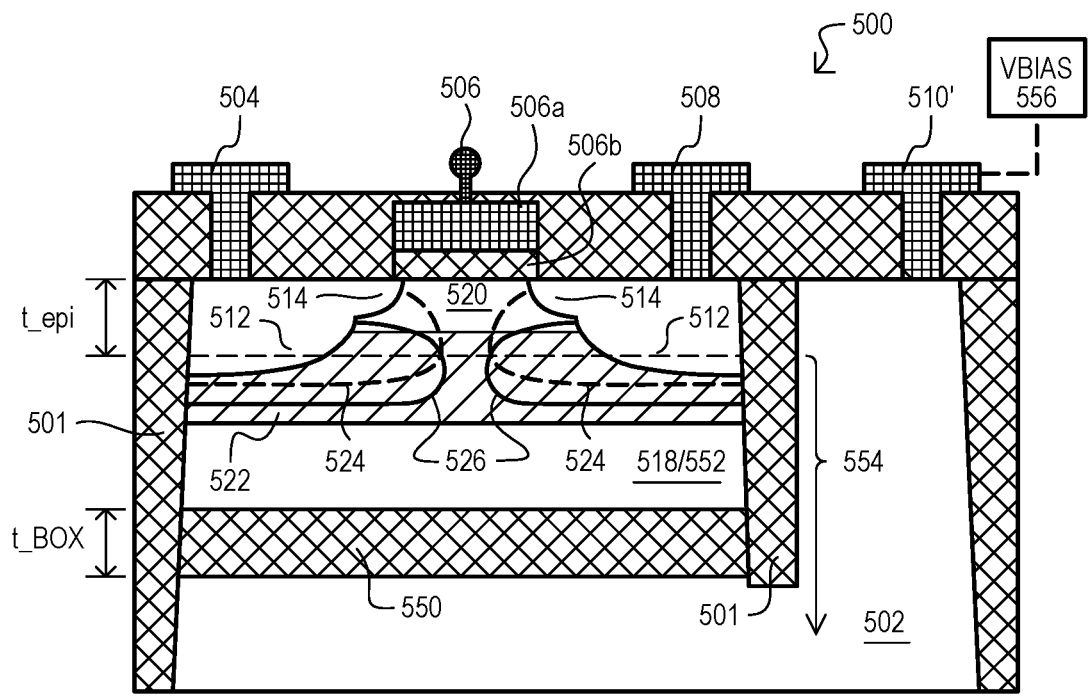

FIG. 5B illustrates one very particular body biasing arrangement for a transistor 500 like that of FIG. 5A. In the embodiment shown, a body bias tap 510' can be created to lower substrate 502. A body bias voltage can be applied via body tap 502 to provide a particular bias voltage for transistor 502 and/or to vary a body bias voltage so that buried insulator 550 acts as a second gate, and transistor 500 can be operated in a double-gate mode.

It is understood that complementary channel transistors like those shown in FIG. 5A or 5B can be formed in a same integrated circuit device by providing different isolated upper substrate 552 regions, some of which can include n-channel transistors others of which can include p-channel transistors. Such different conductivity transistors can be separated at the upper substrate 552 level, with isolation structures that extend through epitaxial layer 520 and upper substrate 552 to at least buried insulator 550. In addition or alternatively, such different conductivity transistors can be separated with isolation structures that extend through epitaxial layer 520, upper substrate 552, buried insulator 550, and into lower substrate 502. Such an arrangement can enable different body biases to be applied to transistors of different conductivity types.

Figure 6A:
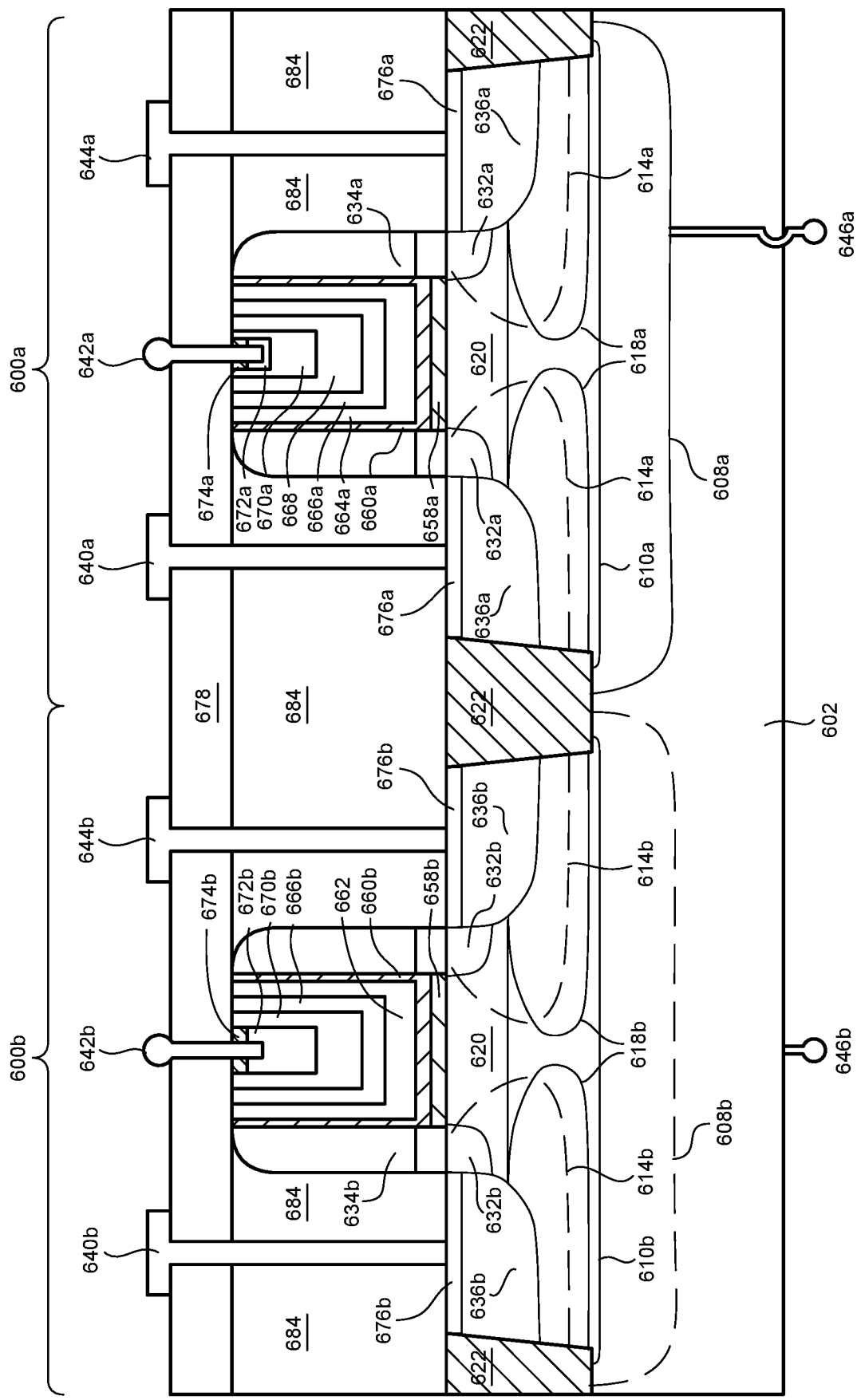
FIGS. 6A to 6O illustrate a method of fabricating transistors with multiple halo implants and metal gate structures according to embodiments.

While embodiments can include transistors with gates according to any suitable structure, increased performance can be achieved with high gate dielectric constant (high-k gate dielectric) and metal gate structures. Accordingly, embodiments anticipate transistors with multiple halo implants as described herein and equivalents, that include metal gate structures. FIGS. 6A to 6O are side cross-sectional views of an embodiment that includes high-k gate dielectric and metal gates.

FIG. 6A is a diagram showing transistors 600a/b having multiple halos and metal-type gates according to an embodiment. Transistors 600a/b can include structures as described in other embodiments, including an n-well 608a, a p-well 608b, an n-type Vt adjust layer 610a, a p-type Vt adjust layer 610b, n-type first halos 614a, p-type first halos 614b, n-type second halos 618a, p-type second halos 618b, low or undoped epitaxial regions 620, shallow trench isolation 622, p+ source-drain extensions 632a, n+ source-drain extensions 632b, p+ deep source drains 636a, n+ deep source drains 636b, source terminals 640a/b, gate terminals 642a/b, drain terminals 644a/b and body terminals 646a/b. A passivation layer 684 can be formed over a substrate 602 and between gate structures. Gate and spacer size have been adjusted to better describe the metal gate formation process.

Unlike other embodiments, transistors 600a/b show a metal gate structure that can include a bottom interface layer (BIL) 658a/b and high dielectric constant (K) gate oxide 660a/b which can serve as a gate dielectric. A gate structure of PFET transistor 600a can include a metal gate over the gate dielectric having a first gate metal 664a, which can be a PFET work function metal, a second gate metal 666a, a third gate metal 668, a fourth gate metal 670a, a conductive fill 672a and an electrode fill 674a. A gate structure of NFET transistor 600b can include a metal gate over the gate dielectric having a NFET work function metal 662, a second gate metal 666b, a third gate metal 670b, a conductive fill 672b and an electrode fill 674b. A pre-metal dielectric 678 can be formed over the transistors 600a/b.

An embodiment like that of FIG. 6A can be fabricated with steps noted for FIGS. 3A to 3R described above. Following the formation of dummy gate structures, embodiments can continue as shown in FIGS. 6B to 6O.

Figure 6B:
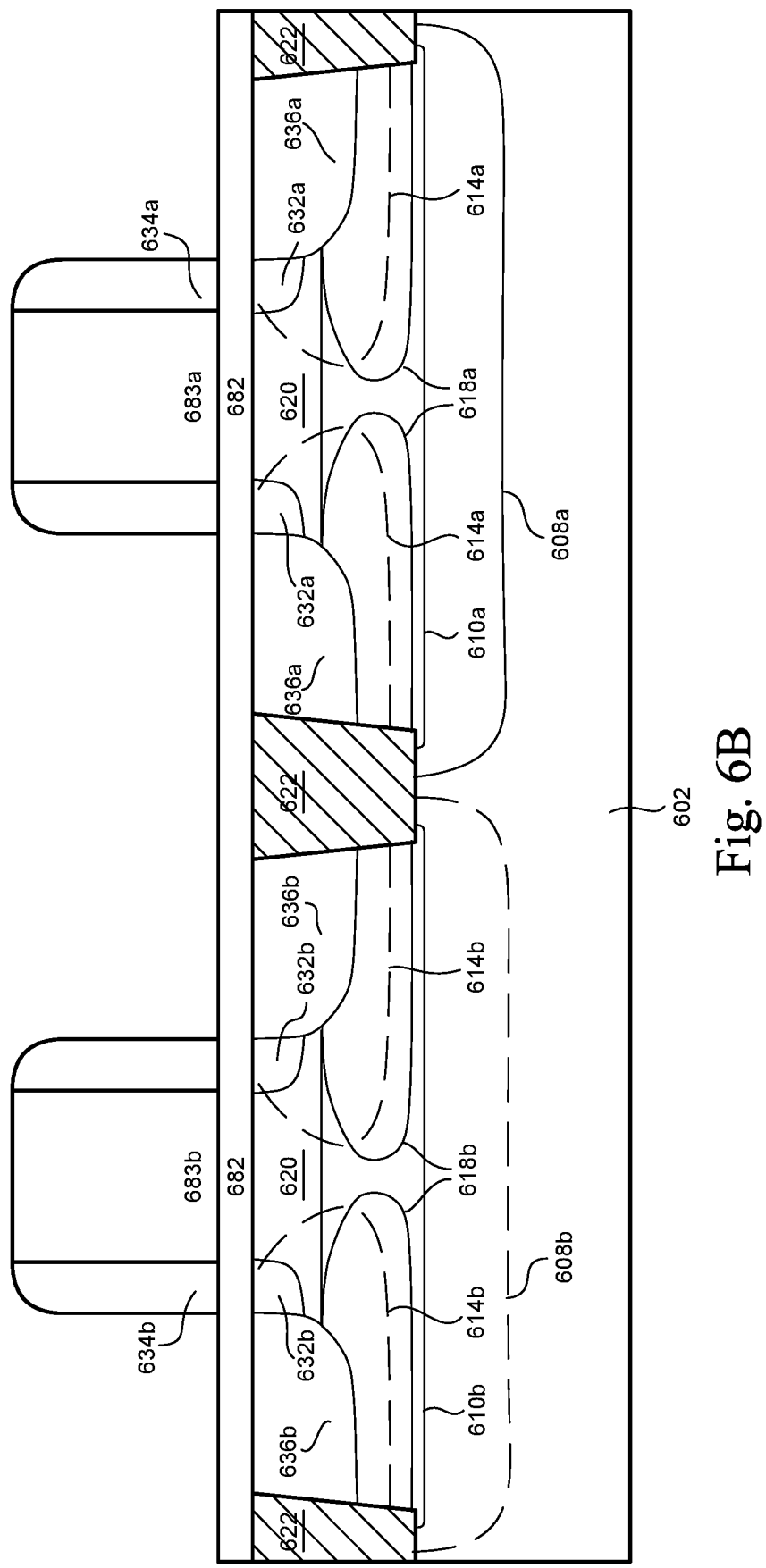

FIG. 6B shows dummy polysilicon gates 683a/b with spacers 634a/b formed over dummy gate oxide 682. Following deep source-drain implants, a source-drain anneal can take place. Photo resist from implant steps can be removed and the surface can be cleaned. A source-drain anneal can include an RTA at a temperature in the range of 850-950° C. for 10-15 seconds, or alternatively a laser/pulse anneal.

Figure 6C:
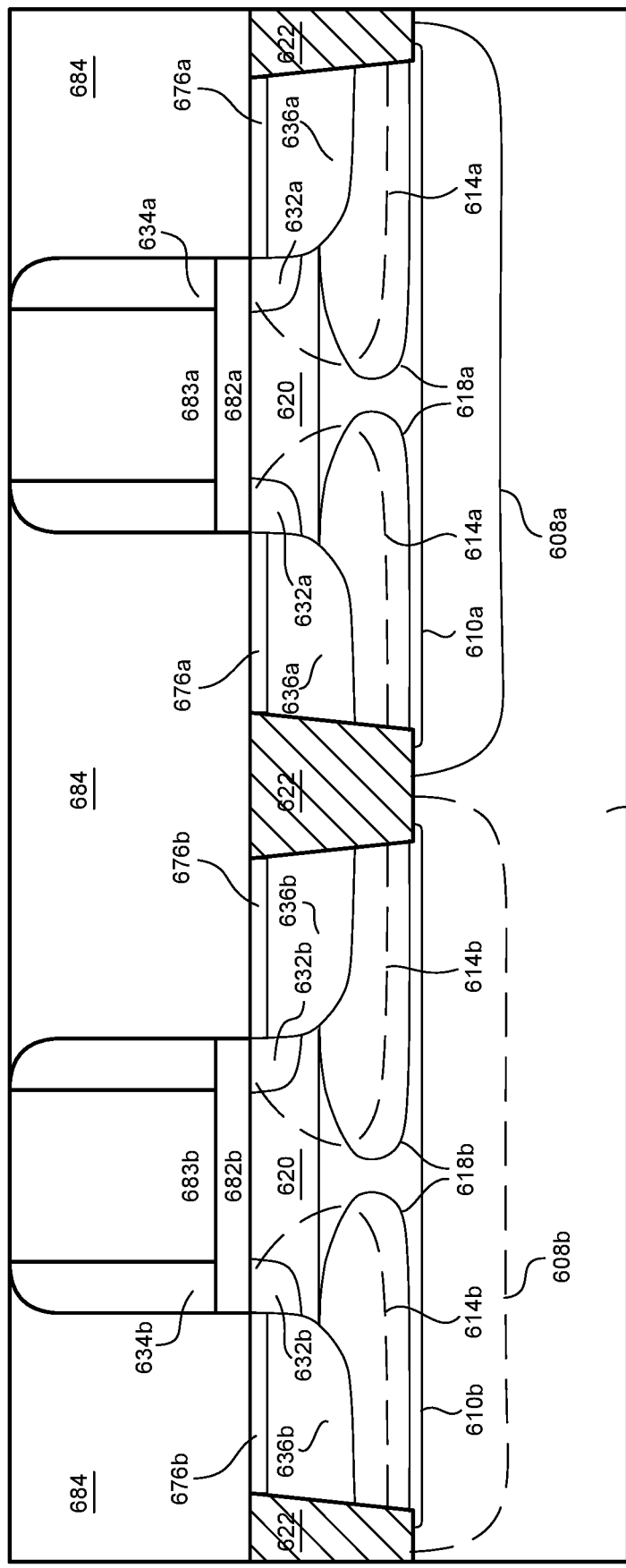

FIG. 6C shows a device after a source-drain contact silicidation step. Source-drain contact regions can include contact silicides 676a/b. In some embodiments, this can include forming a contact mask by developing photo resist to expose source/drain contact regions. A silicide can be formed at such regions. In some embodiments, a titanium silicide (TiSi$_2$) can be formed. However, any suitable silicide can be formed, including but not limited to a nickel silicide. After formation of source-drain silicides, the resist can be removed (e.g., etched). in addition any residual oxide can be etched. A passivation dielectric 684 can then be deposited. A passivation dielectric 684 can be considered surface dielectric layer. A passivation dielectric 684 can take any suitable form, and in some embodiments can be a phospho-silicate glass (PSG) having a thickness in the range of 100-200 nm, or about 150 nm in some embodiments. The passivation dielectric 684 can then be planarized using chemical mechanical polishing (CMP), for example, to the top of the dummy polysilicon gate 683a/b to expose the polysilicon surface.

Figure 6D:
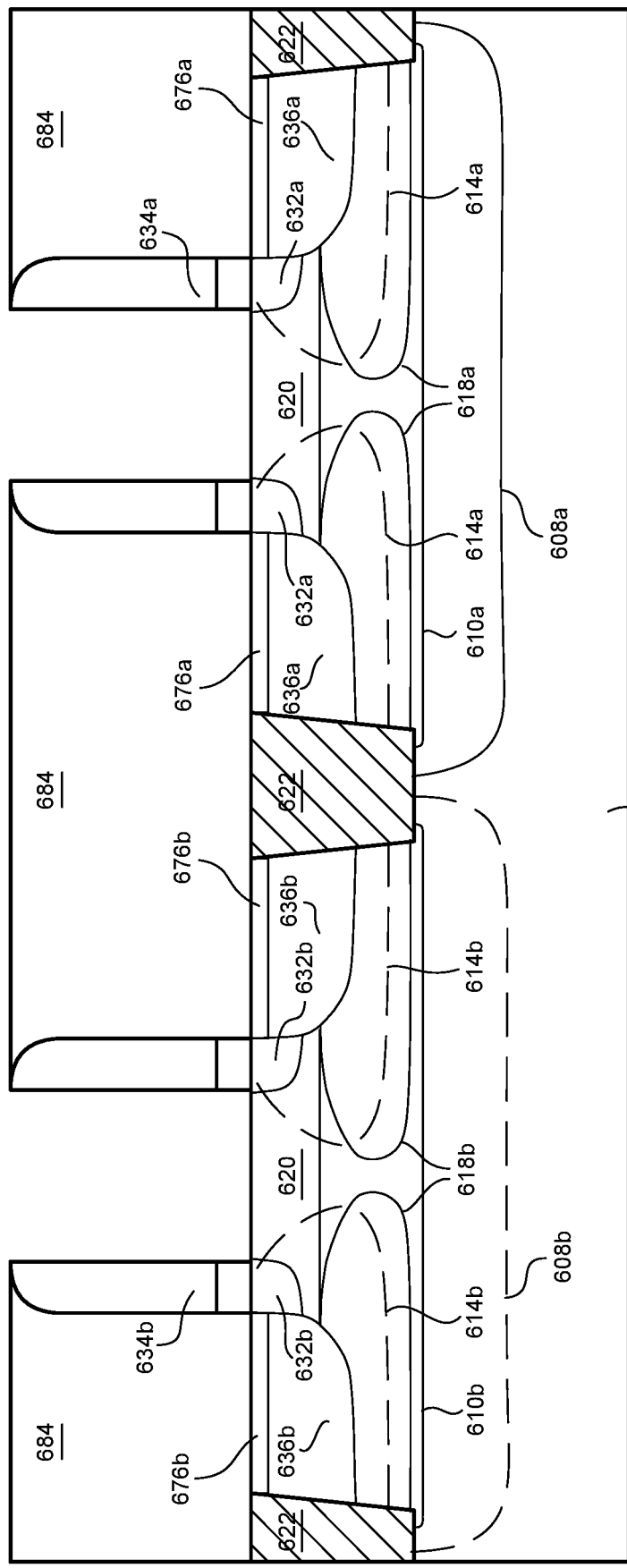

FIG. 6D shows a device following the start of a replacement metal gate processing. Dummy polysilicon can be selectively etched to create gate openings. A gate oxide below removed dummy gates can also be removed by selective etching, for example. An exposed surface can then be cleaned to prepare it for subsequent processing steps, including the formation of a gate dielectric and corresponding metal gate.

Figure 6E:
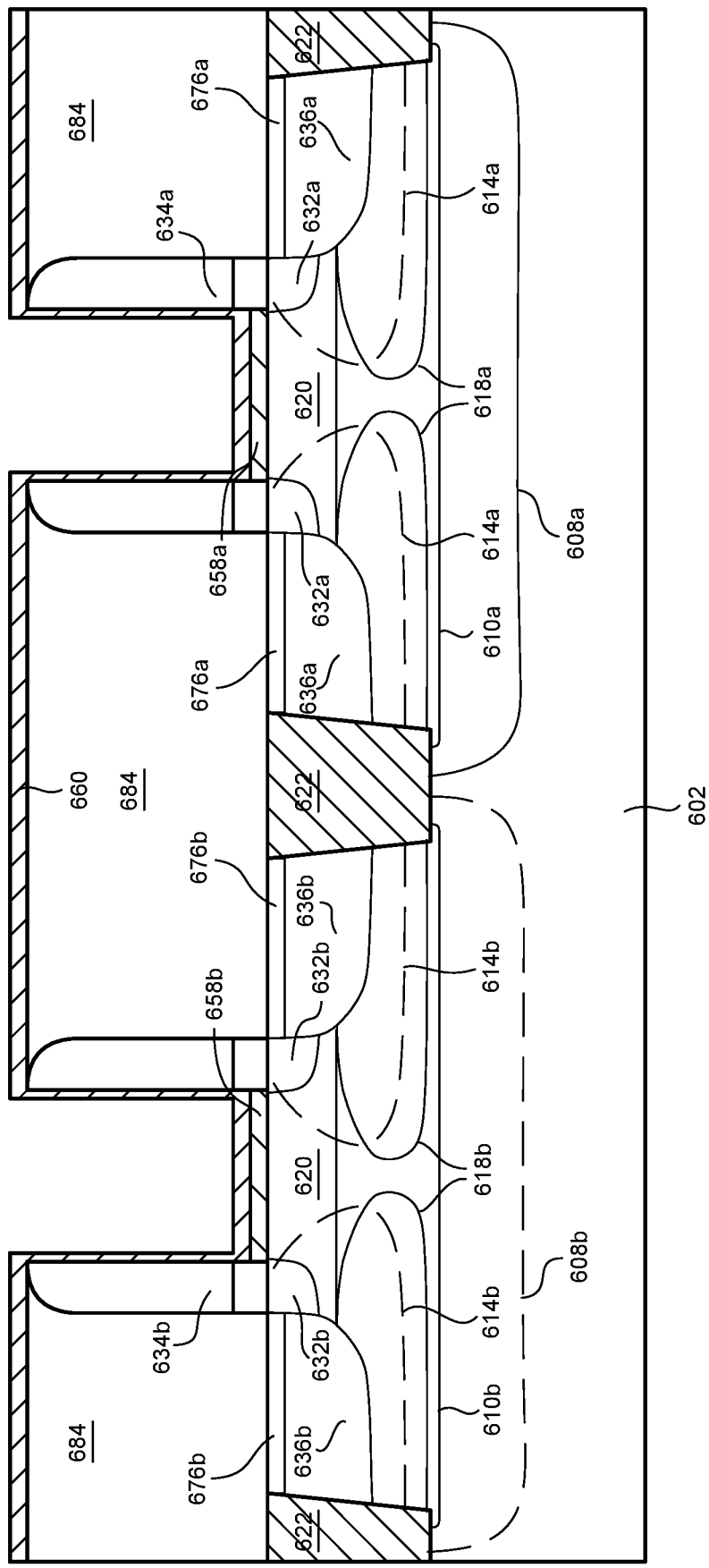

FIG. 6E shows a device following the formation of gate dielectric layers. A BIL 658a/b can be formed for each gate. In some embodiments such a layer can be a SiO$_2$ grown thermally at a temperature in the range of 850-950° C. to a thickness in the range of 0.6 to 2 nm, in some embodiments about 1 nm. A high-K dielectric layer 660 can then be deposited into the openings formed by dummy gate removal, and over the BIL 658a/b. In some embodiments, a high-K dielectric layer can be hafnium oxide HfO$_2$. An HfO$_2$ layer can be formed with atomic layer deposition (ALD) techniques to a thickness in the range of 0.6 to 5 nm, in some embodiments about 1.2 nm. While HfO$_2$ has been described as a high-K dielectric, any other suitable material or combinations of materials providing a K value greater than that of SiO$_2$ can be used.

Figure 6F:
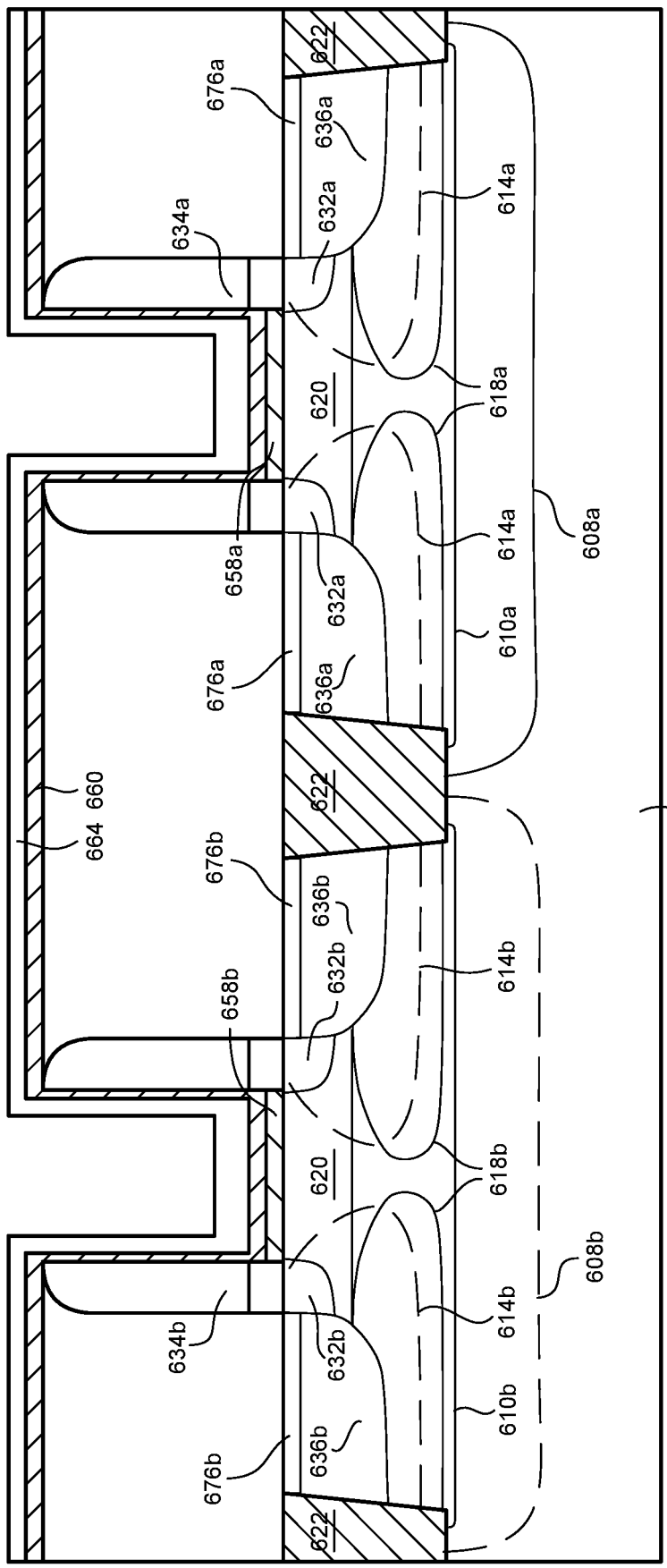

FIG. 6F shows a device following the deposition of a first gate metal layer 664, which can be a PFET gate work function material. A PFET gate work function material can enable a PFET transistor to drive its channel more efficiently (e.g., achieve a lower Vt). In some embodiments, a first gate metal layer 664 can be titanium nitride (TiN). In some embodiments, a TiN layer can be deposited with ALD techniques over the high-K dielectric layer 660 to thickness in the range of 0.6 to 2 nm, in some embodiments about 1 nm.

Figure 6G:
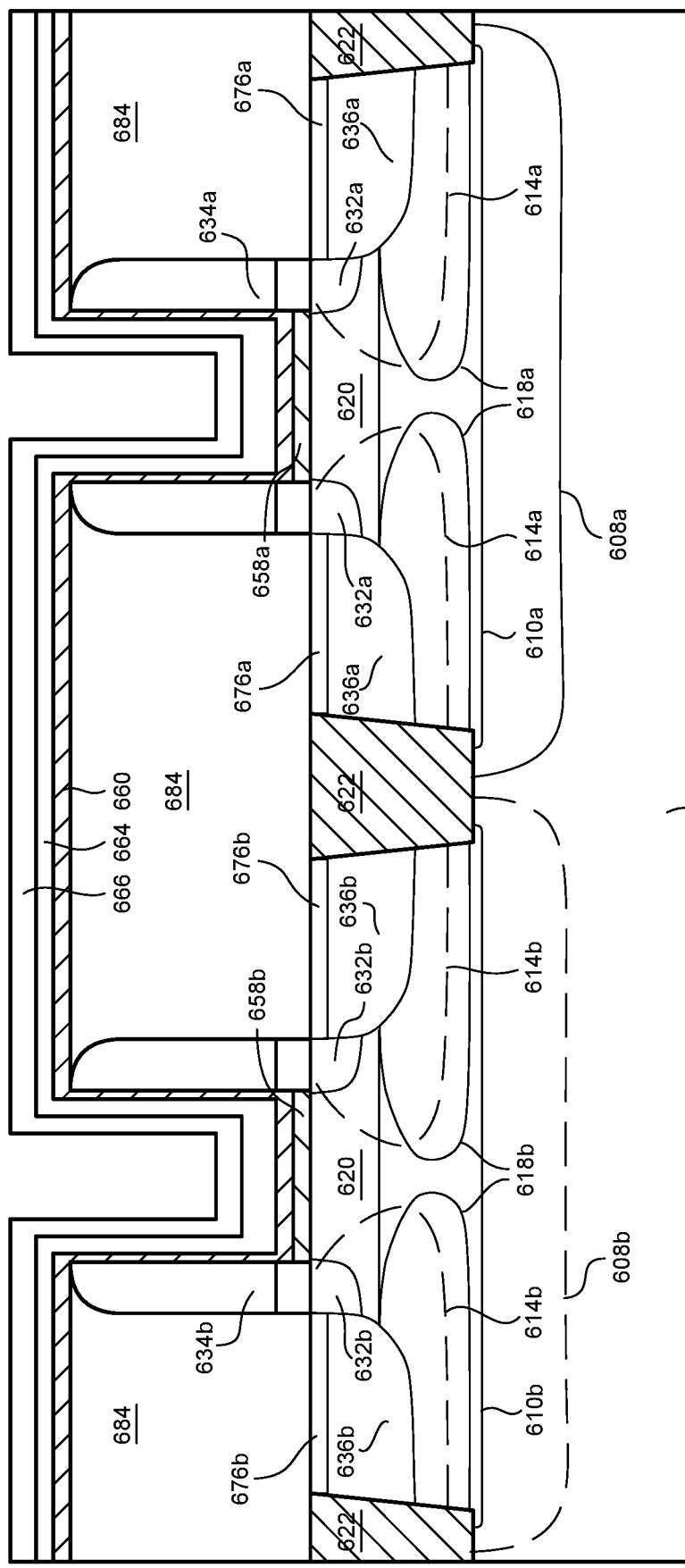

FIG. 6G shows a device following the deposition of a second metal gate layer 666, which can also serve as an etch stop layer. In some embodiments, a second metal gate layer 666 can be tantalum nitride TaN. In some embodiments, a TaN layer can be deposited with ALD techniques over first gate metal layer 664 to thickness in the range of 0.6 to 2 nm, in some embodiments about 1 nm.

Figure 6H:
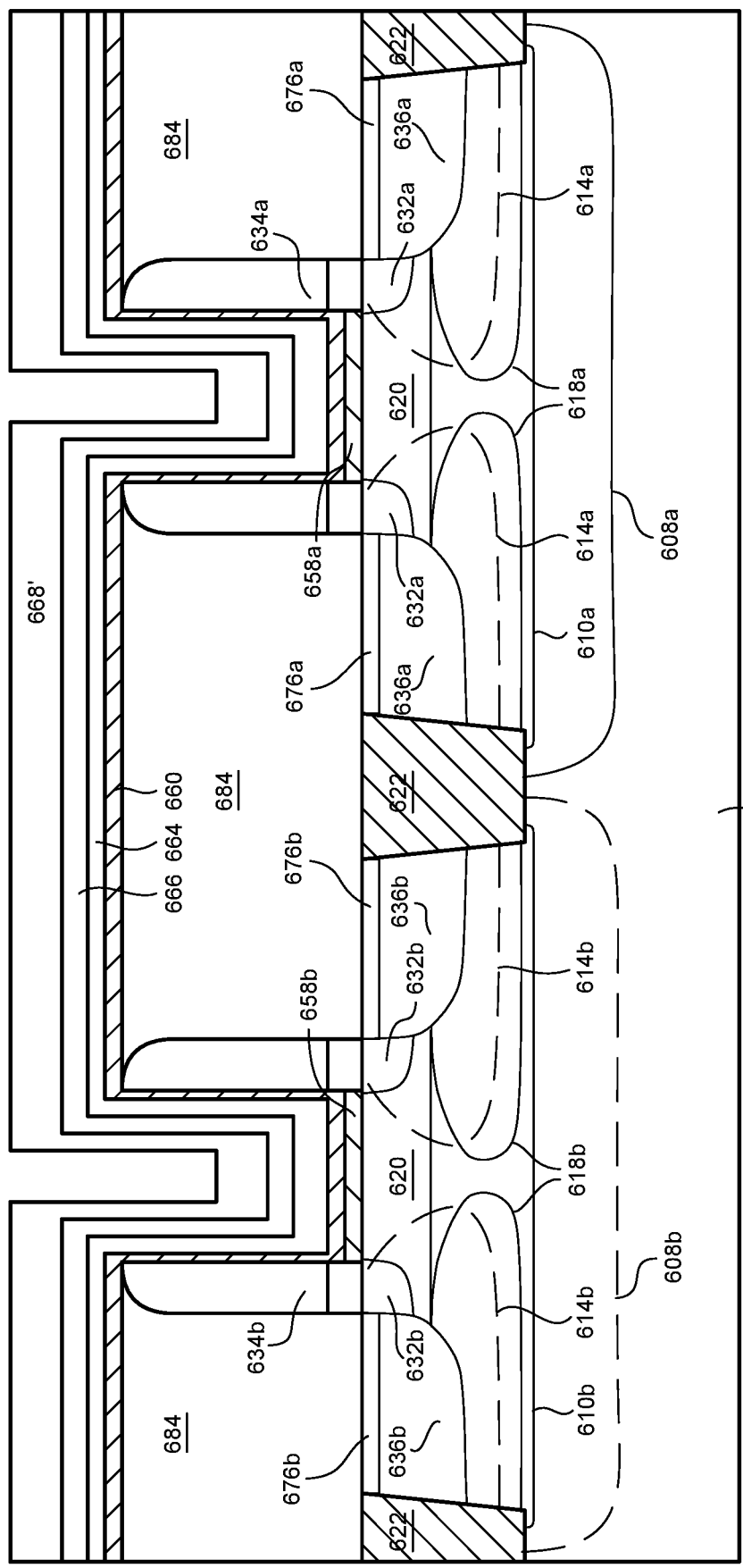

FIG. 6H shows a device following the deposition of a third gate metal layer 668', which can be a PFET gate work function material. In addition, a third gate material 668' can serve as a diffusion barrier for a subsequent layer used to form a NFET work function material. In some embodiments, a third gate metal layer 668' can be TiN. In some embodiments, a TiN layer can be deposited with ALD techniques over the second metal gate layer 666 to thickness in the range of 3 to 8 nm, in some embodiments about 5 nm.

Figure 6I:
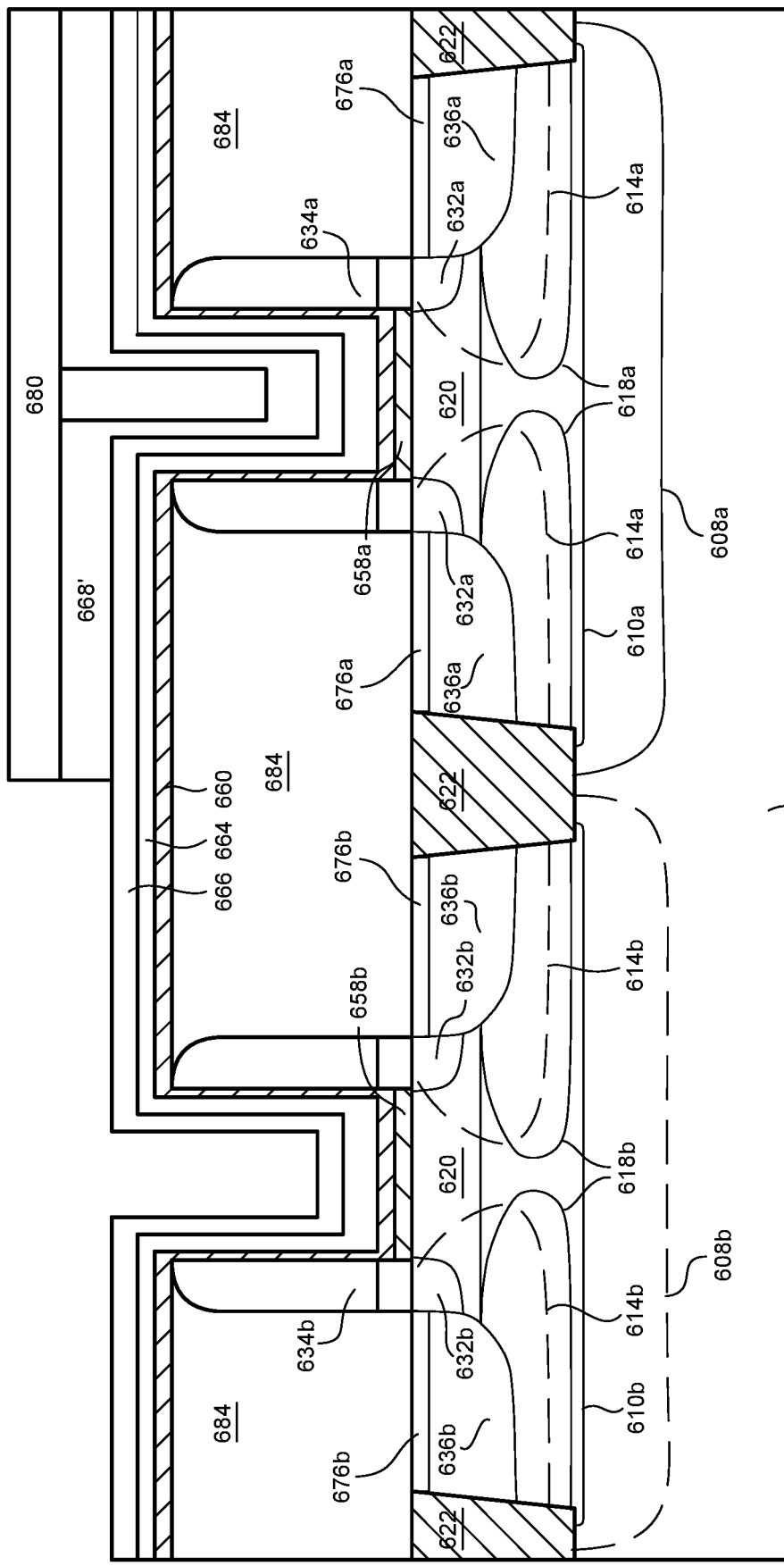

FIG. 6I shows a device following the formation of a work function mask 680. A work function mask 680 can protect a PFET transistor while exposing an NFET transistor, to enable a NFET work function gate metal to be formed. A mask 680 can be formed with photoresist and have a thickness in the range of 50-500 nm, in some embodiments 100 nm. A mask 680 can expose a third gate metal layer 668' above NFET regions. Such a third gate metal 668' can be etched away to expose the second (barrier) gate metal layer 666 over NFET regions.

Figure 6J:
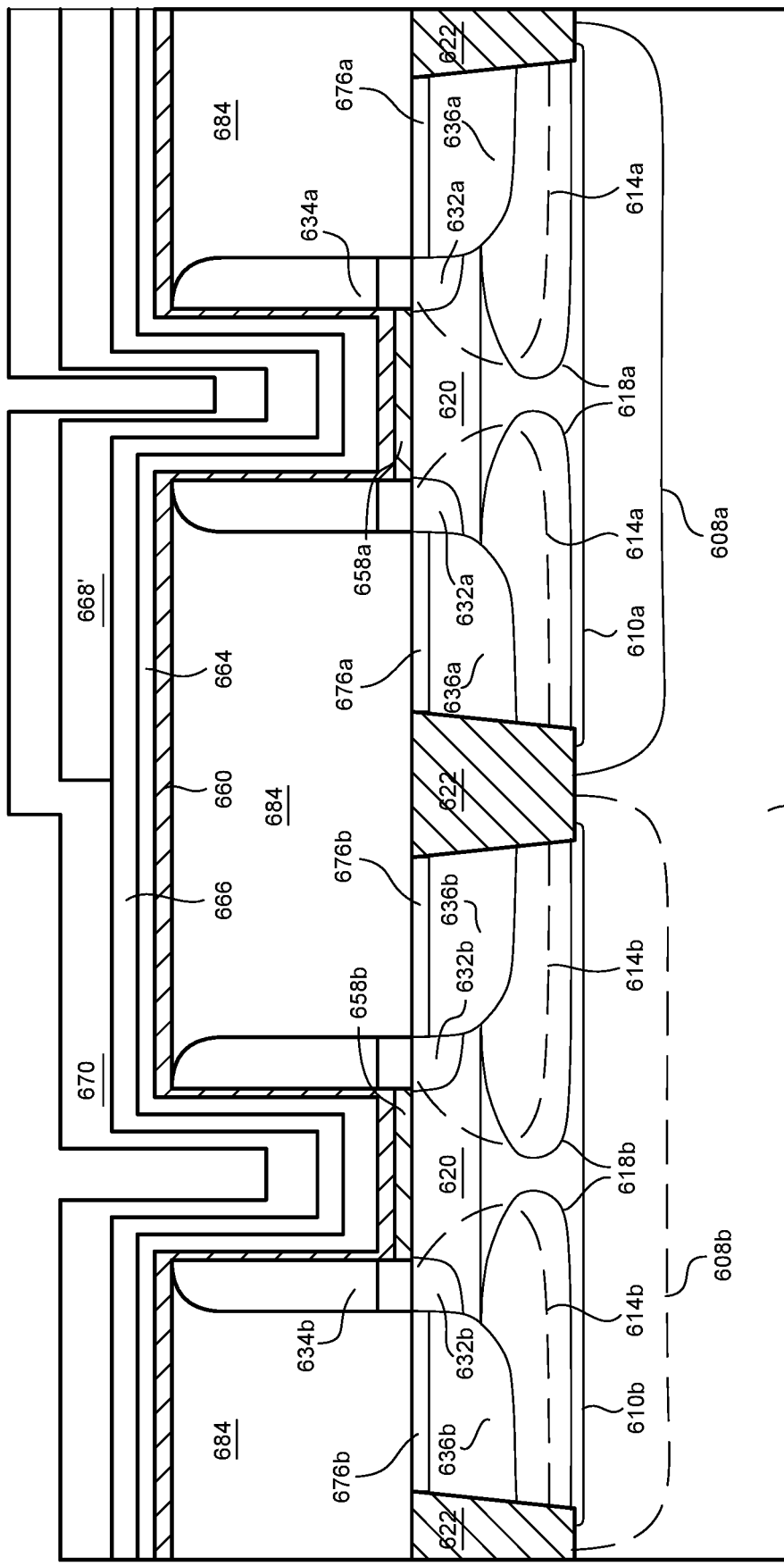

FIG. 6J shows a device following the formation of a fourth gate metal layer 670. A fourth gate metal 670 can be deposited over a second (etch barrier) gate metal 666 in NFET regions, and over a third (diffusion barrier) gate metal 668' in PFET regions. Subsequently, one or more elements in a fourth gate metal can be caused to out-diffuse through second gate metal 666 in NFET regions to form a NFET work function gate metal. In some embodiments, a fourth metal gate layer 670 can be titanium aluminum (TiAl). In some embodiments, a TiAl layer can be deposited with chemical vapor deposition (CVD) techniques to thickness in the range of 3 to 6 nm, in some embodiments about 5 nm.

Figure 6K:
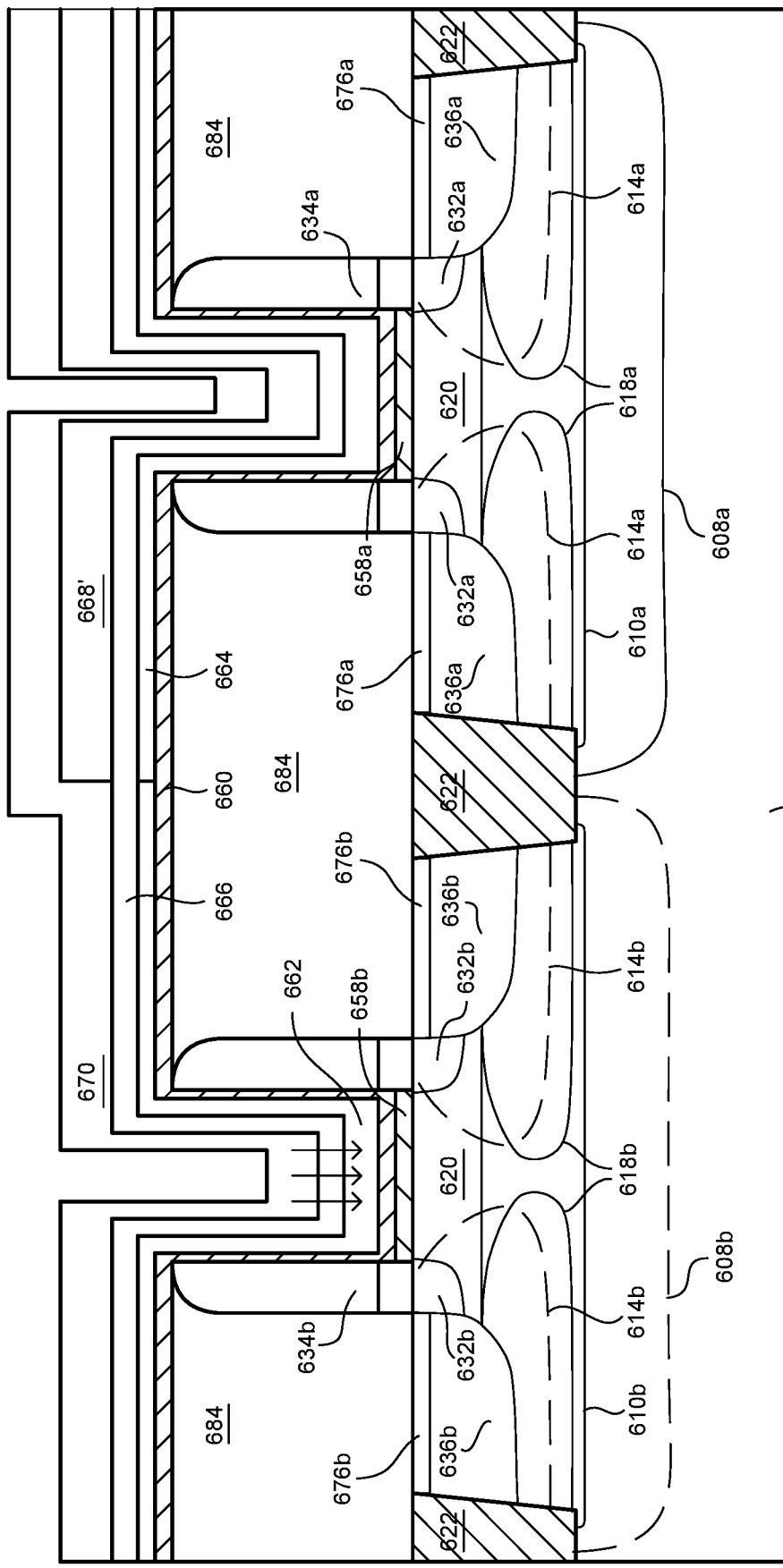

FIG. 6K shows a device following the formation of an NFET work function gate metal 662. A device can be subject to a heat treatment which causes the first gate layer metal to turn into a NFET work function gate metal 662. In embodiments, a low temperature anneal can cause Al to diffuse through second gate metal 666 (e.g., TaN) and into the first layer metal (e.g., TiN) resulting in the formation of TiAlN, which can serve as an NFET work function metal. On the PFET side, third gate metal 668' (e.g., TiN) can serve as a diffusion barrier to Al, preventing it from diffusing into the PFET work function metal (e.g., TiN). In one embodiment, a low temperature anneal can be in the range of 300 to 400° C., in some embodiments about 350° C.

Figure 6L:
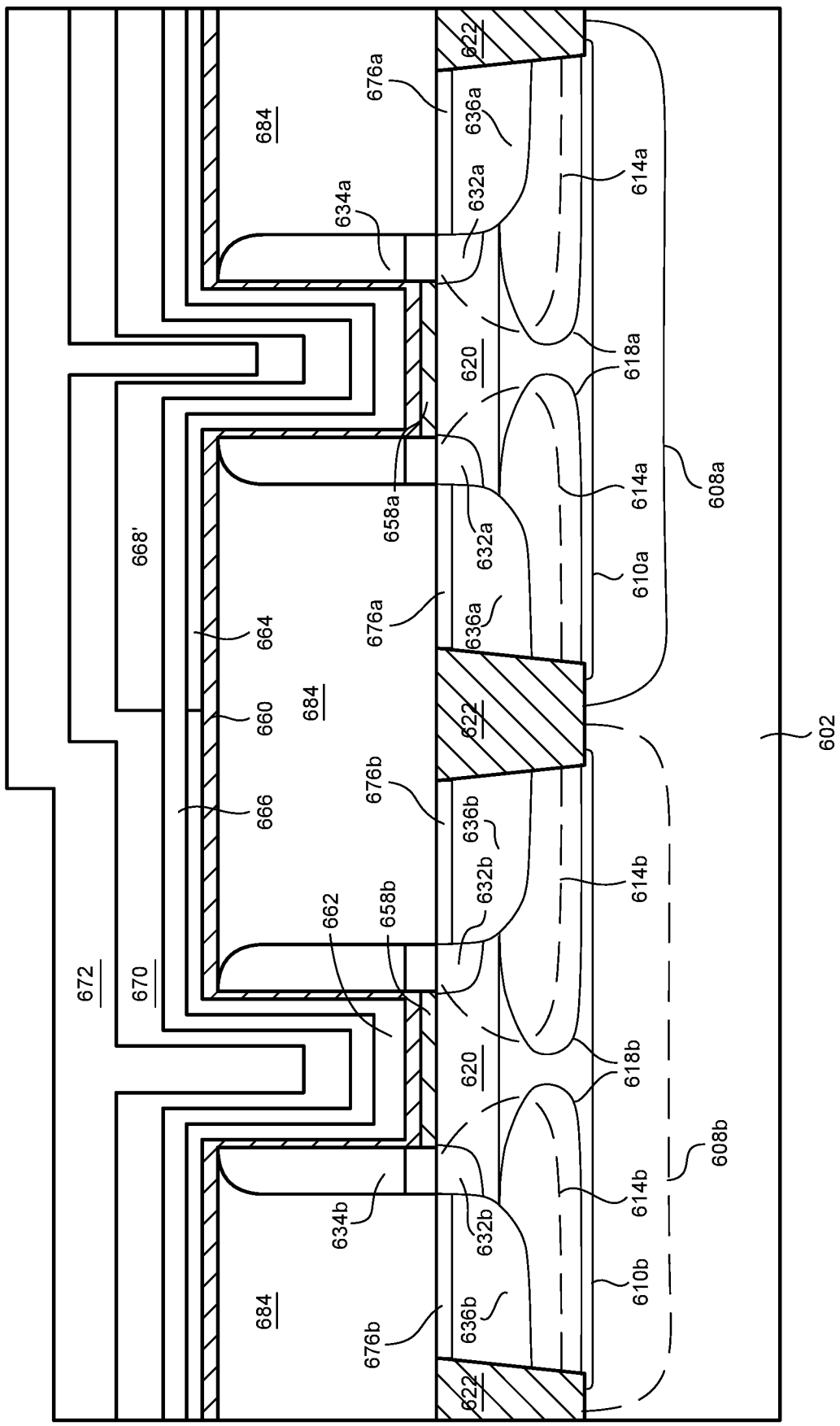

FIG. 6L shows a device following the formation of a conductive fill layer 672. A conductive fill layer can fill in open portions of a gate structure with a material of relatively high conductivity. In some embodiments, a conductive fill layer can be tungsten (W) and can be deposited with CVD techniques to a thickness of about 1000 nm. It is understood such a layer can fill any cavities within the gate structure.

Figure 6M:
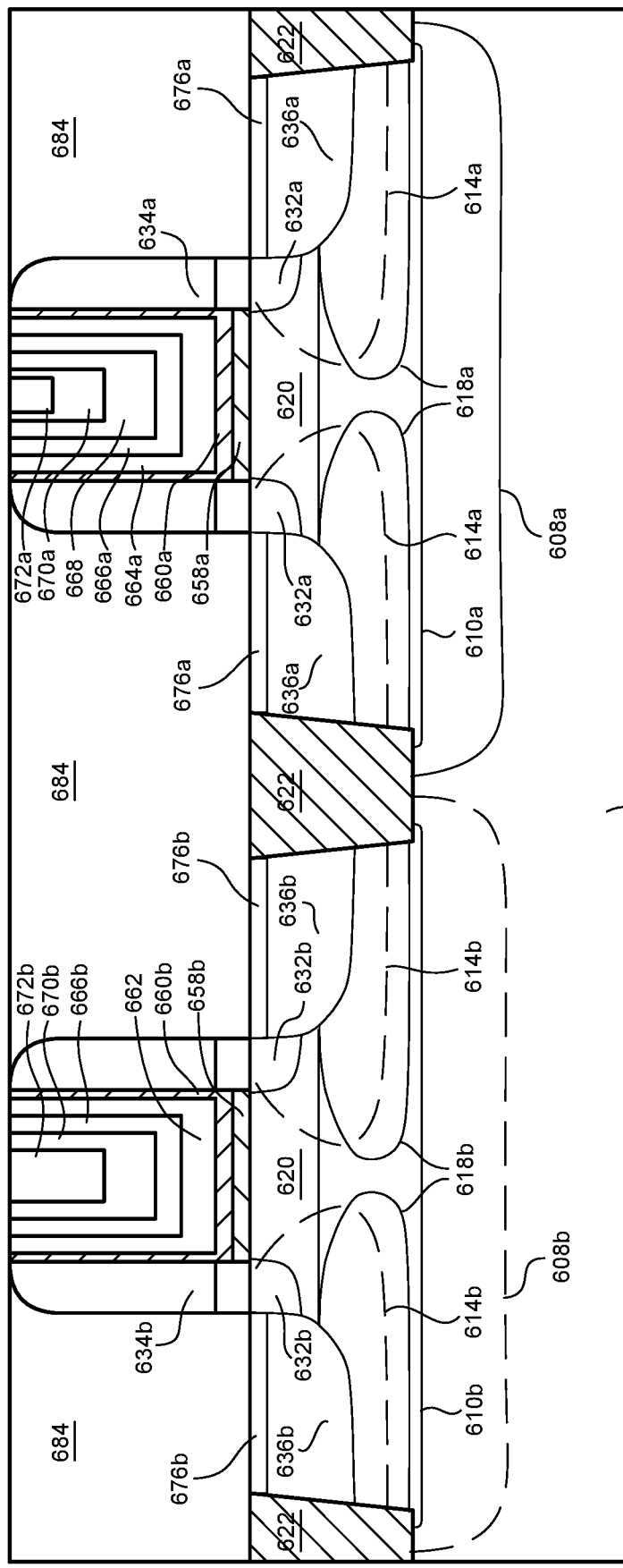

FIG. 6M shows a device following a planarization step to make a fill layer coplanar with the tops of the gate electrodes. In some embodiments this can include a CMP step. The resulting gate structures can include those features described in FIG. 6A. Such a planarization step can remove all other overlying gate metal layers.

Figure 6N:
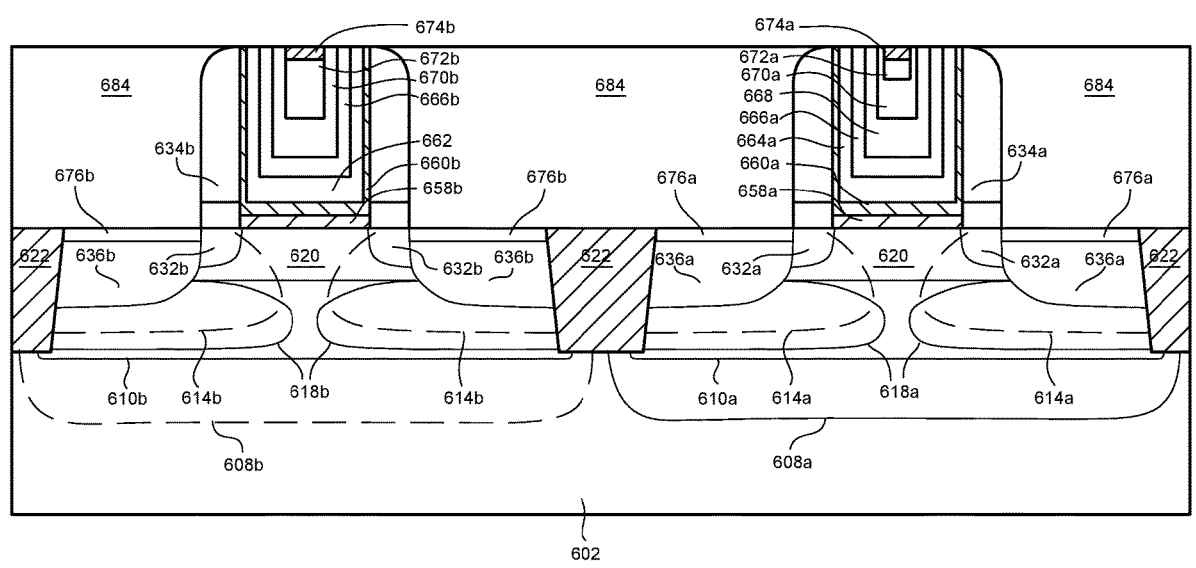
Figure 6O:
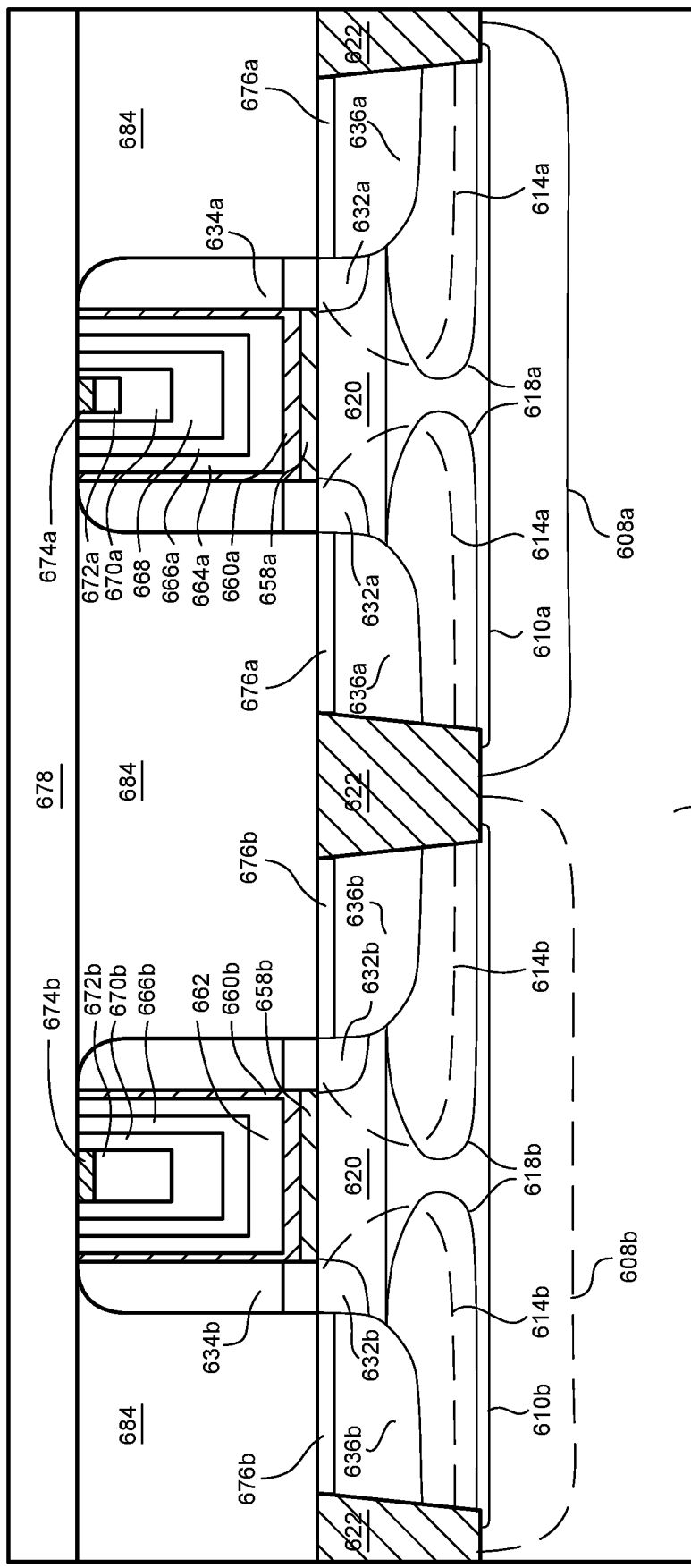

FIG. 6N shows a device following a back fill step that can be included to fill recesses that can form when a conductive fill layer is planarized. A fill layer can be deposited over a surface and then planarized. In some embodiments a fill layer can be relatively silicon oxynitride (SiON) layer of about 4000 nm. CMP techniques can then be used. This can result in electrode fill structures 674a/b.

FIG. 6O shows a device following the formation of a pre-metal dielectric (PMD) over the gate structures. In some embodiments a PMD can be a layer of PSG deposited to a thickness in the range of 50-150 nm, in some embodiments 100 nm. Subsequently, a contact mask can be formed, contacts openings can be etched to sources, drains, gates and body connections. Contacts can then be formed in such openings to arrive at a device like that of FIG. 6A.

Figure 7A:
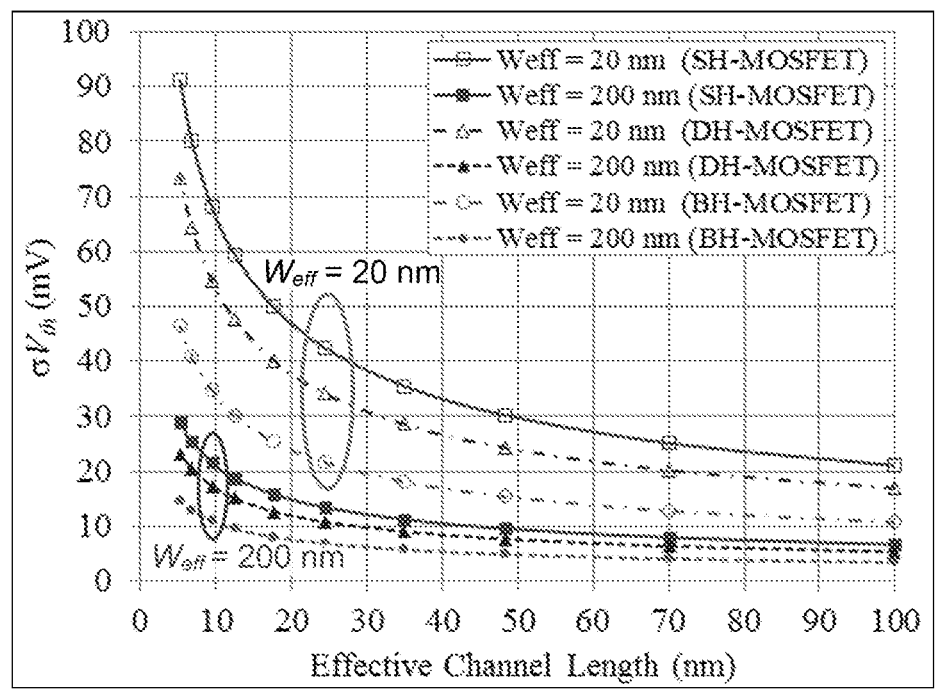
FIGS. 7A and 7B are graphs comparing threshold voltage (Vth) variation of transistors according to embodiments to those of conventional transistors.

FIG. 7A is a graph showing variation in threshold voltage Vth versus effective channel length for different effective channel widths (Weff). FIG. 7A shows results for high-K metal gate buried halo devices (BH-MOSFET) as compared to a double halo devices (DH-MOSFET) like those shown in FIGS. 1 to 3T and conventional single halo devices (SH-MOSFET). As shown, BH-MOSFET devices can provide a lowest variation in Vth.

Figure 7B:
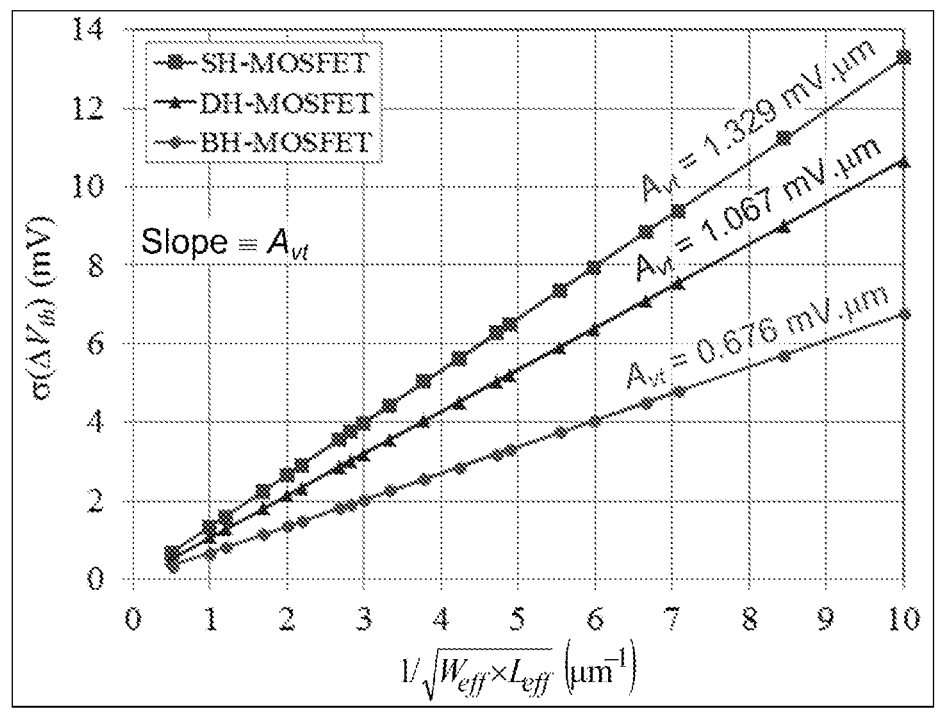

FIG. 7B is graph showing variation in Vth versus the inverse square root of Weff×Leff, which can show the effect of statistical dopant fluctuation (SDF) on Vt variation. The slopes of the plots, $A_{vt}$, can be considered a mismatch coefficient, representing the severity of Vth variability in the devices. As shown, BH-MOSFETs are least effected by SDF.

The embodiments of the transistor structures described herein provide the advantage of an epitaxial layer deposited on top of the doped substrate such that process variability (e.g., random dopant fluctuation) is reduced. Further, the structures provide the advantage of enabling an optimized source-drain structure that is formed to enable the manufacturing of transistor devices having gate lengths below 22 nm. Further, the deep halo implants are able to further reduce the leakage from the deeper channel region where the gate bias cannot control the potential. In particular, the shallow and deep halo implants are able to allow a peak concentration of substrate impurities at a level below the gate, such that a resistance of the transistor can be minimized along with the threshold voltage, threshold voltage fluctuations, short channel effects, and leakage current in the transistor. In other words, the optimized source-drain regions should also enable the manufacture of even shorter gate lengths while minimizing the likelihood of leakage currents, punch through, and excessive channel resistance. Further, these benefits are able to be equally applied to complementary transistors (e.g., CMOS).

The present application has been described in terms of specific embodiments incorporating details to facilitate the understanding of the principles of construction and operation of the transistor having multiple halo implants. It is understood that the halo implants described herein are able to be the addition of very thin heavily doped regions of the same doping type as the body/substrate positioned tight against the junction walls to limit the extent of depletion regions. The halo implants along with the Vth adjust implant/layer form a super-steep retrograde (SSR) channel doping profile with peak concentration below the surface of the channel region. Further, many of the components shown and described in the various figures can be interchanged to achieve the results necessary, and this description should be read to encompass such interchange as well. Additionally, concentrations, doses, materials, dopants, and dimensions described herein are provided by way of example only, and should not be construed as limiting. Such values can vary according to device application and/or dimension. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:
1. A method, comprising:
forming a gate mask on a surface of a substrate, the gate mask having a length that is greater than a target transistor channel length;
ion implanting first conductivity type dopants at a first energy with the gate mask serving as an ion implantation mask to form first halo regions;
forming first spacers on sides of the gate mask;
ion implanting first conductivity type dopants at a second energy with the gate mask and first spacers serving as an ion implantation mask to form second halo regions, the second energy being greater than the first energy;
removing the gate mask and first spacers from the surface;
forming an epitaxial layer over the surface including over the first and second halo regions;
forming a first insulator layer over the surface;
forming a dummy gate mask on the first insulator layer, the dummy gate mask having a length of the target transistor channel length;
ion implanting second conductivity type dopants at a third energy with the dummy gate mask serving as an ion implantation mask to form source-drain extensions, the third energy being less than the second energy;
forming second spacers on sides of the dummy gate mask;
ion implanting second conductivity type dopants at a fourth energy with the dummy gate mask and second spacers serving as an ion implantation mask to form source and drain regions, the fourth energy being greater than the third energy;

forming a surface dielectric layer over the dummy gate mask and second spacers;

planarizing the surface dielectric layer to expose a top surface of the dummy gate mask;

removing the dummy gate mask to create a gate opening between the second spacers;

forming a high-permittivity (hi-K) insulator layer within at least the gate opening, the hi-K insulator layer having a higher permittivity than silicon dioxide;

forming at least first and second metal gate layers within at least the gate opening over the hi-K insulator layer, the first and second metal gate layers comprising at least one metal; and planarizing to the top of the second spacers to form a metal gate structure for a first type transistor.

2. The method of claim 1, further including:

prior to forming the gate mask, ion implanting first type dopants at a fifth energy to form a first threshold voltage adjust layer, the fifth energy being greater than the second energy.

3. The method of claim 1, further including:

the substrate comprises silicon;

prior to forming the surface dielectric layer, forming a source-drain mask having openings at target source and drain locations; and forming source and drain contact silicides at the source and drain locations.

4. The method of claim 1, further including:

prior to forming the hi-K insulator within the gate opening, forming an insulating interface layer on a substrate surface within the gate opening; and the hi-K insulator layer is formed on the insulating interface layer.

5. The method of claim 4, wherein:

forming the insulating interface layer includes growing an oxide on the substrate surface within the gate opening.

6. The method of claim 1, further including:

prior to planarizing to the top of the second spacers, forming a conductive fill layer within the gate opening over the first and second metal gate layers.

7. The method of claim 1, wherein:

forming the gate mask includes growing an oxide on the substrate surface, and etching the oxide to form the gate mask.

8. The method of claim 1, further including:

prior to forming the gate mask, ion implanting first conductivity type dopants at a sixth energy to form a well, the sixth energy being greater than the second energy.

9. The method of claim 1, wherein:

forming first halo regions includes ion implanting first conductivity type dopants to form a peak dopant concentration in the range of $5 \times 10^{18}$ atoms/cm$^3$ to $5 \times 10^{19}$ atoms/cm$^3$; and forming second halo regions includes ion implanting first conductivity type dopants to form a peak dopant concentration in the range of $1 \times 10^{18}$ atoms/cm$^3$ to $1 \times 10^{19}$ atoms/cm$^3$.

10. A method, comprising:

forming a first gate mask on a surface of a substrate, the first gate mask having a length that is greater than a target n-type transistor channel length;

forming a second gate mask on a surface of the substrate, the second gate mask having a length that is greater than a target p-type transistor channel length;

ion implanting n-type dopants at a first energy with the first gate mask serving as an ion implantation mask to form first n-type halo regions in n-type transistor regions;

ion implanting p-type dopants at a second energy with the second gate mask serving as an ion implantation mask to form first p-type halo regions in p-type transistor regions;

forming first spacers on sides of the first and second gate masks;

ion implanting first conductivity type dopants at a third energy with the first gate mask and first spacers serving as an ion implantation mask to form second n-type halo regions in n-type transistor regions, the third second energy being greater than the first energy;

ion implanting second conductivity type dopants at a fourth energy with the second gate mask and second spacers serving as an ion implantation mask to form second p-type halo regions in p-type transistor regions, the fourth energy being greater than the second energy;

forming an epitaxial layer over the surface including over the n-type and p-type transistor regions;

forming insulating trenches in the substrate between the n-type and p-type transistor regions;

forming a first insulator layer over the n-type and p-type transistor regions;

forming a first dummy gate mask on a surface of the substrate, the first dummy gate mask having a length that is a target n-type transistor channel length;

forming a second dummy gate mask on a surface of the substrate, the second dummy gate mask having a length that is a target p-type transistor channel length;

ion implanting second conductivity type dopants at a fifth energy with the first dummy gate mask serving as an ion implantation mask to form n-type source-drain extensions in n-type transistor regions, the fifth energy being less than the third energy;

ion implanting first conductivity type dopants at a sixth energy with the second dummy gate mask serving as an ion implantation mask to form p-type source-drain extensions in p-type transistor regions, the sixth energy being less than the fourth energy;

forming second spacers on sides of the first and second dummy gate masks;

ion implanting second conductivity type dopants at a seventh energy with the first dummy gate mask and second spacers serving as an ion implantation mask to form n-type source and drain regions in n-type transistor regions, the seventh energy being greater than the fifth energy;

ion implanting first conductivity type dopants at an eighth energy with the second dummy gate mask and second spacers serving as an ion implantation mask to form p-type source and drain regions in p-type transistor regions, the eighth energy being greater than the sixth energy;

forming a surface dielectric layer over the n-type and p-type transistor regions;

planarizing the surface dielectric layer to expose a top surface of the first and second dummy gate masks;

removing the first and second dummy gate masks to create first and second gate openings, respectively, between the second spacers;

forming a high-permittivity (hi-K) insulator layer within at least the first and second gate openings, the hi-K insulator layer having a higher permittivity than silicon dioxide;

forming at least a first work function metal gate layer within the first gate opening over the hi-K insulator layer having a first work function value; and forming at least a second work function metal gate layer within the second gate opening over the hi-K insulator layer having a second work function value.

11. The method of claim 10, wherein:

forming at least the first work function metal gate layer includes
- forming a first metal gate layer in the first and second gate openings over the hi-K insulator layer;
- forming an etch stop layer in the first and second gate openings over the first metal gate layer;
- forming a third metal gate layer in the first and second gate openings over the etch stop layer;
- removing the third gate metal layer over n-type transistor regions;
- forming a fourth gate metal layer over the etch stop layer in n-type transistor regions and over the third metal gate layer in p-type transistor regions;
- diffusing at least one element from the fourth gate metal layer through the etch stop layer and into the first metal gate layer to form the first work function gate metal layer.

12. The method of claim 10, further including:

prior to forming the first and second gate masks,
- ion implanting first conductivity type dopants at a ninth energy to form a threshold voltage (Vth) adjust layer for an n-type transistor in n-type transistor regions, the ninth energy being greater than the third energy;
- ion implanting second conductivity type dopants at a tenth energy to form a Vth adjust layer for a p-type transistor in p-type transistor regions, the tenth energy being greater than the fourth energy.

13. The method of claim 10, further including:

the substrate comprises silicon;

prior to forming the surface dielectric layer, forming a source-drain mask having openings at target source and drain locations for n-type and p-type transistors; and forming source and drain contact silicides at the source and drain locations.

14. The method of claim 10, further including:

prior to forming the hi-K insulator within the first and second gate openings, forming an insulating interface layer on a substrate surface within the first and second gate openings; and forming the hi-K insulator layer on the insulating interface layer within the first and second gate openings.

15. The method of claim 10, further including:

forming at least the first and second work function metal gate layers includes forming at least first and second metal gate layers within the first and second gate openings; and after forming the first and second metal gate layers, forming a conductive fill layer in the first and second gate openings.

16. The method of claim 15, further including:

after forming the conductive fill layer, planarizing to the top of the second spacers to form a first metal gate structure for an n-type transistor and a second metal gate structure for a p-type transistor.

17. The method of claim 10, wherein:

forming the first and second gate masks includes
- growing an oxide on the substrate surface, and
- etching the oxide to form the first and second gate masks.

18. The method of claim 10, further including:

the substrate is a p-doped substrate; and prior to forming the first and second gate masks, ion implanting second conductivity type dopants at an eleventh energy to form an n-well in p-type transistor regions, the eleventh energy being greater than the fourth energy.

19. The method of claim 10, wherein:

prior to forming the first and second gate masks, ion implanting first conductivity type dopants at a twelfth eleventh energy to form a p-well in n-type transistor regions, the twelfth energy being greater than the third energy.

* * * * *